United States Patent
Yu et al.

(10) Patent No.: US 10,900,115 B2
(45) Date of Patent: Jan. 26, 2021

(54) CHALCOGENIDE FILM INCLUDING A NOBLE METAL CHALCOGENIDE MATERIAL, DEVICE INCLUDING THE CHALCOGENIDE FILM, AND METHOD OF FORMING THE CHALCOGENIDE FILM

(71) Applicant: Nanyang Technological University, Singapore (SG)

(72) Inventors: Xuechao Yu, Singapore (SG); Peng Yu, Singapore (SG); Qijie Wang, Singapore (SG); Zheng Liu, Singapore (SG)

(73) Assignee: Nanyang Technological University, Singapore (SG)

( * ) Notice: Subject to any disclaimer, the term of this patent is extended or adjusted under 35 U.S.C. 154(b) by 35 days.

(21) Appl. No.: 16/329,569

(22) PCT Filed: Aug. 31, 2017

(86) PCT No.: PCT/SG2017/050434
§ 371 (c)(1),
(2) Date: Feb. 28, 2019

(87) PCT Pub. No.: WO2018/044237
PCT Pub. Date: Mar. 8, 2018

(65) Prior Publication Data
US 2019/0194797 A1 Jun. 27, 2019

(30) Foreign Application Priority Data
Sep. 2, 2016 (SG) .......................... 10201607347V

(51) Int. Cl.
*C30B 23/02* (2006.01)
*C23C 14/22* (2006.01)
(Continued)

(52) U.S. Cl.
CPC ........ *C23C 14/228* (2013.01); *C23C 14/0005* (2013.01); *C23C 14/0623* (2013.01);
(Continued)

(58) Field of Classification Search
CPC ..... C30B 23/00; C30B 23/002; C30B 23/005; C30B 23/02; C30B 23/06; C30B 23/063;
(Continued)

(56) References Cited

U.S. PATENT DOCUMENTS 4,242,374 A * 12/1980 Sansregret ............ C03C 17/22
  136/260
2001/0054375 A1* 12/2001 Fujiwara ................ C30B 30/08
  117/2

FOREIGN PATENT DOCUMENTS

WO    WO 2014/150635 A1    9/2014

OTHER PUBLICATIONS

Ho, et al. publication entitled "Crystal structure and band-edge transitions of ReS2-xSex layered compounds," J. Phys. Chem. Solids, vol. 60, pp. 1797-1804 (1999). (Year: 1999).*
(Continued)

*Primary Examiner* — Kenneth A Bratland, Jr.
(74) *Attorney, Agent, or Firm* — Alston & Bird LLP

(57) ABSTRACT

A chalcogenide film is provided. The chalcogenide film includes a noble metal chalcogenide material having a formula $MC_x$. M represents a noble metal. C represents a chalcogen. x is any one positive value equal to or more than 1.4 and less than 2. The chalcogenide film is configured to generate electrons and holes upon light incident on the chalcogenide film.

21 Claims, 51 Drawing Sheets

(51) Int. Cl.
| | |
|---|---|
| C23C 14/00 | (2006.01) |
| C30B 29/46 | (2006.01) |
| C30B 33/06 | (2006.01) |
| C23C 14/06 | (2006.01) |
| H01L 31/032 | (2006.01) |
| H01L 31/0272 | (2006.01) |

(52) U.S. Cl.
CPC .......... C23C 14/0629 (2013.01); C30B 29/46 (2013.01); C30B 33/06 (2013.01); H01L 31/0272 (2013.01); H01L 31/032 (2013.01)

(58) Field of Classification Search
CPC ....... C30B 23/066; C30B 29/00; C30B 29/10; C30B 29/46; C30B 29/48; C30B 33/00; C30B 33/06; C23C 14/0005; C23C 14/0623; C23C 14/0629; C23C 14/228; H01L 31/0272; H01L 31/032
USPC ................ 117/84, 87–88, 99–100, 109, 937, 117/956–958
See application file for complete search history.

(56) References Cited

OTHER PUBLICATIONS

G. Kliche publication entitled "Far-infrared and X-ray investigations of the mixed platinum dichalcogenides PtS(2-x)Se(x), PtSe(2-x) Te(x), and PtS(2-x)Te(x)," Journal of Solid State Chemistry, vol. 56, pp. 26-31 (1985). (Year: 1985).*
Beck, M. et al., *Continuous Wave Operation of a Mid-Infrared Semiconductor Laser at Room Temperature*, Science 295 (2002) 301-305.
Britnell, I. et al., *Strong Light-Matter Interactions In Heterostructures of Atomically Thin Films*, Science 340 (2013) 1311-1314.
Buscema, M. et al., *Fast and Broadband Photoresponse of Few-Layer Black Phosphorus Field-Effective Transistors*, Nano Lett. 14 (2014) 26 pages.
Buscema, M. et al., *Photovoltaic Effect in Few-Layer Black Phosphorus PN Junctions Defined by Local Electrostatic Gating*, Nat. Commun. 5 (2014) 6 pages.
Chitara, B. et al., *Infrared Photodetectors Based on Reduced Graphene Oxide and Graphene Nanoribbons*, Adv. Mater. 23 (2011) 5419-5424.
Choi, W. et al., *High-Detectivity Multilayer MoS$_2$ Phototransistors With Spectral Response From Ultraviolet to Infrared*, Adv. Mater. 24 (2012) 5832-5836.
Das, A. et al., *Monitoring Dopants by Raman Scattering In An Electrochemically Top-Gated Graphene Transistor*, Nat. Nanotechnol. 3 (2008) 210-215.
Ferrari, A. C. et al., *Raman Spectrum of Graphene and Graphene Layers*, Physical Review Letters, PRL 97 (2006) 187401, 4 pages.
Freitag, M. et al., *Increased Responsivity of Suspended Graphene Photodetectors*, Nano Lett, 13 (2013) 1644-1648.
Gabor, N. M. et al., *Hot Carrier-Assisted Intrinsic Photoresponse in Graphene*, Science 334 (2011) 648-652.
Gan, X. et al., *Chip-Integrated Ultrafast Graphene Photodetector With High Responsivity*, Nature Photonics 7 (2013) 883-887.
Geim, A. K., *Graphene: Status and Prospects*, Science 324 (2009) 8 pages.
Geim, A. K., et al., *The Rise of Graphene*, Nat. Mater. 6 (2007) 183-191.
George, P. A. et al., *Ultrafast Optical-Pump Terahertz-Probe Spectroscopy of the Carrier Relaxation and Recombination Dynamics in Epitaxial Graphene*, Nano Lett. 8 (2008) 5 pages.
Guo, G. Y. et al., *The Electronic Structures of Platinum Dichalcogenides: PtS$_2$, PtSe$_2$, and PtTe$_2$*, J. Phys. C: Solid State Phys. 19 (1986) 995-1008.
Guo, Q. et al., *Black Phosphorus Mid-Infrared Photodetectors with high Gain*, Nano Lett. 16 (2016) 15 pages.

Haddadi, A. et al., *InAs/InAs$_{1-x}$Sb$_x$ Type-II Superlattices for High Performance Long Wavelength Infrared Detection*, Appl. Phys. Lett. 105 (2014) 121104, 4 pages.
Hohenberg, P. et al., *Inhomogeneous Electron Gas*, Physical Review, vol. 136, No. 3B (1964) B864-871.
Ishigami, M. et al., *Atomic Structure of Graphine on SiO$_2$*, Nano Lett. 7 (2007) 13 pages.
Island, J. O. et al., *Ultrahigh Photoresponse of Few-Layer TiS$_3$ Nanoribbon Transistors*, Adv. Opt. Mater. 2 (2014) 19 pages.
Jacobs-Gedrim, R. B. et al., *Extraordinary Photoresponse in Two-Dimensional In$_2$Se$_3$*, ACS Nano 8 (2014) 514-521.
Jena, D. et al., *Enhancement of Carrier Mobility in Semiconductor Nanostructures by Dielectric Engineering*, Physical Review Letters, PRL 98 (2007) 136805, 4 pages.
Jung, C. et al., *Highly Crystalline CVD-Grown Multilayer MoSe$_2$ Thin Film Transistor for Fast Photodetector*, Sci. Rep. 5 (2015) 9 pages.
Kliche, G., *Far-Infrared and X-Ray Investigations of the Mixed Platinum Dichalcogenides PtS$_{2-x}$Se$_x$, PtSe$_{2-x}$Te$_x$, and PtS$_{2-x}$Te$_x$*, Journal of Solid State Chemistry, vol. 56, No. 1 26-31, (1985).
Kresse, G. et al., *Efficient Interative Schemes for Ab Initio Total-Energy Calculations Using a Plane-Wave Basis Set*, Physical review B, vol. 54, No. 16 (Oct. 1996) 169-186.
Kreese, G. et al., *From Ultrasoft Pseudopotentials to the Projector Augmented-Wave Method*, Physical Review B, vol. 59, No. 3 (Jan. 1999) 1758-1175.
Lei, S. et al., *An Atomically Layered InSe Avalanche Photodetector*, Nano Lett. 15 (2015) 3048-3055.
Lei, S. et al., *Evolution of the Electronic Band Structure and Efficient Photo-Detection in Atomic Layers of InSe*, ACS Nano 8 (2014) 1263-1272.
Lei, S. et al., *Optoelectronic Memory Using Two-Dimensional Materials*, Nano Lett. 15 (2015) 259-265.
Lei, S. et al., *Ternary CuIn$_7$Se$_{11}$: Towards Ultra-Think Layered Photodetectors and Photovoltaic Devices*, Adv. Mater. 26 (2014) 7666-7672.
Li, D. et al., *Polarization and Thickness Dependent Absorption Properties of Black Phosphorus: New Saturable Absorber For Ultrafast Pulse Generation*, Sci. Rep. 5 (2015) 9 pages.
Li, J. et al., *Photosensitive Graphene Transistors*, Adv. Mater. 26 (2014) 5239-5273.
Li, P., et al., *Tuning the Electronic Properties of Monolayer and Bilayer PtSe$_3$$_2$ Via Strain Engineering*, Journal of Materials Chemistry C, 4(15), 3106-3112, (2016).
Li, X. et al., *Chemically Derived, Ultrasmooth Graphene Nanoribbon Semiconductors*, Science 319 (2008) 1229-1232.
Lin, M. et al., *Controlled Growth of Atomically Thin In$_2$Se$_3$ Flakes by Van Der Waals Epitaxy*, J. Am. Chem. Soc. 135 (2013) 13274-13277.
Liu, F. et al. *High-Sensitivity Photodetectors Based on Multilayer GaTe Flakes*, ACS Nano 8 (2014) 752-760.
Liu, F. et al., *Optoelectronic Properties of Atomically Thin ReSSe With Weak Interlayer Coupling*, Nanoscale, vol. 8, No. 11 (Feb. 5, 2016) 5826-5834.
Liu, M. et al., *A Graphene-Based Broadband Optical Modulator*, Nature 474 (2011) 64-67.
Liu, Y. et al., *Planar Carbon Nanotube-Graphene Hybrid Films for High-Performance Broadband Photodetectors*, Nat. Commun. 6 (2015) 7 pages.
Lopez-Sanchez, O. et al., *Ultrasensitive Photodetectors Based on Monolayer MoS$_2$*, Nat. Nanotechnol. 8 (2013) 6 pages.
Mak, K. F. et al., *Photonics and Optoelectronics of 2D Semiconductor Transition Metal Dichalcogenides*, Nat. Photon. 10 (2016) 216-226.
Michel, J. et al., *High-Performance Ge-on-Si Photodetectors*, Nat Photon 4 (2010) 527-534.
Mueller, T. et al., *Graphene Photodetectors for High-Speed Optical Communications*, Nat. Photon. 4 (2010) 297-301.
Perdew, J. P. et al., *Generalized Gradient Approximation Made Simple*, Physical Review Letters, vol. 77, No. 18 (Oct. 1996) 3865-3868.
Perea-Lopez, N. et al., *Photosensor Device Based on Few-Layered WS$_2$ Films*, Adv. Funct. Mater. 23 (2013) 7 pages.

(56) References Cited

OTHER PUBLICATIONS

Piotrowski, M. J. et al., *Role of Van Der Waals Corrections for the $PtX_2$ (X=0, S, Se) Compounds*, Physical Review B88 (2013) 075421, 7 pages.

Pospischil, A. et al., *Solar-Energy Conversion and Light Emission in an Atomic Monolayer p-n Diode*, Nature Nano. 9 (2014) 257-261.

Roglski, A., *History of Infrared Detectors*, Opto-Electronics Review 20(3) (2012) 279-308.

Rogalski, A., *HgCdTe Infrared Detector Material: History, Status and Outlook*, Rep. Prog. Phys. 58 (2005) 2267-2336.

Rogalski, A. et al., *Third-Generation Infrared Photodetector Arrays*, J. Appl. Phys. 105 (2009) 091101 (45 pages).

Sols, F. et al., *Coulomb Blockade in Graphene Nanoribbons*, Phys. Rev. Lett. 99 (2007) 4 pages.

Son, J. G. et al., *Sub-10 nm Graphene Nanoribbon Array Field-Effect Transistors Fabricated by Block Copolymer Lithography*, Adv. Mater. 25 (2013) 4723-4728.

Son, Y. et al., *Observation of Switchable Photoresponse of a Monolayer $WSe_2$-$MoS_2$ Lateral Heterostructure via Photocurrent Spectral Atomic Force Microscopic Imaging*, Nano Lett. 16 (2016) 3571-3577.

Su, G. et al., *Chemical Vapor Deposition of thin Crystals of Layered Semiconductor $SnS_2$ For Fast Photodetection Application*, Nano Lett. 15 (2015) 506-513.

Su, S-H. et al., *Band Gap-Tunable Molybdenum Sulfide Selenide Monolayer Alloy*, Small 10 (2014) 2589-2594.

Sun, Z. et al., *Optical Modulators With Two-Dimensional Layers Materials*, Nat. Photon. 10 (2016) 18 pages.

Urich, A. et al., *Intrinsic Response Time of Graphene Photodetectors*, Nano Lett 11 (2011) 2804-2808.

Wang, O. H. et al., *Electronics and Optoelectronics of Two-Dimensional Transition Metal Dichalcogenides*, Nat. Nanotechnol. 7 (2012) 699-712.

Wang, Y. et al., *Monolayer $PtSe_2$, a New Semiconducting Transition-Metal-Dichalcogenide, Epitaxially Grown by Direct Selenization of Pt*, Nano Lett. 15 (2015) 4013-4018.

Weiss, N. O. et al., *Graphene: An Emerging Electronic Material*, Adv. Mater. 24 (2012) 5782-5825.

Wu, J. et al., *Colossal Ultraviolet Photoresponsivity of Few-Layer Black Phosphorus*, ACS Nano 9 (2015) 8070-8077.

Xia, F. et al., *Ultrafast Graphene Photodetector*, Nat Nanotechnol. 4 (2009) 839-843.

Xu, P. et al., *Fast Photoresponse From IT Tin Diselenide Atomic Layers*, Adv. Funct. Mater. 26 (2016) 137-145.

Yao, J. D. et al., *Stable, Highly-Responsive and Broadband Photodetection Based on Large-Area Multilayered $WS_2$ Films Grown by Pulsed-Laser Deposition*, Nanoscale 7 (2015) 14974-14981.

Yin, Z. et al., *Single-Layer $MoS_2$ Phototransistors*, ACS Nano 6 (2011) 74-80.

Youngblood, N. et al., *Waveguide-Integrated Black Phosphorus Photodetector With High Responsivity and Low Dark Current*, Nat. Photon. 9 (2015) 247-252.

Yu, X. et al., *A High Performance, Visible to Mid-Infrared Photodetector Based on Graphene Nanoribbons Passivated With $HfO_2$*, Nanoscale 8 (2016) 6 pages.

Yu, X. et al., *Lateral Black Phosphorene P-N Junctions Formed Via Chemical Doping for High Performance Near Infrared Photodetector*, Nano Energy 25 (2016) 34-41.

Yu, X. et al., *Mid-Infrared 2D Photodetector Based on Bilayer $PtSe_2$*, CLEO: Science and Innovations in Proceedings Conference on Lasers and Electro-Optics, Stu4R.5 (2016) 3 pages.

Yu, X. et al., *Photocurrent Generation in Lateral Graphene p-n Junction Created by Electron-Beam Irradiation*, Sci. Rep 5 (2015) 8 pages.

Yu, X. et al., *Room-Temperature Mid-Infrared Photodetector In All-Carbon Graphene Nanoribbon-$C_{60}$ Hybrid Nanostructure*, Optica 3 (2016) 979-984.

Zhao, Y. et al., *Extraordinarily Strong Interlayer Interaction in 2D Layered $PtS_2$*, Adv. Mater. 28 (2016) 2399-2407.

\* cited by examiner

| | Commercial HgCdTe | Commercial QWIPs | Graphene | Defect Engineered Plasmonic Selenide |
|---|---|---|---|---|
| Mechanism | Photovoltaic mode | Photoconductive mode | Photothermal mode | Photoconductive mode |
| Responsivity | $10^3$ V/W | 20 mA/W | 6.1 mA/W | 1.8 A/W |
| Quantum efficiency | ≥ 70% | ≤ 10% | 0.5% | 22.32% |
| Gain | 1 | 0.2 (30~50 wells) | ≤ 0.1 | ~0.8 |
| Detectivity (cm $Hz^{1/2}$ $W^{-1}$) | ~$3 \times 10^{12}$ | ~$10^{10}$ | Not available | $4 \times 10^8$ |

| | Responsivity | Response speed | Detectivity (cm Hz$^{1/2}$ W$^{-1}$) | Operation Temperature |
|---|---|---|---|---|
| MCT | ~5-50 A/W (at 10 μm) | 1μs | $4 \times 10^{10}$ | LN |
| QWIP | 4.47 A/W (at ~7.9 μm) | — | $2.8 \times 10^{11}$ | LN |
| PtSe$_2$ | 4.5 A/W (at 10 μm) | ~1 ms | $4 \times 10^{9}$ | RT |

CHALCOGENIDE FILM INCLUDING A NOBLE METAL CHALCOGENIDE MATERIAL, DEVICE INCLUDING THE CHALCOGENIDE FILM, AND METHOD OF FORMING THE CHALCOGENIDE FILM

CROSS-REFERENCE TO RELATED APPLICATION

This application is a national phase entry of PCT/SG2017/050434, filed on Aug. 31, 2017, which claims the benefit of priority of Singapore Patent Application No. 10201607347V, filed on Sep. 2, 2016, the contents of which being hereby incorporated by reference in their entirety for all purposes.

TECHNICAL FIELD

Various aspects of this disclosure relate to a chalcogenide film. Various aspects of this disclosure relate to a device including a chalcogenide film. Various aspects of this disclosure relate to a method of forming a chalcogenide film.

BACKGROUND

There has been much research related to mid-infrared (mid-IR) radiation as such a region contains fingerprints of the most common molecular vibrations and may also pass relatively unaffected through the atmosphere due to the transparent window in the atmosphere at such wavelengths. Furthermore, mid-infrared radiation has tremendous applications in emerging fields such as optical communications, infrared imaging, and analytical sciences.

Commercial mercury cadmium telluride (HgCdTe), a most widely adopted mid-IR material, exhibits broadband response, which may be achieved by adjusting the alloy composition, or externally changing operation temperatures. Indium antimonide (InSb) is a direct bandgap semiconductor that has been extensively used in short-wave mid-IR applications. The operation regime of InSb can be extended to ~7 µm via nitrogen doping. Apart from these materials that are based on inter-band transitions, compound semiconductor super lattices with alternate layers of different semiconductors have also been developed in the past two decades for mid-IR optoelectronics based on inter sub-band transitions. However, the abovementioned mid-IR materials may have shortcomings, such as environmental toxicity, high cost, and/or complex fabrication processes.

Two-dimensional (2D) materials have atomic thicknesses, and have revolutionized the fields of material science, chemistry, and physics due to their astonishing electrical and optical properties. For instance, graphene, a two-dimensional material with a layer of carbon atoms arranged in a honeycomb manner, has attracted vast interests in mid-IR applications due to its unique optoelectronic properties, such as broadband absorption, ultrahigh carrier mobility, etc.

However, the low absorption coefficient and short carrier lifetime (in the range of picoseconds) remain major issues for developing high-performance mid-infrared optoelectronic devices. The existing challenges provide the motivation for search of alternative 2D materials with intrinsic narrow bandgaps. Black phosphorene (BP), which was recently discovered to be a 2D layered material, has a dependent bandgap from 0.3 eV~2.0 eV. Although layered BP can be used for mid-infrared photodetectors and modulators, layered BP only covers up to a wavelength of ~4.1 µm (0.3 eV), and also suffers from relatively poor environmental stability. On the other hand, 2H-phase transition metal dichalcogenides (TMDC) ($MX_2$, M=Mo, W, X=S, Se) are not suitable for mid-infrared operations because of the relatively large bandgap and low carrier mobility. As a result, most of these developed TMDCs are not appropriate for applications in lower-energy spectral ranges.

SUMMARY

Various embodiments may provide a chalcogenide film. The chalcogenide film may include a noble metal chalcogenide material having a formula $MC_x$. M may represent a noble metal. C may represent a chalcogen. x may be any one positive value equal to or more than 1.4 and less than 2. The chalcogenide film may be configured to generate electrons and holes upon light incident on the chalcogenide film.

Various embodiments may provide a device including a chalcogenide film.

Various embodiments may provide a method of forming a chalcogenide film. The method may include forming a noble metal chalcogenide material having a formula $MC_x$. M may represent a noble metal. C may represent a chalcogen. x may be any one positive value equal to or more than 1.4 and less than 2. The chalcogenide film may be configured to generate electrons and holes upon light incident on the chalcogenide film.

BRIEF DESCRIPTION OF THE DRAWINGS

The invention will be better understood with reference to the detailed description when considered in conjunction with the non-limiting examples and the accompanying drawings, in which:

FIG. 3 is a table comparing the various parameters of a defect-engineered bilayer platinum selenide ($PtSe_2$) photodetector according to various embodiments with a commercial mercury cadmium telluride (HgCdTe) photodetector, a commercial quantum well indium phosphide (QWIP) photodetector, and a graphene photodetector.

FIG. 11G is a table comparing the various parameters of a bilayer platinum selenide (PtSe$_2$) based photodetector according to various embodiments with a mercury cadmium telluride (HgCdTe) based photodetector, and a commercial quantum well indium phosphide (QWIP) based photodetector.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or one of the chalcogenide films/devices is analogously valid for the other methods or chalcogenide films/devices. Similarly, embodiments described in the context of a method are analogously valid for a chalcogenide film and/or device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regard to a deposited material formed "over" a side or surface, may be used herein to mean that the deposited material may be formed "directly on", e.g. in direct contact with, the implied side or surface. The word "over" used with regard to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1A:
FIG. 1A shows a general illustration of a chalcogenide film according to various embodiments.

FIG. 1A shows a general illustration of a chalcogenide film 100 according to various embodiments. The chalcogenide film 100 may include or consist of a noble metal chalcogenide material. The noble metal chalcogenide material may have a formula $MC_x$. M may represent a noble metal. C may represent a chalcogen. The chalcogenide film 100 may be configured to generate electrons and holes upon light incident on the chalcogenide film 100.

In other words, the film 100 may include a noble metal chalcogenide material, which may include a noble metal element and a chalcogen element. The film 100 may exhibit electron-hole generation in the presence of light.

The noble metal chalcogenide material may form a crystal structure. In other words, the film 100 may include one or more crystals of the noble metal chalcogenide material. The film 100 may include crystalline flakes of the noble metal chalcogenide material.

In various embodiments, x may be 2. In other words, the formula may be $MC_2$. In other words, the atomic ratio of the noble metal to the chalcogen is 1:2.

In various embodiments, the crystal structure or the crystalline flakes may include defects or vacancies.

In various embodiments, x may be any one positive value equal to or more than 1.4 and less than 2 (i.e. $1.4 \leq x < 2$). In other words, the atomic ratio of the noble metal to the chalcogen may range from 1:1.4 to less than 1:2. When $x<2$, the film 100 may include vacancies (of the chalcogen) or defects. Increasing the vacancies or defects may lead to a decrease in bandgap, which may lead to an increase in electron-hole generation at a particular wavelength or range of wavelengths, e.g. in the mid-infrared range. In various embodiments, increasing the vacancies or defects may control the bandgap of the film 100.

In various embodiments, x may be any positive value less than 2. In various embodiments, x may be any positive value less than 1.8. In various embodiments, x may be any positive value less than 1.6. In various embodiments, x may be any positive value equal to or more than 1.4.

Noble metal elements may refer to elements such as ruthenium (Ru), rhodium (Rh), palladium (Pd), silver (Ag), osmium (Os), iridium (Jr), platinum (Pt), and/or gold (Au).

Chalcogens may refer to elements such as sulfur (S), selenium (Se), tellurium (Te), and/or polonium (Po). Chalcogenides may include sulfides, selenides, tellurides, and/or polonides.

In various embodiments, the noble metal chalcogenide material may be, but is not limited to, any one material selected from a group consisting of platinum selenide ($PtSe_x$), platinum sulfide ($PtS_x$), palladium sulfide ($PdS_x$), and palladium selenide ($PdSe_x$).

For avoidance of doubt, noble metal chalcogenide materials as described herein may not include oxides.

In various embodiments, the chalcogenide film 100 may be a two dimensional (2D) film. In various other embodiments, the chalcogenide film 100 may be a three dimensional (3D) film.

In various embodiments, the chalcogenide film 100 may be or may include a single monolayer of the noble metal chalcogenide material. In various other embodiments, the chalcogenide film 100 may be or may include a bilayer of the noble metal chalcogenide material, or a trilayer of the noble metal chalcogenide material. In various embodiments, the chalcogenide film 100 may be or may include a multilayer of the noble metal chalcogenide material. A "multilayer" used in the current context may refer to a film including more than one layer, and may include a bilayer or a trilayer.

In various embodiments, the chalcogenide film 100 may include one or more flakes. Each of the one or more flakes may be a monolayer, a bilayer, a trilayer, or a multilayer. Each monolayer or layer may be a single crystalline sheet of noble metal chalcogenide material. For instance, for platinum selenide ($PtSe_x$), each monolayer or layer may include one layer of Pt and two layers of Se such that the Pt layer is between the two Se layers.

Each bilayer may be a stack including or consisting of two crystalline sheets. Each trilayer may be a stack including or consisting of three crystalline sheets. Each multilayer may be a stack including or consisting of a plurality of crystalline sheets. A crystalline sheet used in the current context may refer to a continuous crystal structure. A crystalline sheet may include noble metal atoms and chalcogen atoms bonded strongly to one another. A bilayer or multilayer structure may include two or more crystalline sheets held to neighboring crystalline sheets via van der Waals' forces.

In various embodiments, the light may be or may include visible light, i.e. light having a wavelength or range of wavelengths selected from 400 nm to 700 nm.

In various other embodiments, the light may be or may include infrared light, i.e. light having a wavelength or range of wavelengths selected from 700 nm to 1 mm. In various embodiments, the infrared light may be or may include mid infrared light, i.e. light having a wavelength or range of wavelengths selected from 4 µm to 11 µm.

In various embodiments, the noble metal chalcogenide material may be platinum selenide ($PtSe_x$). In various embodiments, the noble metal chalcogenide material may be any one selected from a group consisting of $PtSe_{1.8}$, $PtSe_{1.6}$, and $PtSe_{1.4}$.

Various embodiments may provide a device including the chalcogenide film 100. The device may be an optical device or an optoelectronic device.

Figure 1B:
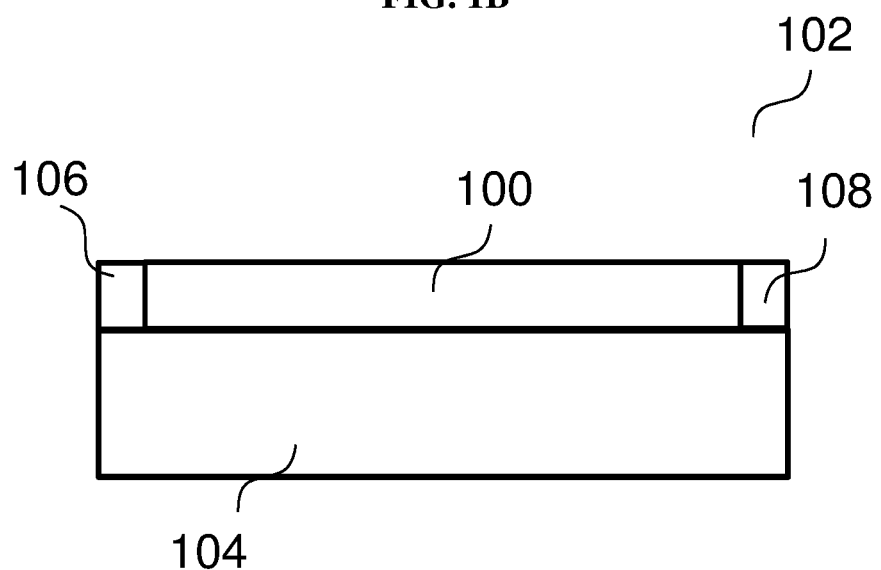
FIG. 1B shows a photodetector or a solar cell according to various embodiments.

In various embodiments, the device may be a photodetector or a solar cell. FIG. 1B shows a photodetector or a solar cell 102 according to various embodiments. The photodetector or solar cell 102 may include a substrate 104 and the chalcogenide film 100 on the substrate. 104 The photodetector or solar cell 102 may also include a first electrical contact 106 and a second electrical contact 108 in contact with the chalcogenide film 100. The first electrical contact 106 may be spaced apart from the second electrical contact 108. Light incident on the chalcogenide film 100 may cause generation of electron-hole pairs, and may lead to a current flowing between the first electrical contact 106 and the second electrical contact 108. Current may flow between the first electrical contact 106 and the second electrical contact 108, e.g. from the first electrical contact 106 to the second electrical contact 108, upon application of a voltage between the first electrical contact 106 and the second electrical contact 108.

In various embodiments, the device may further include a gate electrode (not shown in FIG. 1B) on the chalcogenide film 100. In various other embodiments, the substrate may be electrically conductive and may function as a back gate. In various embodiments, the device may be an electrical device such as a field effect transistor.

In various embodiments, the device may be an optical modulator or any other photonic or optoelectronic device.

Figure 2:
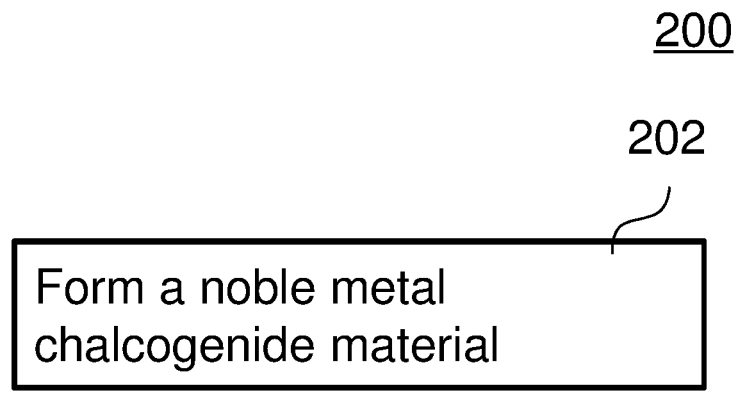
FIG. 2 shows a general schematic of a method of forming a chalcogenide film according to various embodiments.

FIG. 2 shows a general schematic 200 of a method of forming a chalcogenide film according to various embodiments. The method may include, in 202, forming a noble metal chalcogenide material. The noble metal chalcogenide material may have a formula $MC_x$. M may represent a noble metal. C may represent a chalcogen. The chalcogenide film may be configured to generate electrons and holes upon light incident on the chalcogenide film.

In other words, various embodiments may relate to forming a noble metal chalcogenide material, which may include a noble metal element and a chalcogen element.

In various embodiments, x may be 2. In other words, the formula may be $MC_2$. In other words, the atomic ratio of the noble metal to the chalcogen is 1:2.

The noble metal chalcogenide material may form a crystal structure. The film may include crystalline flakes of the noble metal chalcogenide material.

In various embodiments, the crystal structure or the crystalline flakes may include defects or vacancies.

In various embodiments, x may be any one positive value equal to or more than 1.4 and less than 2 (i.e. 1.4≤x<2). In other words, the atomic ratio of the noble metal to the chalcogen may range from 1:1.4 to less than 1:2. When x<2, the film 100 may include vacancies (of the chalcogen) or defects.

Forming the noble metal chalcogenide material may include a chemical vapour transfer (CVT) process, which may be also referred to as chemical vapor deposition (CVD).

Forming the noble metal chalcogenide material may include heating or annealing a noble metal and a chalcogen in the presence of catalysts. In various embodiments, a molar ratio of noble metal:chalcogen of less than 1:2 (e.g. 1:1.8, 1:1.6, 1:1.4 etc.) may be used to form defects/vacancies in the noble metal chalcogenide material.

Forming the noble metal chalcogenide material may include heating a noble metal with a chalcogen in the presence of catalysts.

In various embodiments, the catalysts may include one or more selected from a group consisting of sulfur, phosphorous, bromine and iodine. Sulfur and phosphorous may be used to form $PtSe_x$. The formation of $PtSe_x$, instead of $PtS_x$ or $PtS_ySe_z$ (where y+z<2) may be dependent on temperature. The temperature may be very high during synthesis of $PtSe_x$. In such a case, the sulfur may be sublimated without reacting with Pt atoms due to the thermodynamic conditions. For example, PtSeS does not exist, as it is thermodynamically unstable. As a result, sulfur may only act as a catalyst in the growth of $PtSe_x$ crystals. The sulfur sublimate (gas state) may carry the active Se atoms and may provide proper reaction environment (similar substances dissolve mutually). Bromine ($Br_2$) and phosphorous may be used to form $PtS_x$. Iodine and phosphorous may be used to form $PdS_x$ and/or $PdSe_x$. The use of catalysts may help to facilitate the formation and growth of high quality single crystals.

In various embodiments, the heating or annealing may be carried out in the presence of a transport gas. The transport gas may be iodine, i.e. iodine vapor. Alternatively, the transport gas may be argon.

In various embodiments, one or more single crystals of the noble metal chalcogenide material may be formed using the chemical vapor transfer process. The noble metal and the chalcogen may be heated or annealed in the presence of catalysts using a suitable means, e.g. in a furnace, to form the noble metal chalcogenide material. When the noble metal chalcogenide material is cooled, one or more single crystals of the noble metal chalcogenide material may be formed.

In various embodiments, one or more crystalline flakes may be mechanically exfoliated from the one or more single crystals to form the chalcogenide film. The chalcogenide film may include the one or more crystalline flakes. In other words, forming the noble metal chalcogenide material may include a chemical vapour transfer process to form one or more single crystals. Forming the noble metal chalcogenide material may further include mechanically exfoliating one or more crystalline flakes from the one or more single crystals to form the chalcogenide film. The one or more crystalline flakes may be mechanically exfoliated from the one or more single crystals by using tape.

In various embodiments, the noble metal may be platinum, and the chalcogen may be selenium to form platinum selenide ($PtSe_x$).

In various embodiments, a molar ratio of platinum:selenium:phosphorous:sulfur of 1:1.8:1:3 may be used to form $PtSe_{1.8}$. In various embodiments, a molar ratio of platinum:selenium:phosphorous:sulfur of 1:1.6:1:3 may be used to form $PtSe_{1.6}$. In various embodiments, a molar ratio of platinum:selenium:phosphorous:sulfur of 1:1.4:1:3 may be used to form $PtSe_{1.4}$.

Various embodiments may relate to a chalcogenide film formed by a method as described herein.

Various embodiments may relate to a method of synthesizing PtSe$_2$ crystals by chemical vapor deposition (CVD). This may allow the fabrication of PtSe$_2$ field effect transistors (FET) with various numbers of layers. It is observed that trilayer and thicker PtSe$_2$ may be metallic, while bilayer and monolayer PtSe$_2$ may be semiconducting. These observations may show that phase transition in PtSe$_2$ films may be dependent on the number of layers.

Further, it is demonstrated that bilayer PtSe$_2$ may retain a narrow band gap, may possess a relatively high carrier mobility, and may show remarkable photo-response in a broadband region from visible to mid-infrared wavelengths. The results may be of great importance for the future deployment of stable and high-performance infrared cameras, photodetectors, modulators and so on.

FIG. 3 is a table 300 comparing the various parameters of a defect-engineered bilayer platinum selenide (PtSe$_x$) photodetector according to various embodiments with a commercial mercury cadmium telluride (HgCdTe) photodetector, a commercial quantum well indium phosphide (QWIP) photodetector, and a graphene photodetector. Both volts per watt (V/W) and amperes per watt (A/W) may be used to characterize the responsivities of HgCdTe and other photodetectors, depending on the operation mode. The unit may be A/W for photoconductive mode operations. On the other hand, the unit may be V/W for photovoltaic mode operations. In FIG. 3, the defect-engineered platinum selenide photodetector according to various embodiments is operated in photoconductive mode. Hence, the unit may be A/W.

The responsivity of the bilayer PtSe$_2$ based photodetector may be two times higher than that of a commercial quantum well InP (QWIP) photodetector. In addition, the detectivity of the bilayer PtSe$_2$ based photodetector may be on par with that of the commercial HgCdTe photodetector and the QWIP photodetector, and may be much higher than that of graphene photodetectors.

In various embodiments, the bandgap of bilayer PtSe$_2$ may be controlled from about 0.32 eV to about 0.16 eV, and may exhibit significant light absorption in the mid infrared range (about 4 μm to about 11 μm).

In various embodiments, a chemical vapor transfer (CVT) method may be used to form high quality, atomic layered noble metal chalcogenides such as sulfides or selenides (i.e. MC$_x$ or MC$_2$, wherein C is S or Se).

Figure 4A:
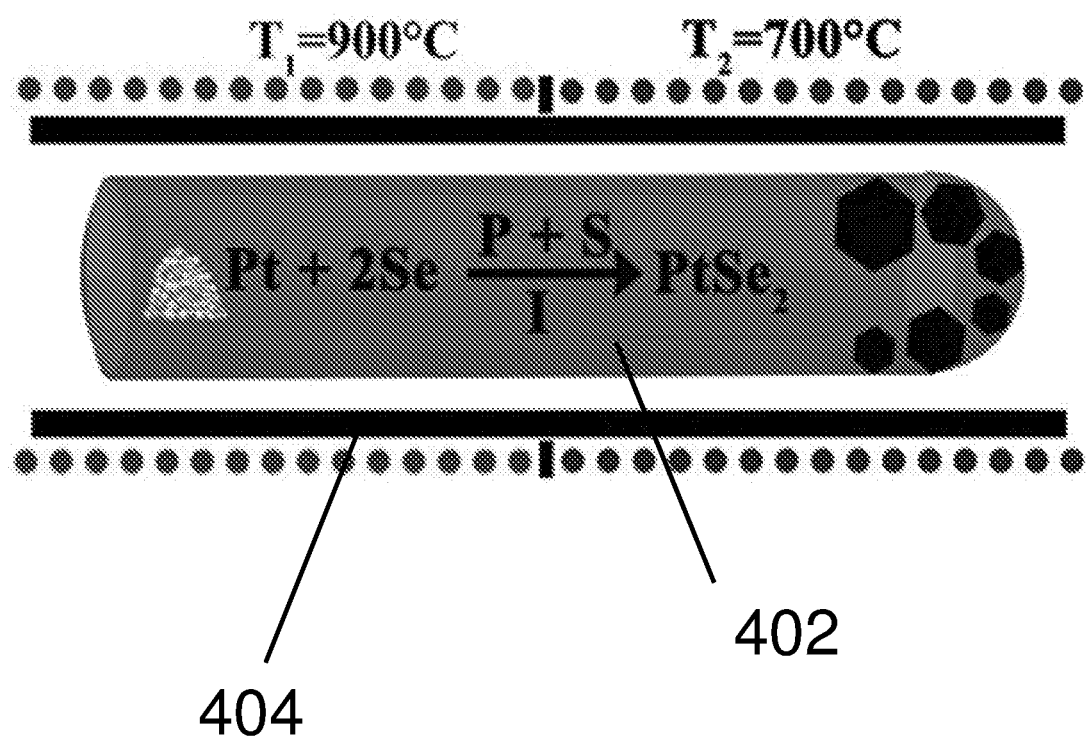
FIG. 4A shows a setup to form platinum selenide crystals via chemical vapor transfer (CVT) according to various embodiments.

FIG. 4A shows a setup to form platinum selenide crystals via chemical vapor transfer (CVT) according to various embodiments. Large well-formed plate-like single crystals of PtSe$_2$ may be grown by catalysts (including, but not limited to, sulfur and phosphorus) in the presence of a transport agent or gas (including, but not limited to, iodine).

The molar ratio of platinum (powder, 99.9%, Sigma-Aldrich):selenium (powder, 99.9%, Sigma-Aldrich):red phosphorus (lump, 99.9%, Sigma-Aldrich):sulfur (powder, 99.99%, Sigma-Aldrich) used may be 1:2:1:3 with a total weight of 700 mg. In addition, 35 mg of iodine may be sealed together with platinum, selenium, red phosphorous and sulfur in an evacuated 20 cm long quartz tube 402 under vacuum at 10$^{-6}$ Torr, which may then be placed in a furnace 404. The furnace may be a three-zone furnace, i.e. the furnace may include three zones in which the material sources may be placed. The three zones may have different temperatures. In other words, the zones may be defined by temperature distribution. As shown in FIG. 4A, one end of the tube 402, i.e. the end in which a crucible containing the material sources such as platinum, selenium, red phosphorous, and sulfur, is first placed in the reaction zone of the furnace 404, while another end of the tube 402, i.e. the end wherein the plate-like single crystals of PtSe$_2$ are formed, is in the growth zone of the furnace 404. The growth zone may have a temperature T$_2$ (e.g. about 700° C.), lower compared to a temperature T$_1$ of the reaction zone of the furnace 404 (e.g. about 900° C.). The middle zone between the reaction zone and the growth zone may have a temperature distribution that decreases from the temperature in the reaction zone (T$_1$) to the temperature in the growth zone (T$_2$). The crucible containing the material sources may be moved by outer controls, for example, magnetic fields from the reaction zone to the growth zone. The charge, i.e. the platinum and the selenium, may be pre-reacted (in the presence of the catalysts) at about 900° C. for about 40 hours before being provided in the reaction zone. The temperatures of the growth zone and the reaction zone may provide a temperature gradient for growth of the crystals and may not change, i.e. stay constant, for about 5 days. The furnace 404 may then be cooled down to room temperature, e.g. via natural cooling. Experiments have been carried out based on different molar ratios of platinum, selenium, red phosphorous and sulfur. It is found that the ratio of platinum:selenium:red phosphorus:sulfur of 1:2:1:3 may be optimal for forming high quality single crystals amongst the various ratios tested. Catalysts, e.g. phosphorous and sulfur may be required to obtain single crystals of PtSe$_2$. The catalysts may play a catalytic role in the growth process of the PtSe$_2$ crystals.

Large well-formed plates of PtSe$_2$ may be obtained in the growth zone. The crystal structure of PtSe$_2$ may be confirmed by X-ray powder diffraction (XRD) and energy dispersive X-ray spectroscopy (EDX).

In order to form PdSe$_x$, Pd powder (99.98%), Se powder (99.94%), red phosphorus and sulfur (from Alfa Aesar), may be thoroughly mixed together in an atomic ratio of Pd:Se:P:S of 1:x:1:3. For instance, an atomic ratio of Pd:Se:P:S of 1:2:1:3 may be used to form PdSe$_2$, and an atomic ratio of Pd:Se:P:S of 1:1.8:1:3 may be used to form PdSe$_{1.8}$. The mixture may then be loaded, and sealed in an evacuated quartz ampule, slowly heated up to about 900° C., and held for 50 h. The mixture may then be slowly cooled to 450° C. at a rate of 3° C./h to room temperature.

Precise control of the x value may theoretically be difficult due to the limit of characterization at the atomic level in a large-area device. Raman spectroscopy and other non-destructive methods may be used to monitor the value of x. The temperature setting strategy described herein may enable a skilled person to reproduce a noble metal chalcogenide material according to various embodiments. The temperature may be tuned to adjust the value of x. The material may then be characterized. The band gap may then be controlled by controlling the concentration of vacancies as shown by the simulation results provided herein.

Figure 4B:
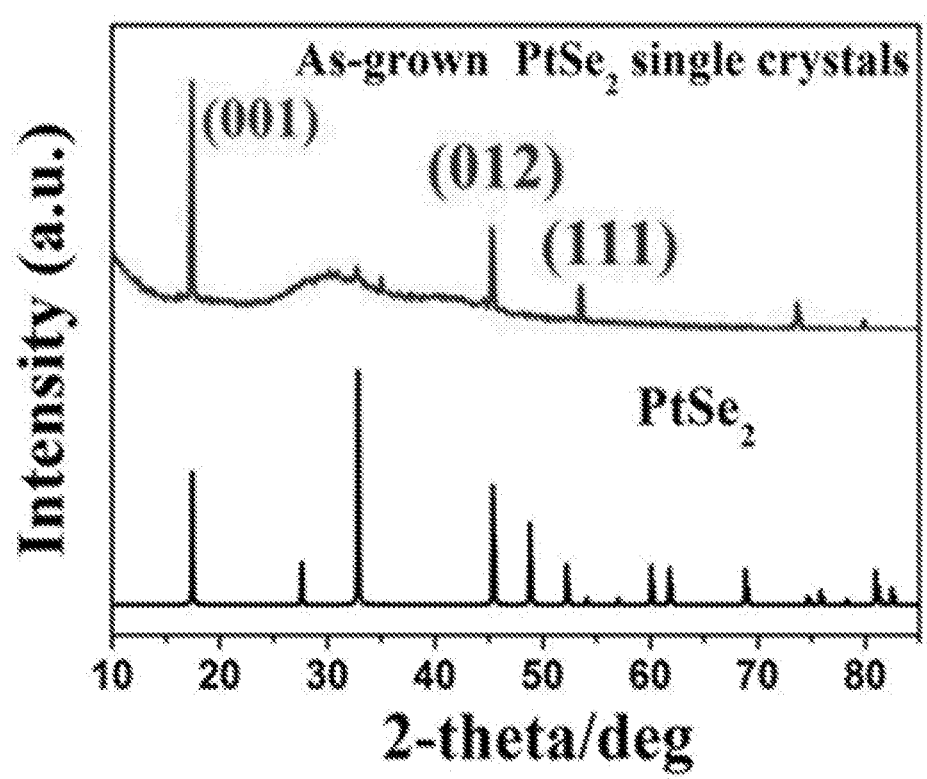
FIG. 4B shows a plot of intensity (in arbitrary units or a.u.) as a function of 2-theta (in degrees or deg) showing the X-ray powder diffraction (XRD) pattern of the fabricated platinum selenide single crystals according to various embodiments.
Figure 4C:
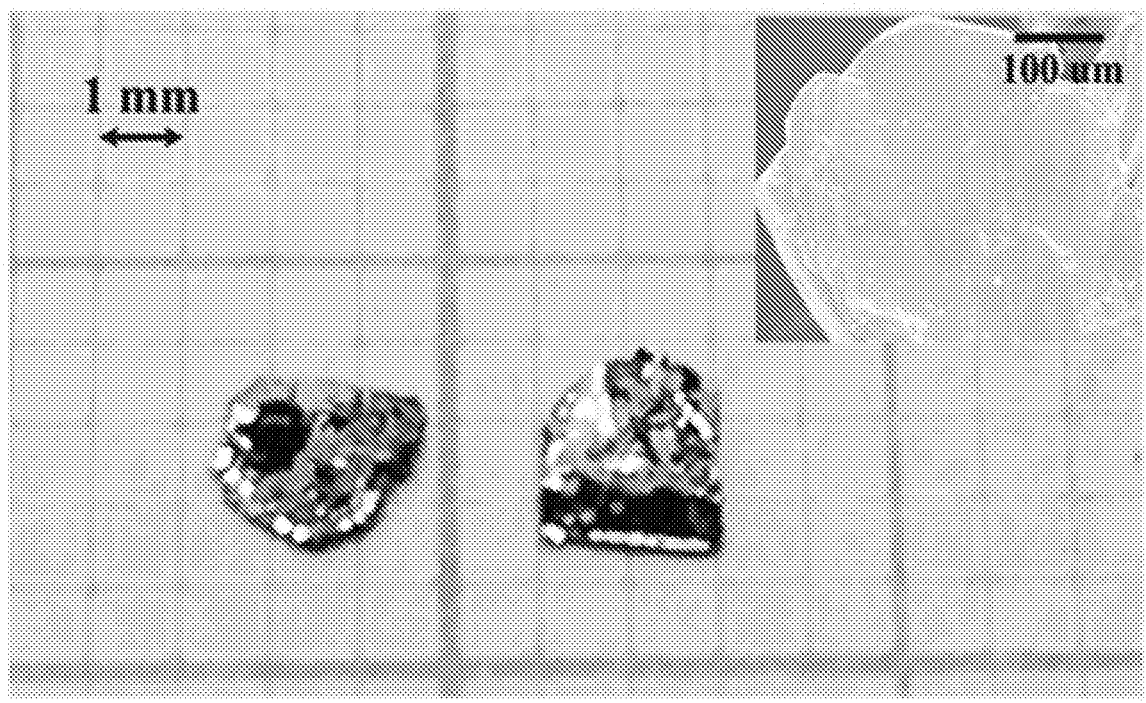
FIG. 4C shows an image of the fabricated platinum selenide crystals, with the inset showing a scanning electron microscopy (SEM) image of a platinum selenide ($PtSe_2$) crystal according to various embodiments.
Figure 4D:
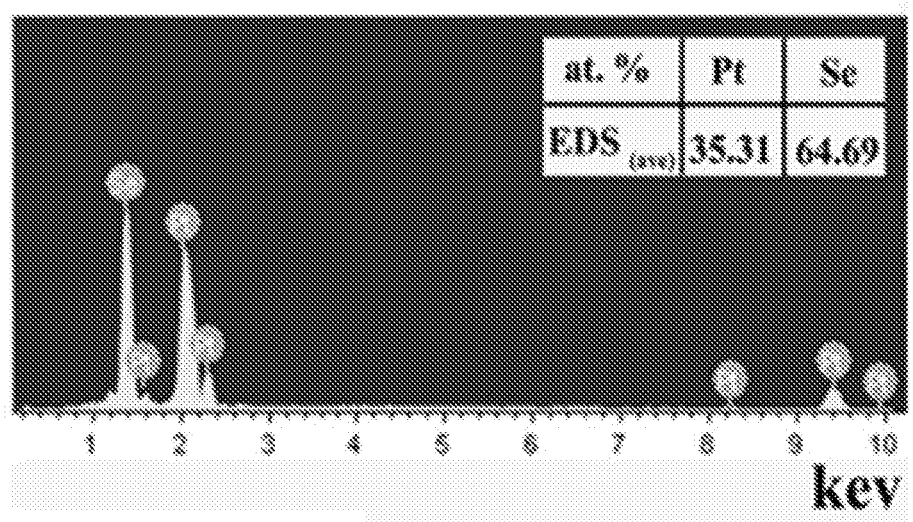
FIG. 4D shows a plot of intensity (in arbitrary units or a.u.) as a function of energy (in kilo electron-volts or keV) showing the energy dispersive X-ray spectroscopy (EDS) of the fabricated platinum selenide single crystals according to various embodiments.

FIG. 4B shows a plot of intensity (in arbitrary units or a.u.) as a function of 2-theta (in degrees or deg) showing the X-ray powder diffraction (XRD) pattern of the fabricated platinum selenide single crystals according to various embodiments. FIG. 4C shows an image of the fabricated platinum selenide crystals, with the inset showing a scanning electron microscopy (SEM) image of a platinum selenide crystal according to various embodiments. FIG. 4D shows a plot of intensity (in arbitrary units or a.u.) as a function of energy (in kilo electron-volts or keV) showing the energy dispersive X-ray spectroscopy (EDS) of the fabricated platinum selenide single crystals according to various embodiments.

The strong, narrow peaks for (001), (012) and (111) in the XRD may indicate the high crystal quality of the synthesized samples. PtSe$_2$ may crystallize in the 1T-type layered structure in the trigonal space group P3̄m₁ (NO. 164) with a=b=3.7278 Å, c=5.0813 Å, α=β=90°, γ=120° and V=61.15 Å. The PtSe$_n$ octahedron may be connected to one other to form Pt—Se layers by Se—Se edges, which are held together by weak van der Waals' forces to form the 1T layered structure like 1T SnSe₂. For example, in the XRD spectrum, the lattice distance (d) may be calculated by:

$$\lambda = 2d \sin(\theta) \quad (1)$$

where n is a positive integer and λ is the wavelength of the incident X-ray light. As a result, the lattice distance (d) of the (001) facet may be 2.56 Å based on the diffraction angle θ of ~18°.

In order to form vacancies or defects in the crystalline PtSe₂, the Se may be reduced relative to the Pt used. A similar set up to that shown in FIG. 4A may be used. In various embodiments, the vacancies or defects may be controlled using the temperature gradient and/or T₂. Further, the setup may be used to form other noble metal chalcogenide materials such as platinum sulfide, palladium sulfide, and palladium selenide. Vacancies or defects may be formed in the noble metal chalcogenide materials by reducing the chalcogen, e.g. S or Se, relative to the noble metal, e.g. Pt or Pd.

Figure 5A:
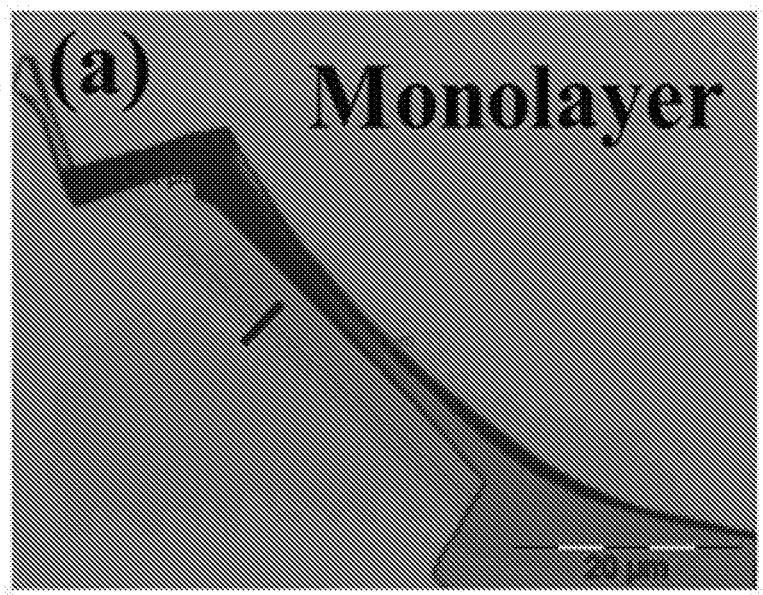
FIG. 5A shows an image showing a monolayer of platinum selenide according to various embodiments.
Figure 5B:
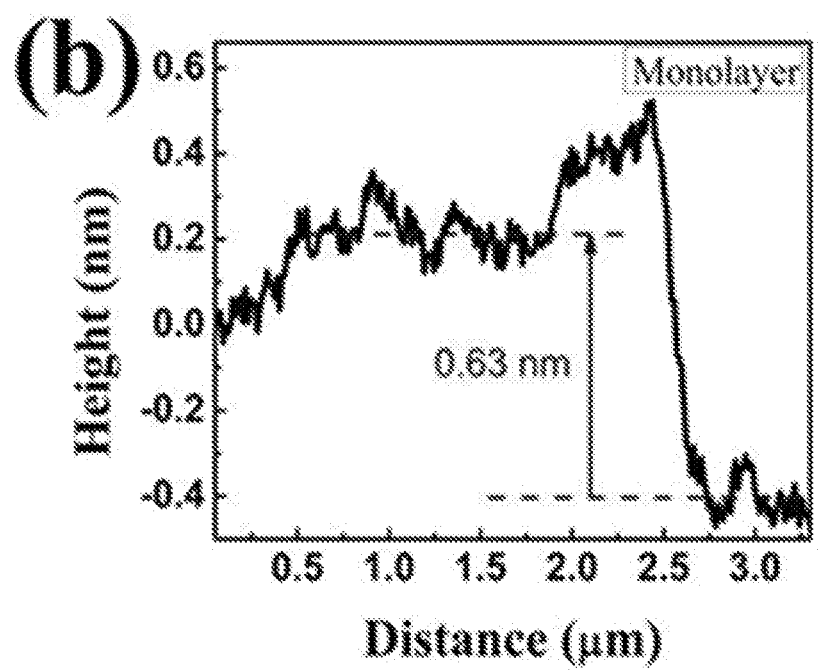
FIG. 5B is a plot of height (in nanometers or nm) as a function of distance (in micrometers or µm) showing the height profile of the monolayer of platinum selenide shown in FIG. 5A according to various embodiments.
Figure 5C:
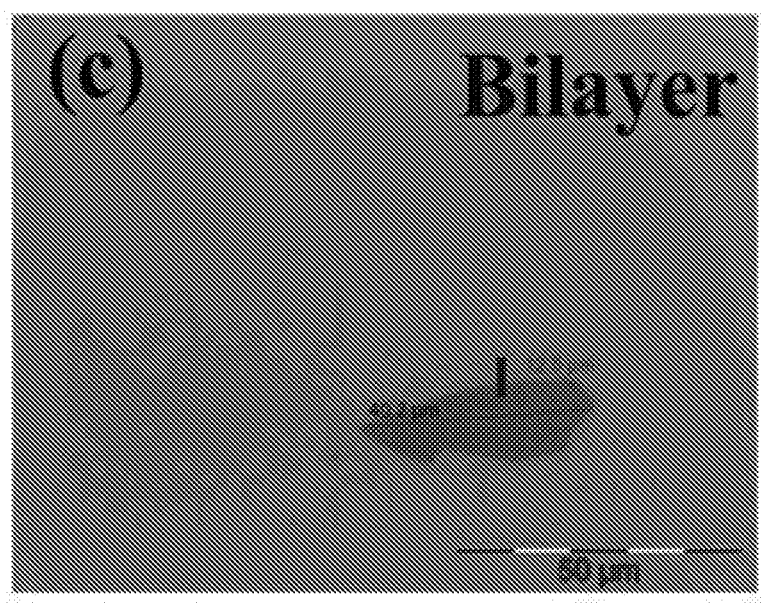
FIG. 5C shows an image showing a bilayer of platinum selenide according to various embodiments.
Figure 5D:
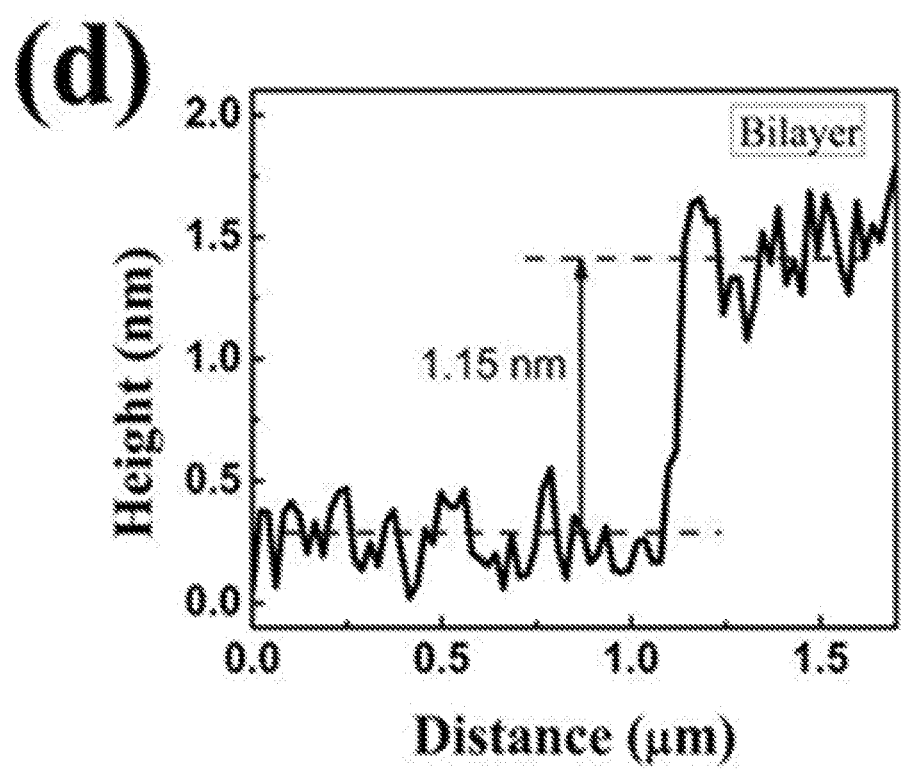
FIG. 5D is a plot of height (in nanometers or nm) as a function of distance (in micrometers or μm) showing the height profile of the bilayer of platinum selenide shown in FIG. 5C according to various embodiments.
Figure 5E:
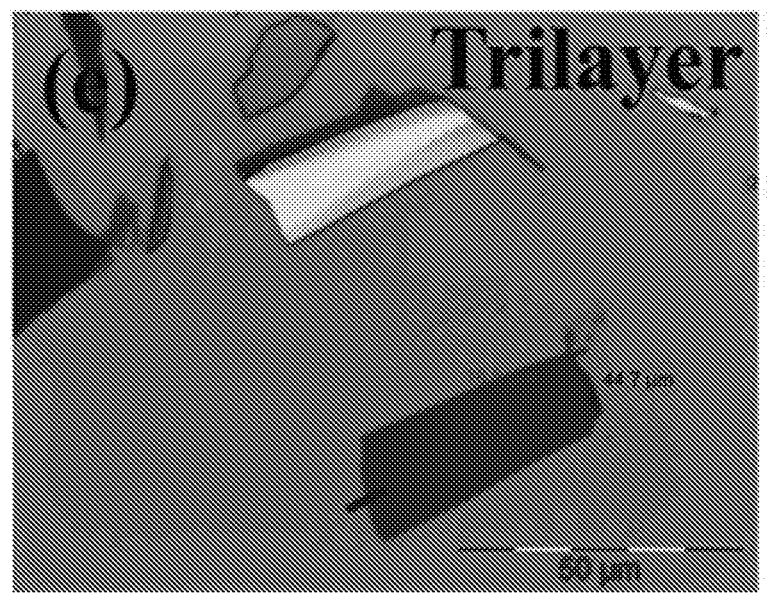
FIG. 5E shows an image showing a trilayer of platinum selenide according to various embodiments.
Figure 5F:
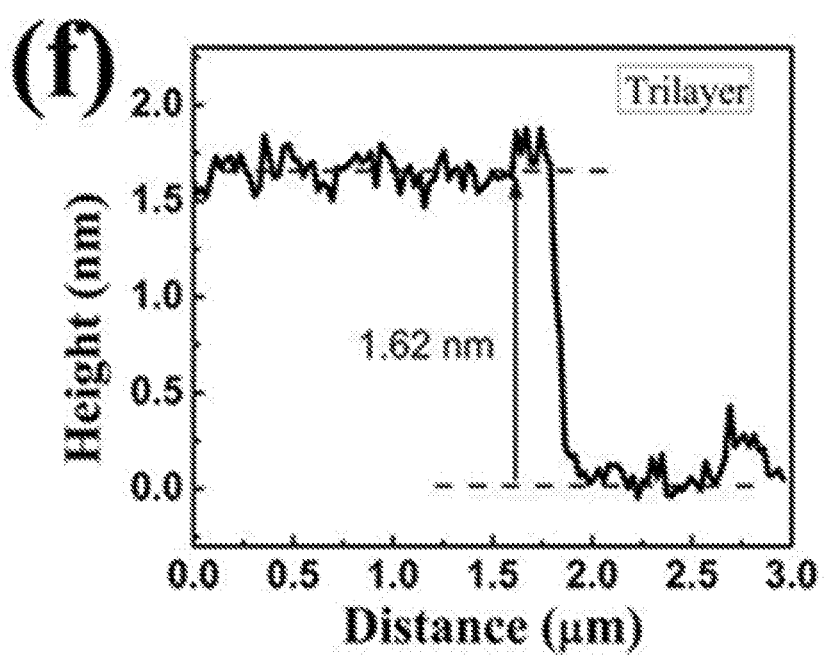
FIG. 5F is a plot of height (in nanometers or nm) as a function of distance (in micrometers or μm) showing the height profile of the trilayer of platinum selenide shown in FIG. 5E according to various embodiments.

After forming the single crystals, layers or flakes of platinum selenide may be exfoliated and transferred to a copper grid. FIG. 5A shows an image showing a monolayer of platinum selenide according to various embodiments. FIG. 5B is a plot of height (in nanometers or nm) as a function of distance (in micrometers or μm) showing the height profile of the monolayer of platinum selenide shown in FIG. 5A according to various embodiments. FIG. 5C shows an image showing a bilayer of platinum selenide according to various embodiments. FIG. 5D is a plot of height (in nanometers or nm) as a function of distance (in micrometers or μm) showing the height profile of the bilayer of platinum selenide shown in FIG. 5C according to various embodiments. FIG. 5E shows an image showing a trilayer of platinum selenide according to various embodiments. FIG. 5F is a plot of height (in nanometers or nm) as a function of distance (in micrometers or μm) showing the height profile of the trilayer of platinum selenide shown in FIG. 5E according to various embodiments.

Figure 6A:
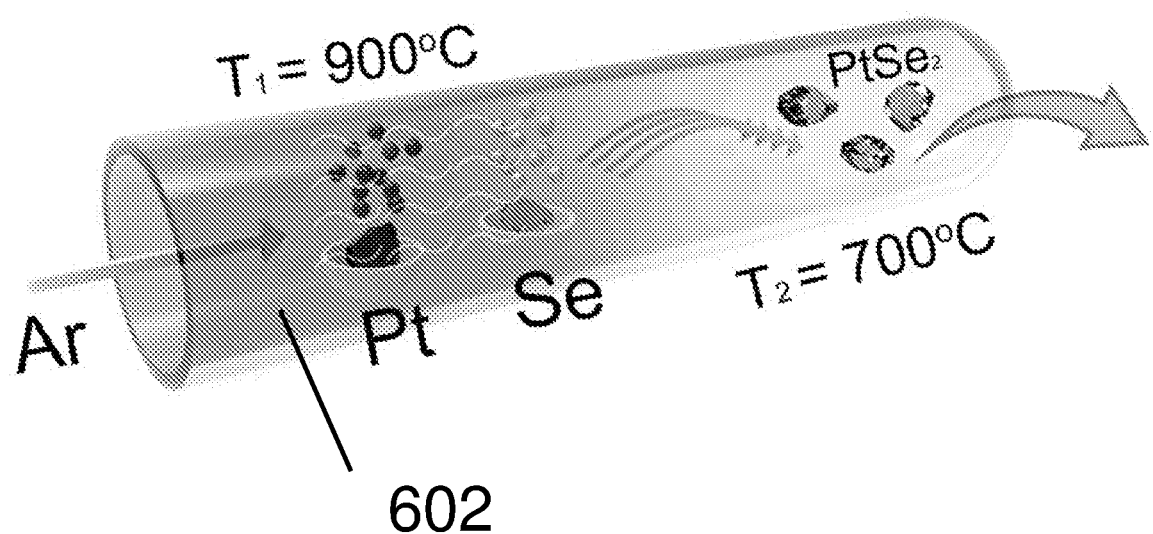
FIG. 6A shows another setup to form platinum selenide crystals via chemical vapor transfer (CVT) according to various embodiments.
Figure 6B:
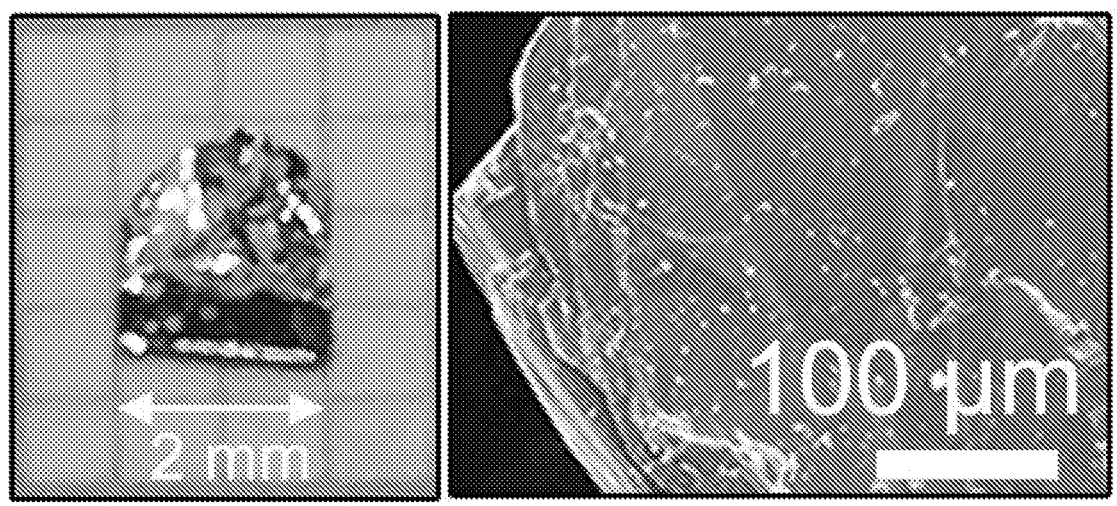
FIG. 6B shows (left) an image of as grown platinum selenide crystals and (right) a scanning electron microscopy (SEM) image of a platinum selenide crystal according to various embodiments.

FIG. 6A shows another setup to form platinum selenide crystals via chemical vapor transfer (CVT) according to various embodiments. The platinum may be volatilized in the presence of selenium gaseous reactant. The platinum (Pt) and selenium (Se) may be provided in a tube 602. The tube 602 may then be heated, for instance, in a two-zone furnace. Argon (Ar) may be used as the transport gas. FIG. 6B shows (left) an image of as grown platinum selenide (PtSe₂) crystals and (right) a scanning electron microscopy (SEM) image of a platinum selenide (PtSe₂) crystal according to various embodiments. The crystals may be up to 2 or 3 mm. FIG. 6B shows that the crystals have flat, wrinkle-free surfaces, which may be helpful in decreasing the carrier scattering and recombination efficiency, resulting in longer carrier transport path and carrier lifetime within the material.

The XRD may be similar to that shown in FIG. 4B. The three major peaks may indicate the characteristic peaks of the sample while other peaks may be counteracted due to the layered structure and special orientation the fabricated flakes have in the (001) direction. In addition, the strong, narrow peaks for (001), (012) and (111) may demonstrate the high crystallinity of the synthesized samples. The energy dispersive X-ray spectrum (EDS) may be similar to that shown in FIG. 4D and may further confirm the pure phase of as-grown PtSe₂.

The quality of PtSe₂ sample may be further characterized by transmission electron microscopy (TEM) in order to clarify its atomic structure.

Figure 6C:
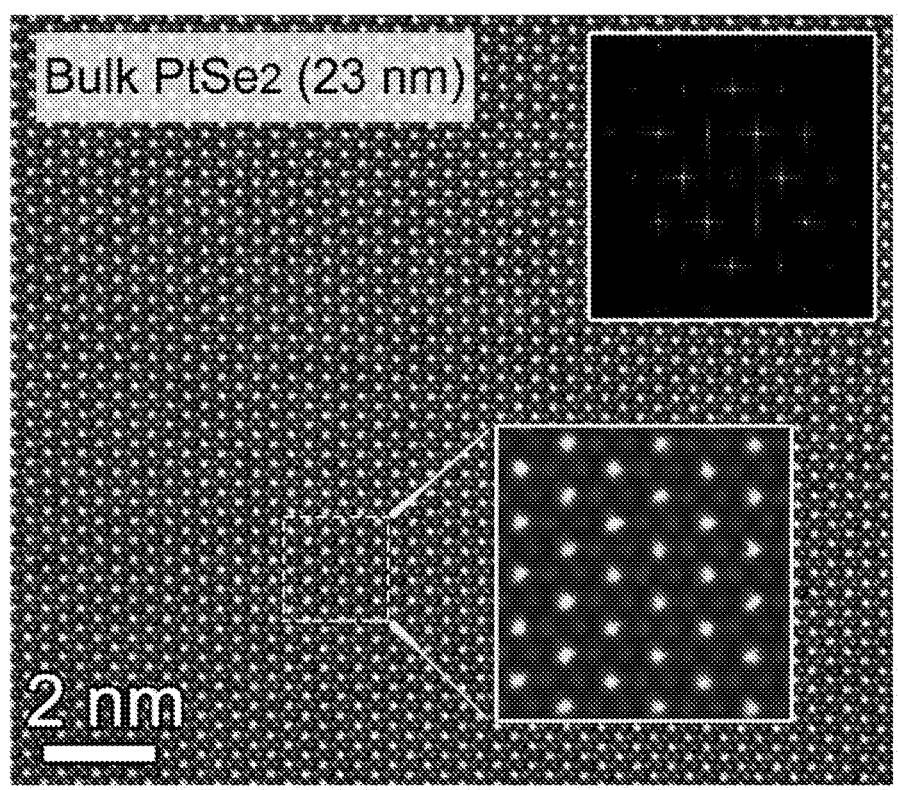
FIG. 6C shows a scanning tunneling electron microscopy (STEM) Z-contrast image obtained from tunneling electron microscopy characterization of a platinum selenide sample according to various embodiments.

FIG. 6C shows a scanning tunneling electron microscopy (STEM) Z-contrast image obtained from tunneling electron microscopy characterization of a platinum selenide sample according to various embodiments. The inset at the upper right corner shows fast Fourier transformation of the atomic resolution of the STEM Z-contrast image. The thickness of the measured sample is ~23 nm. The lattice constant is found to be ~3.8 Å, which may be in line with the theoretical value.

The TEM, combined with the XRD pattern may demonstrate the successful growth of highly crystalline platinum selenide. The obtained platinum selenide may possess layered 1T-type hexagonal crystal structure with space group P-3m1 and lattice parameters, a=b=3.7278 Å and c=5.0813 Å.

Figure 6D:
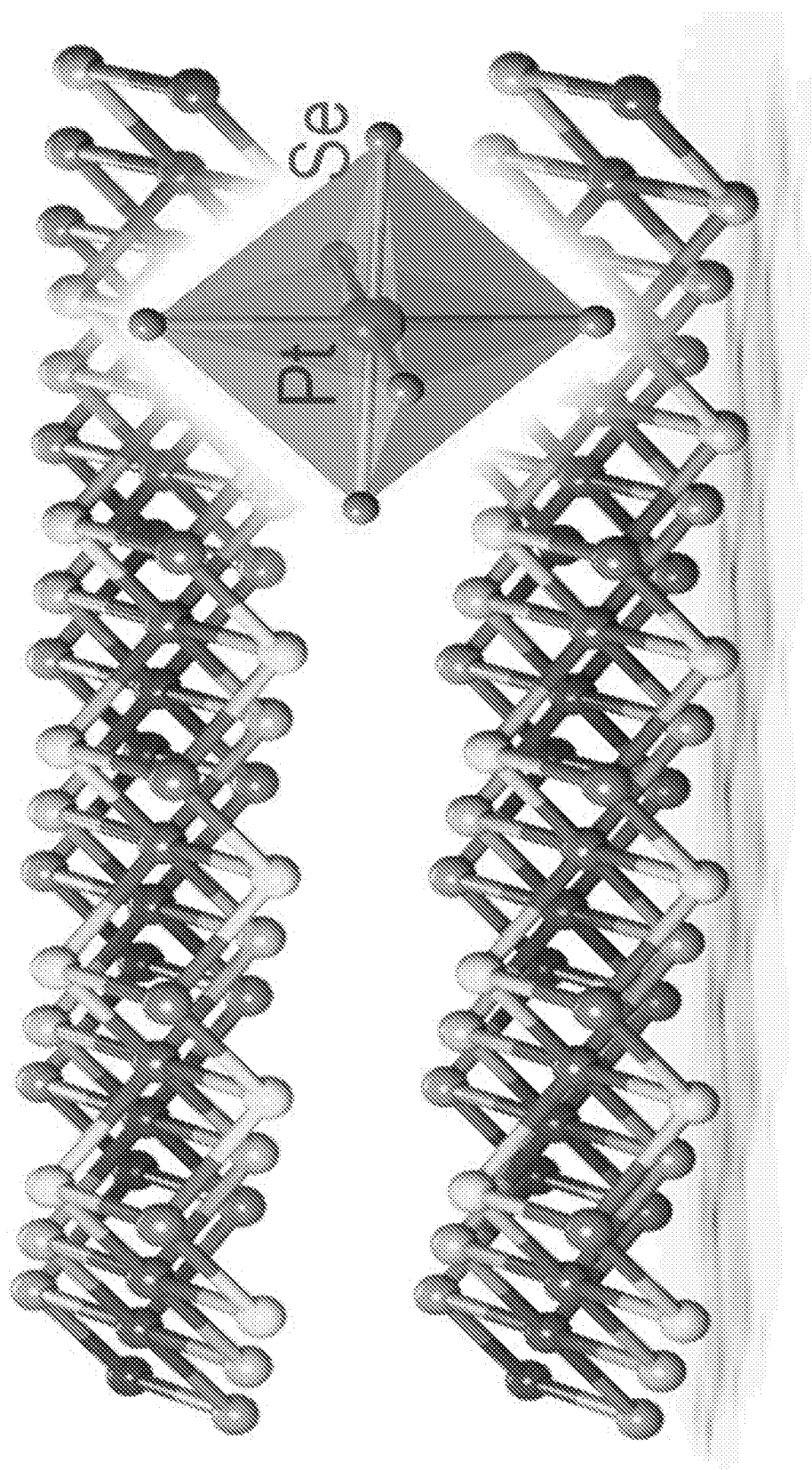
FIG. 6D shows a schematic of a platinum selenide ($PtSe_2$) crystal structure according to various embodiments.
Figure 6E:
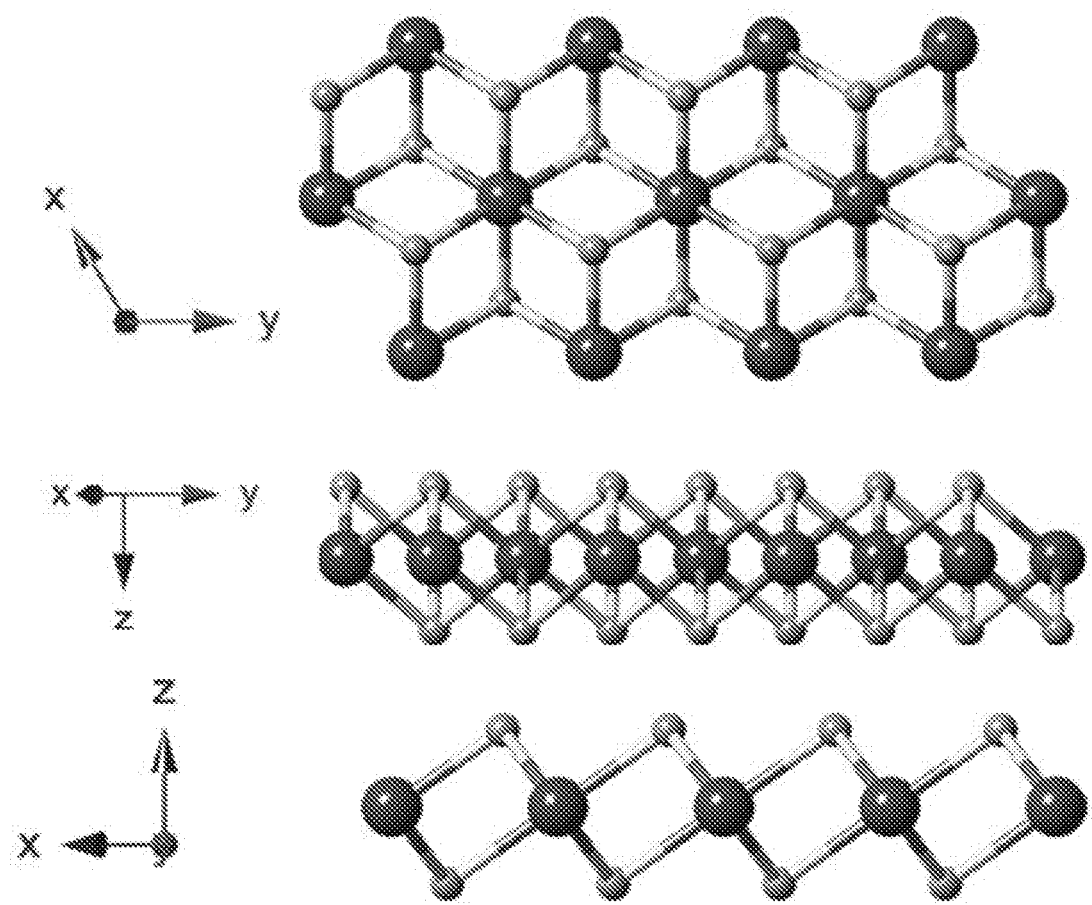
FIG. 6E shows schematics of different side views of the crystal structure of the platinum selenide ($PtSe_2$) crystal according to various embodiments.
Figure 7A:
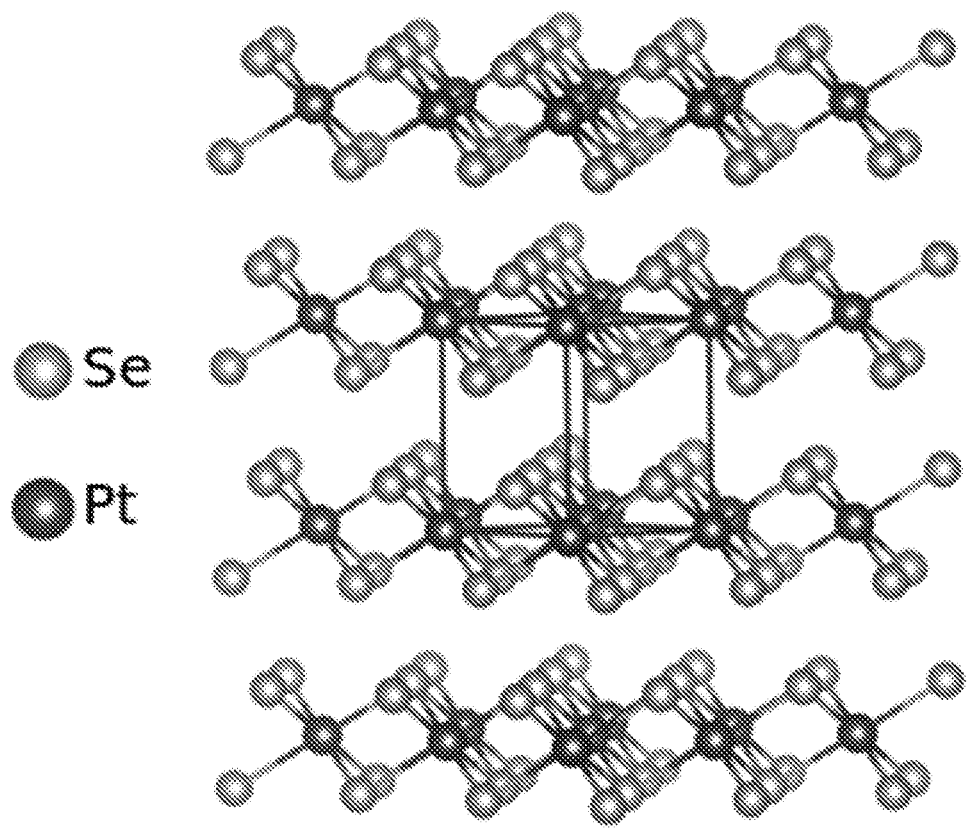
FIG. 7A shows a schematic of the crystal structure of a multilayer stack of platinum selenide ($PtSe_2$) according to various embodiments.

FIG. 6D shows a schematic of a platinum selenide (PtSe₂) crystal structure according to various embodiments. FIG. 6E shows schematics of different side views of the crystal structure of the platinum selenide (PtSe₂) crystal according to various embodiments. FIG. 7A shows a schematic of the crystal structure of a multilayer stack of platinum selenide (PtSe₂) according to various embodiments.

A layer of PtSe₂, which may be referred to as a crystalline sheet, may consist of three layers of atoms stacked in the order of Se—Pt—Se. The different layers or crystalline sheets of PtSe₂ in a multilayer stack may be held together by weak van der Waals forces. Within a single PtSe₂ layer or crystalline sheet, the Se atoms may be strongly bonded with the Pt atoms to form octahedral prismatic local coordination structures, wherein each coordination structure includes a Pt atom at the center of each coordination structure. The PtSe₂ octahedral structures within the single PtSe₂ layer or crystalline sheet may be connected to one another by sharing Se—Se edges. The layered crystal structure of PtSe₂ may be analogous to traditional TMDCs. Monolayers, bilayers, or multilayers of PtSe₂ may be formed by proper exfoliation strategies.

Figure 7B:
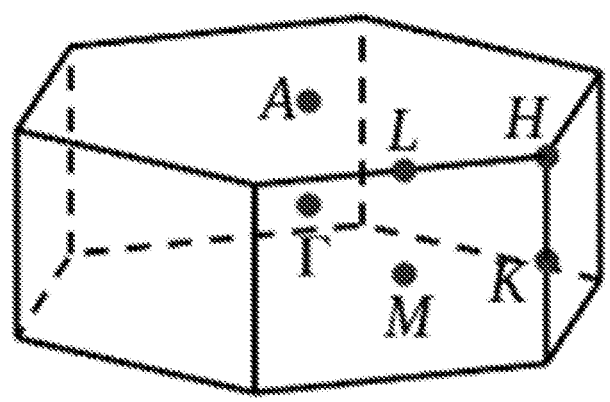
FIG. 7B is a schematic showing the Brillouin zone of a three dimensional (3D) platinum selenide ($PtSe_2$) bulk film according to various embodiments.
Figure 7C:
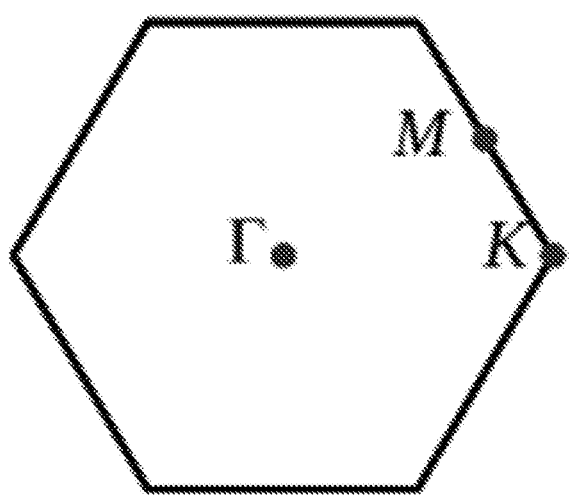
FIG. 7C is a schematic showing the Brillouin zone of a two dimensional (2D) platinum selenide ($PtSe_2$) thin film according to various embodiments.

FIG. 7B is a schematic showing the brillouin zone of a three dimensional (3D) platinum selenide (PtSe₂) bulk film according to various embodiments. FIG. 7C is a schematic showing the brillouin zone of a two dimensional (2D) platinum selenide (PtSe₂) thin film according to various embodiments. The high symmetry points are marked in FIGS. 7B and 7C.

Figure 7D:
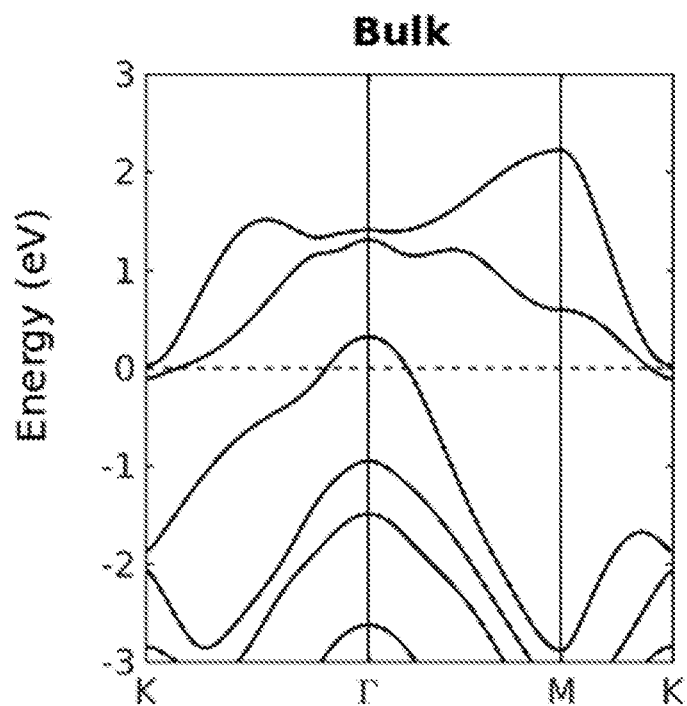
FIG. 7D is a plot of energy (in electron-volts or eV) as a function of points showing the band structure of a platinum selenide ($PtSe_2$) bulk film according to various embodiments.
Figure 7E:
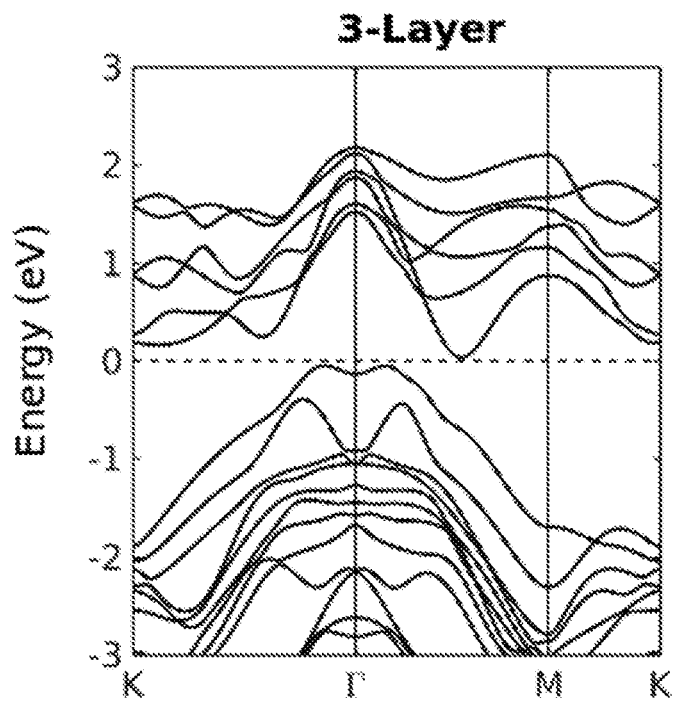
FIG. 7E is a plot of energy (in electron-volts or eV) as a function of points showing the band structure of a platinum selenide ($PtSe_2$) trilayer film according to various embodiments.

FIG. 7D is a plot of energy (in electron-volts or eV) as a function of points showing the band structure of a platinum selenide (PtSe₂) bulk film according to various embodiments. FIG. 7E is a plot of energy (in electron-volts or eV) as a function of points showing the band structure of a platinum selenide (PtSe₂) trilayer film according to various embodiments.

PtSe₂ flakes or atomic layers may be exfoliated from the bulk crystals by Scotch tape and transferred onto a silicon wafer with a 285 nm thermal oxidation layer. The flakes may, for instance, consist of a single crystalline sheet (monolayer), two crystalline sheets (bilayer), or three crystalline sheets (trilayer). The optical images of monolayer, bilayer and trilayer PtSe₂ on the SiO₂/Si wafer are shown in FIGS. 8A, C and E, while FIGS. 8B, D and F show height profiles of the layers measured using Atomic Force Microscopy (AFM).

Figure 8A:
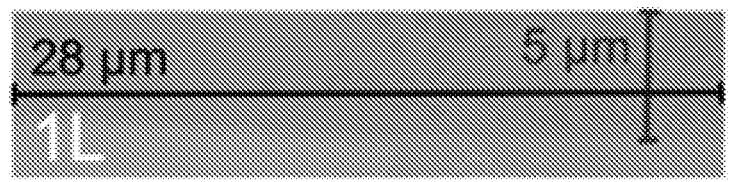
FIG. 8A shows an image showing a monolayer (marked as 1L) of platinum selenide according to various embodiments.
Figure 8B:
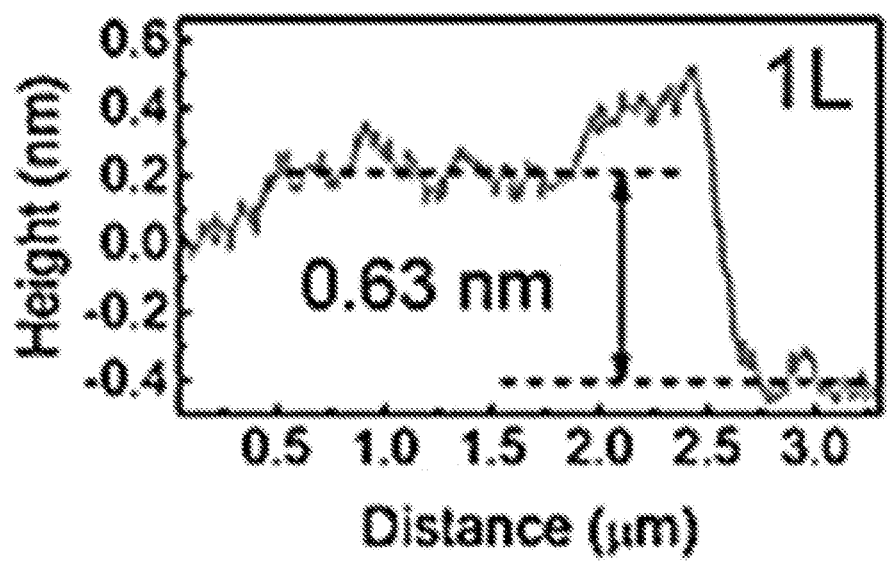
FIG. 8B is a plot of height (in nanometers or nm) as a function of distance (in micrometers or μm) showing the height profile of the monolayer of platinum selenide shown in FIG. 8A according to various embodiments.

FIG. 8A shows an image showing a monolayer (marked as 1L) of platinum selenide according to various embodiments. FIG. 8B is a plot of height (in nanometers or nm) as a function of distance (in micrometers or μm) showing the height profile of the monolayer of platinum selenide shown in FIG. 8A according to various embodiments.

Figure 8C:
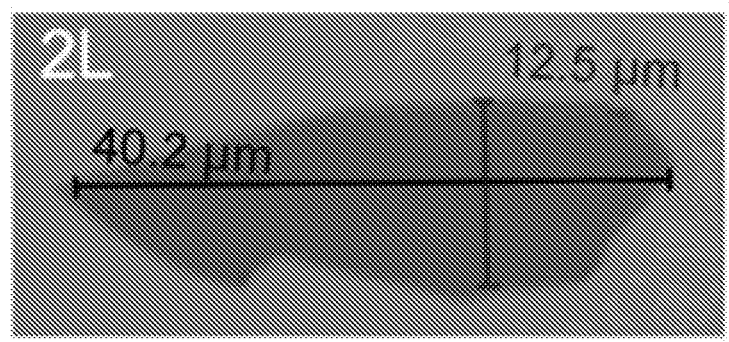
FIG. 8C shows an image showing a bilayer (marked as 2L) of platinum selenide according to various embodiments.
Figure 8D:
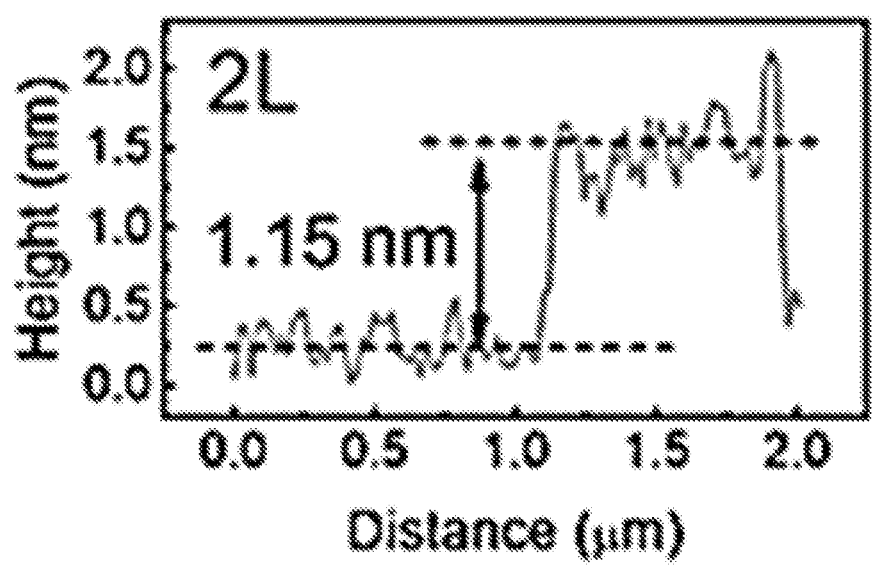
FIG. 8D is a plot of height (in nanometers or nm) as a function of distance (in micrometers or μm) showing the height profile of the bilayer of platinum selenide shown in FIG. 8C according to various embodiments.

FIG. 8C shows an image showing a bilayer (marked as 2L) of platinum selenide according to various embodiments. FIG. 8D is a plot of height (in nanometers or nm) as a function of distance (in micrometers or μm) showing the height profile of the bilayer of platinum selenide shown in FIG. 8C according to various embodiments.

Figure 8E:
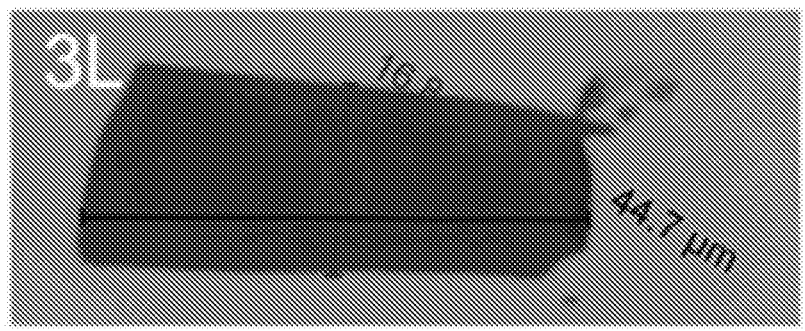
FIG. 8E shows an image showing a trilayer (marked as 3L) of platinum selenide according to various embodiments.
Figure 8F:
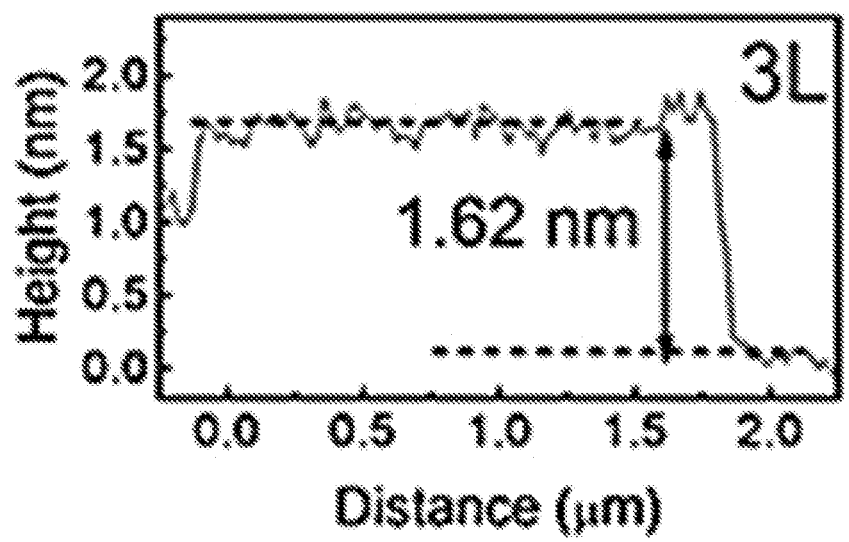
FIG. 8F is a plot of height (in nanometers or nm) as a function of distance (in micrometers or μm) showing the height profile of the trilayer of platinum selenide shown in FIG. 8E according to various embodiments.

FIG. 8E shows an image showing a trilayer (marked as 3L) of platinum selenide according to various embodiments. FIG. 8F is a plot of height (in nanometers or nm) as a function of distance (in micrometers or μm) showing the height profile of the trilayer of platinum selenide shown in FIG. 8E according to various embodiments.

The thicknesses of the samples were determined by the AFM height profiles measured along the dashed lines crossing the flakes. The thickness of $PtSe_2$ monolayer may be about 0.63 nm as shown in FIG. 8B. The slight dips near the boundary may be caused by the absorbed molecular residues. As shown in FIGS. 8D and 8F, the thickness of $PtSe_2$ bilayer may be about 1.15 nm and the thickness of $PtSe_2$ trilayer may be about 1.62 nm. The measured values show an almost linear relationship between the number of layers and the thickness from 1 layer to 3 layers.

Figure 8G:
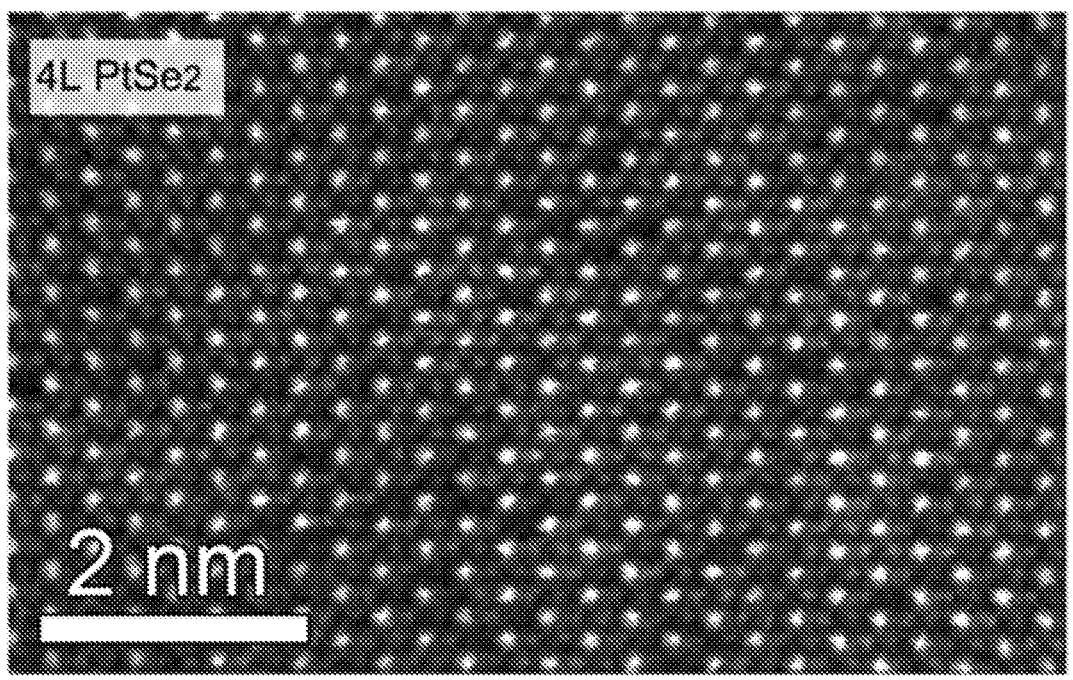
FIG. 8G shows a scanning transmission electron microscopy (STEM)-Z-contrast image of a multi-layer platinum selenide according to various embodiments.

FIG. 8G shows a scanning transmission electron microscopy (STEM)-Z-contrast image of a multi-layer platinum selenide according to various embodiments. As shown in FIG. 8G, there may be a considerable number of Se vacancies ($V_{Se}$) randomly distributed in the lattice. These defects may play an important role in the bandgap and light absorption of the $PtSe_x$ flakes or atomic layers and are discussed in detail further below.

Figure 8H:
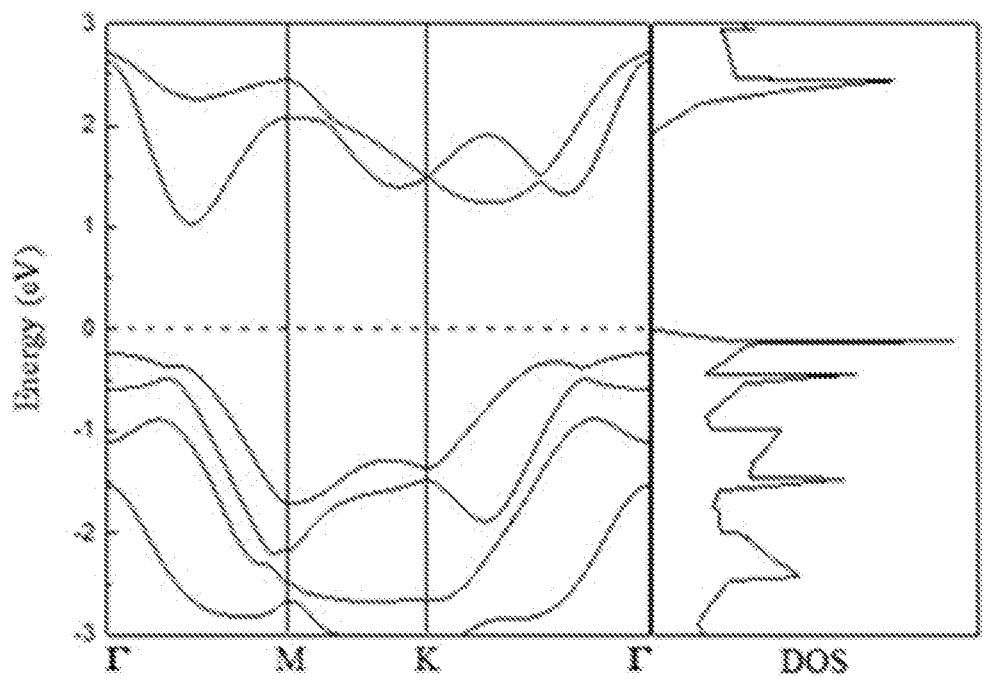
FIG. 8H is a plot of energy (in electron-volts or eV) as a function of points showing the density of states (DOS) of a perfect platinum selenide ($PtSe_2$) monolayer according to various embodiments.
Figure 8I:
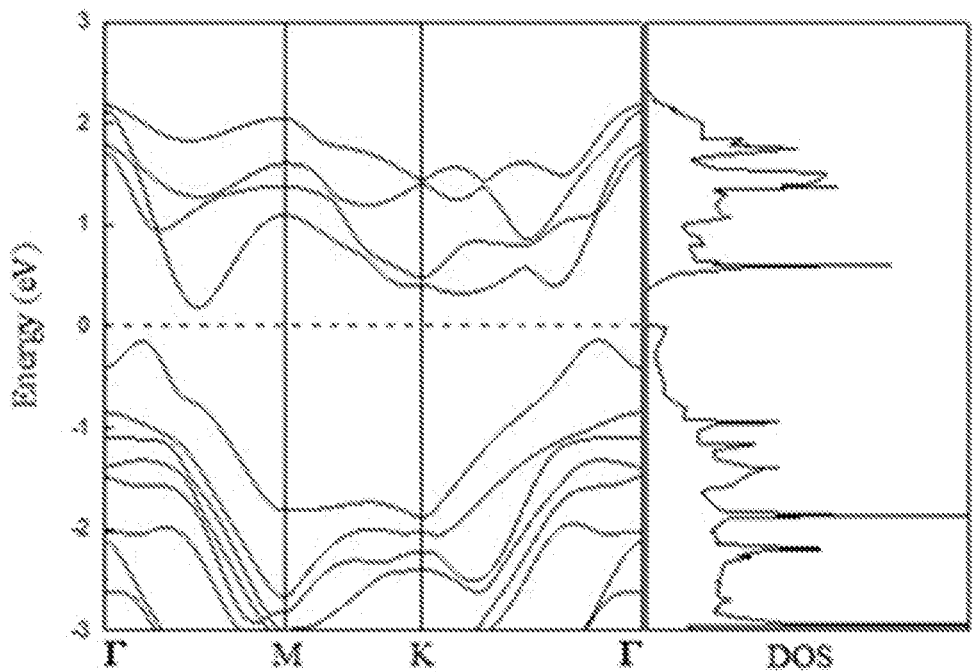
FIG. 8I is a plot of energy (in electron-volts or eV) as a function of points showing the density of states (DOS) of a perfect platinum selenide ($PtSe_2$) bilayer according to various embodiments.
Figure 8J:
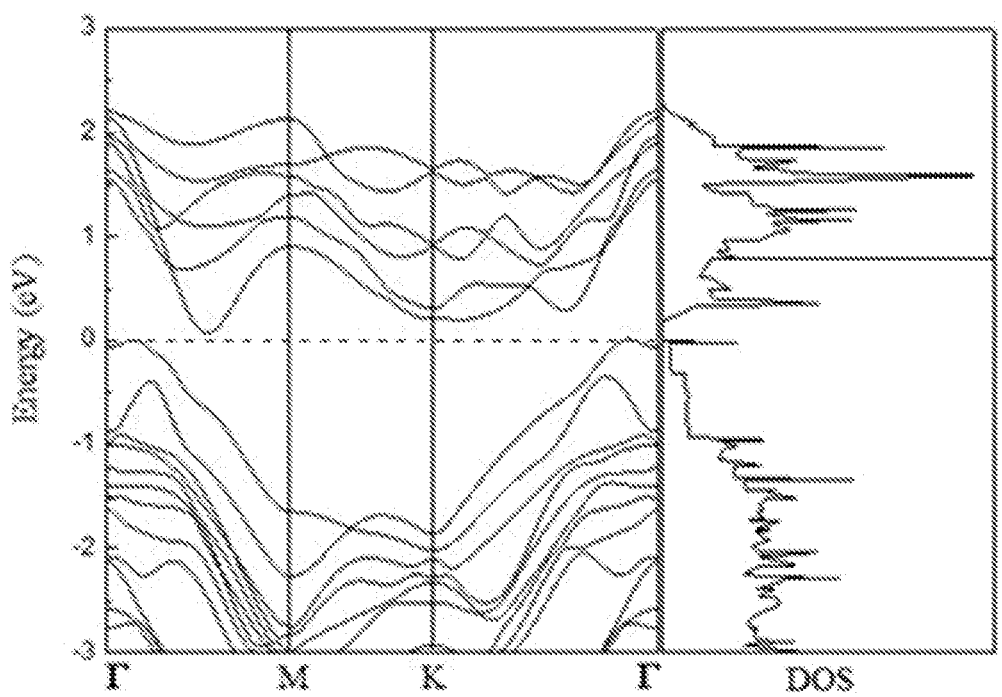
FIG. 8J is a plot of energy (in electron-volts or eV) as a function of points showing the density of states (DOS) of a perfect platinum selenide ($PtSe_2$) trilayer according to various embodiments.

FIG. 8H is a plot of energy (in electron-volts or eV) as a function of points showing the density of states (DOS) of a perfect platinum selenide ($PtSe_2$) monolayer according to various embodiments. FIG. 8I is a plot of energy (in electron-volts or eV) as a function of points showing the density of states (DOS) of a perfect platinum selenide ($PtSe_2$) bilayer according to various embodiments. FIG. 8J is a plot of energy (in electron-volts or eV) as a function of points showing the density of states (DOS) of a perfect platinum selenide ($PtSe_2$) trilayer according to various embodiments.

Figure 9A:
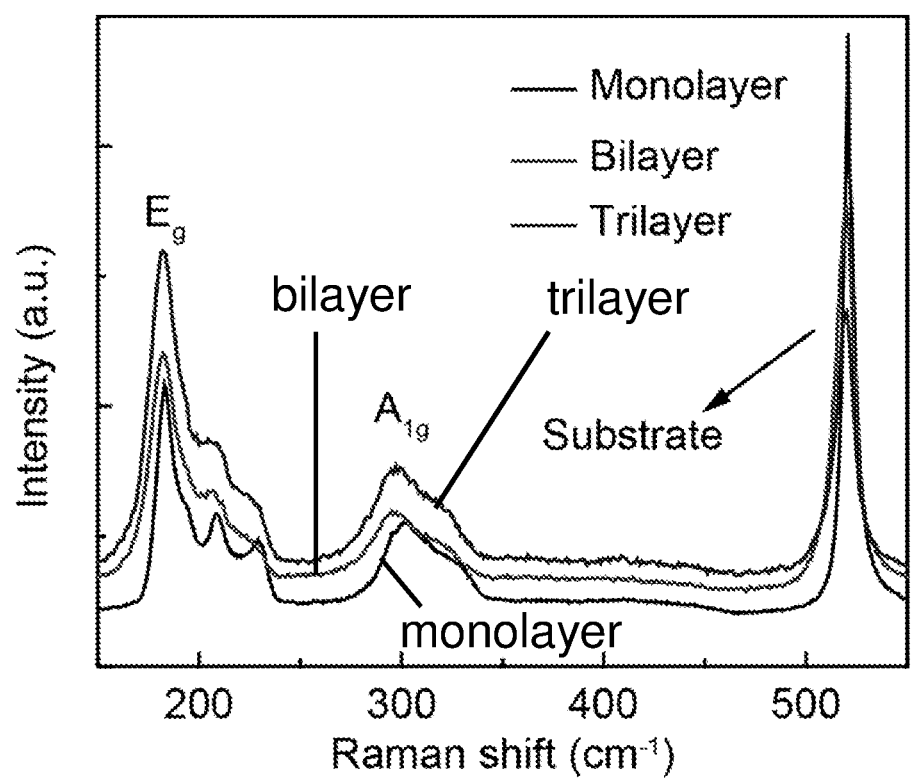
FIG. 9A is a plot of intensity (in arbitrary units or a.u.) as a function of Raman shift (in per centimeter or $cm^{-1}$) showing the Raman spectroscopy of monolayer, bilayer and trilayer platinum selenide according to various embodiments.

The layer-dependent properties may also be characterized by Raman spectroscopy similar to other two-dimensional material characterizations. FIG. 9A is a plot of intensity (in arbitrary units or a.u.) as a function of Raman shift (in per centimeter or $cm^{-1}$) showing the Raman spectroscopy of monolayer, bilayer and trilayer platinum selenide according to various embodiments. The platinum selenide may be exfoliated by scotch tape on silicon/silicon oxide ($Si/SiO_2$) wafer. The synthesized bulk platinum selenide and atomic layered platinum selenide, i.e. monolayer, bilayer and trilayer platinum selenide may show two main Raman peaks near about 200 $cm^{-1}$ and near about 300 $cm^{-1}$ as shown in FIG. 9A, which may be attributed to $E_g$ mode vibration and $A_{1g}$ mode vibration respectively.

Figure 9B:
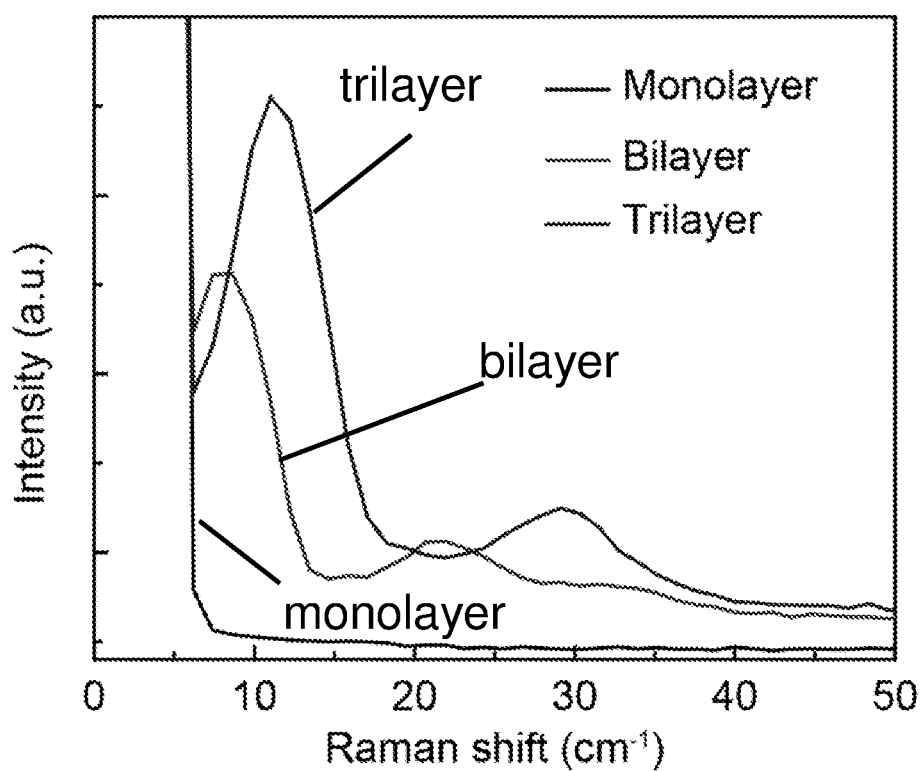
FIG. 9B is a plot of intensity (in arbitrary units or a.u.) as a function of Raman shift (in per centimeter or $cm^{-1}$) showing ultralow frequency (ULF) Raman spectroscopy of monolayer, bilayer and trilayer platinum selenide according to various embodiments.

On the other hand, the shear mode frequencies (i.e. frequencies less than or equal to about 50 $cm^{-1}$) may indicate the layered structure of platinum selenide flakes. The shear mode frequencies may be used to accurately determine the number of layers in platinum selenide flakes. FIG. 9B is a plot of intensity (in arbitrary units or a.u.) as a function of Raman shift (in per centimeter or $cm^{-1}$) showing ultralow frequency (ULF) Raman spectroscopy of monolayer, bilayer and trilayer platinum selenide according to various embodiments. The ultralow frequencies (ULF) may be attributed to interlayer coupling, and the ULF Raman spectrum may be layer-sensitive. The ultralow frequencies may be employed as probes to determine the number of layers present in platinum selenide flakes.

Figure 9C:
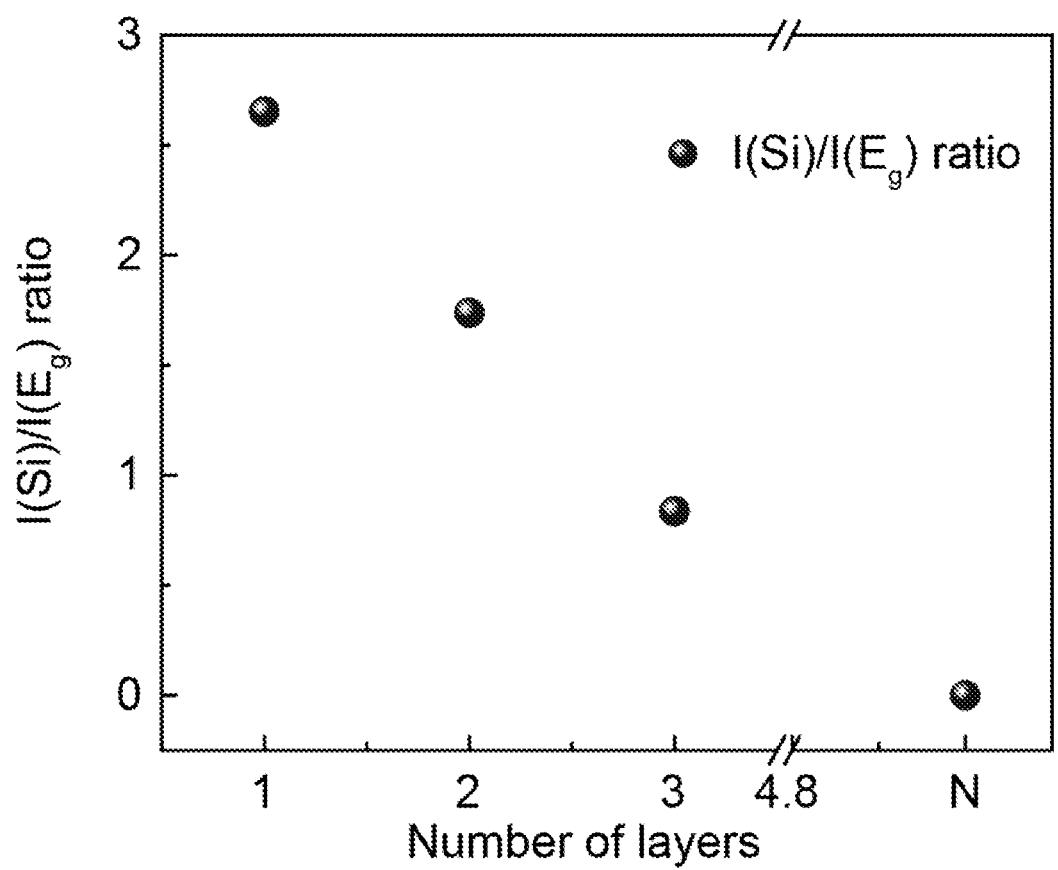
FIG. 9C is a plot of shear mode ($S_i$, 50 $cm^{-1}$) intensity to $E_g$ (~200 $cm^{-1}$) intensity ratio ($I(S_i)/(E_g)$ ratio) as a function of the number of layers in a platinum selenide flake according to various embodiments.

FIG. 9C is a plot of shear mode ($S_i$, ~50 $cm^{-1}$) intensity to $E_g$ (~200 $cm^{-1}$) intensity ratio ($I(S_i)/I(E_g)$ ratio) as a function of the number of layers in a platinum selenide flake according to various embodiments.

Figure 9D:
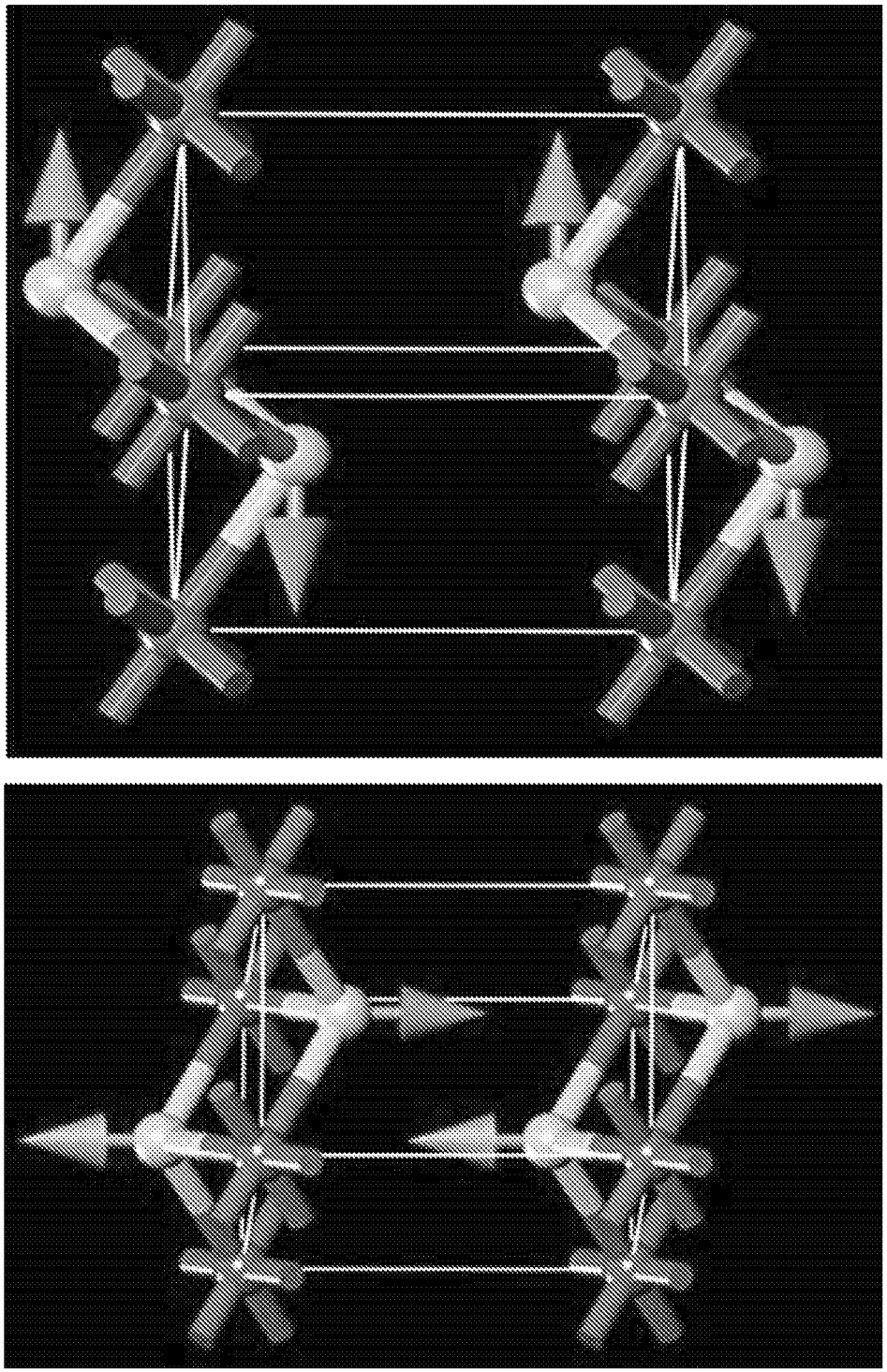
FIG. 9D shows simulation models for the Raman spectroscopy of platinum selenide flakes according to various embodiments.

FIG. 9D shows simulation models for the Raman spectroscopy of platinum selenide flakes according to various embodiments. The left indicates the $A_{1g}$ mode vibration and the right indicates the $E_g$ mode vibration.

In order to understand the dependency of band structure and bandgap of platinum selenide ($PtSe_2$) on the number of layers, first-principles calculations may be performed. From FIGS. 8H-J, it is observed that monolayer and bilayer platinum selenide may be semiconductors with indirect bandgaps of ~1.2 eV and ~0.3 eV respectively (which are in line with earlier studies), while trilayer platinum selenide may have a very small bandgap of ~0.08 eV. However, trilayer $PtSe_2$ has been predicted to be metallic. The mismatch may be caused by the scanning resolution limit of the Vienna Ab Initio Simulation Package (VASP) projector for such narrow bandgap semiconductors as shown in FIGS. 7D-E. Based on the above observations, thicker platinum selenide may become metallic.

The small bandgap of bilayer platinum selenide may make it suitable for light absorption in the mid-infrared ($\lambda > 4$ μm) region. Bilayer platinum selenide may be a suitable candidate to fill in the gap between graphene and commonly employed TMDCs, and may be a suitable two dimensional (2D) semiconductor candidate material for mid-infrared photonic and optoelectronic applications.

Platinum selenide field effect transistors (FETs) may be fabricated to investigate mid-infrared photo-detection, thereby demonstrating the optoelectronic properties of atomic layered platinum selenide.

The photodetector may include a heavily doped silicon substrate and a chalcogenide film including the platinum selenide flakes on the substrate. The platinum selenide flakes may be atomic-layered, graphene-like or graphite-like flakes, i.e. containing one or more crystalline sheets, and may be mechanically exfoliated from the CVT synthesized platinum selenide single crystals using adhesive 3M-tape and deposited on a silicon wafer with a 285-nm thermalized silicon oxide ($SiO_2$) layer. The location and quality of atomic-layered platinum selenide flakes may be identified or determined by optical contrast using an optical microscope and Raman spectroscopy.

The photodetector may also include a first electrical contact and a second electrical contact in contact with the chalcogenide film. The first electrical contact may be spaced apart from the second electrical contact. The electrical contacts may be formed using electron beam evaporation after standard lithography procedure, and may each include 20 nm of titanium (Ti) and 80 nm of gold (Au) on the titanium. The heavily doped silicon substrate may be used as a back gate. The first electrical contact may be taken as the drain and the second electrical contact may be taken as the source.

Electrical characteristics such as drain/channel current-drain voltage ($I_D$-$V_D$) and drain current-gate voltage ($I_D$-$V_G$) curves may be measured by a semiconductor analyzer (Agilent, B1500 A). All measurements are carried out in the dark under room temperatures. The source electrode may be connected to ground.

Figure 10A:
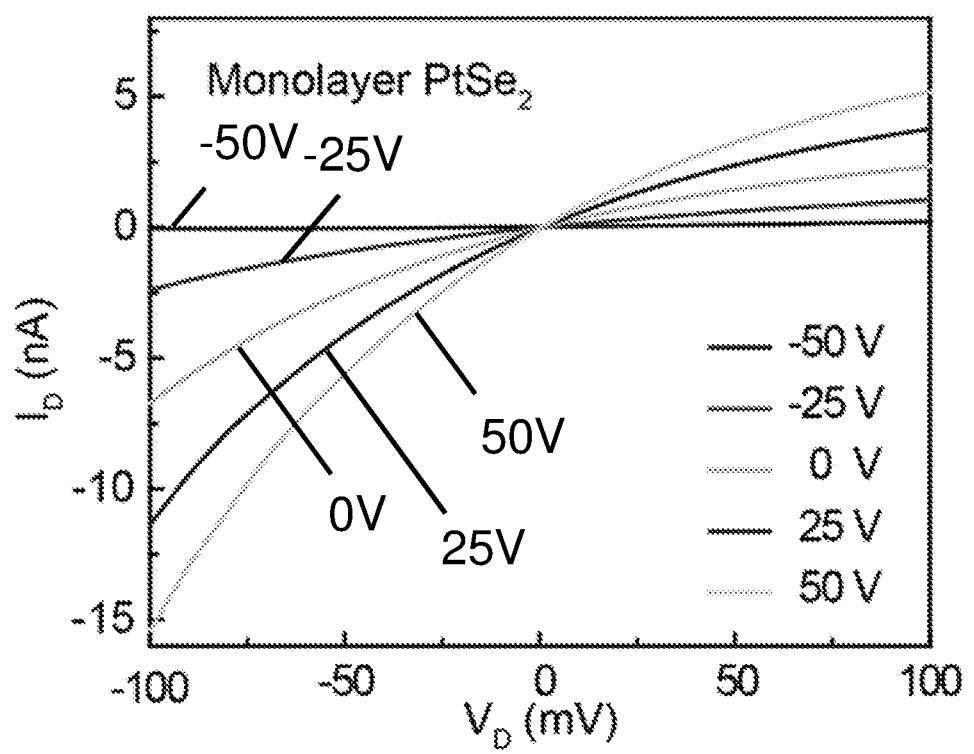
FIG. 10A is a plot of current (in nano-amperes or nA) as function of voltage (in millivolts or mV) showing the drain/channel current–drain voltage ($I_D$-$V_D$) curves of monolayer platinum selenide based field effect transistor (FET) according to various embodiments at different gate voltages.
Figure 10B:
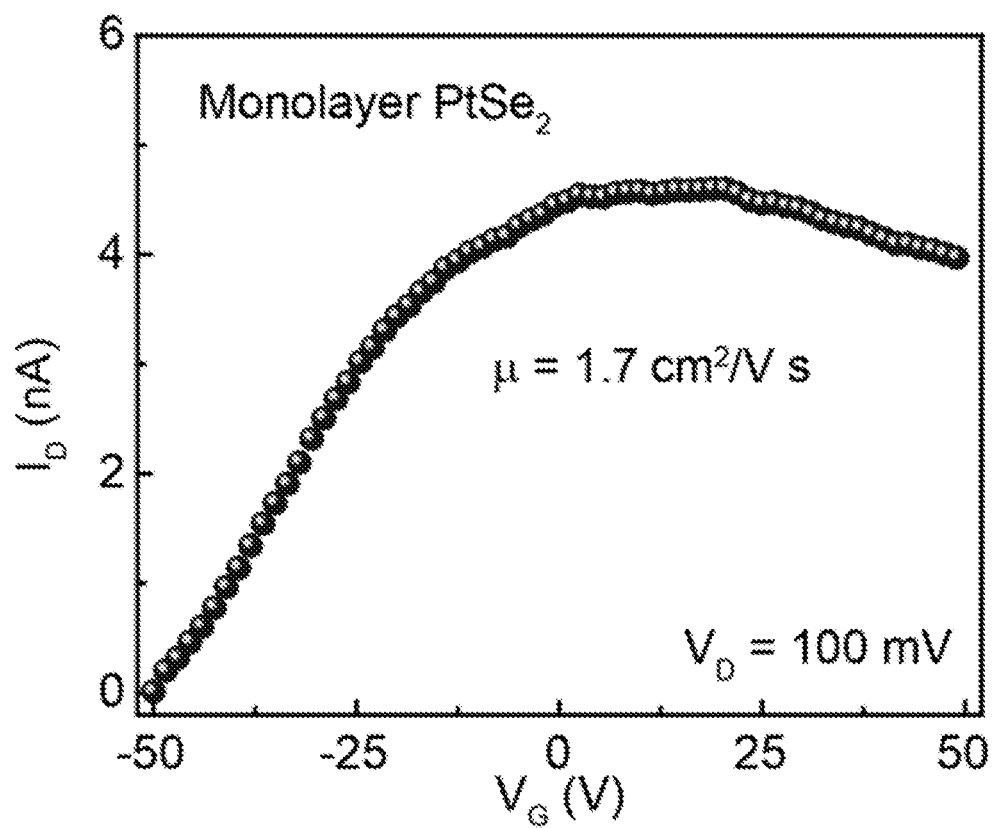
FIG. 10B is a plot of current (in nano-amperes or nA) as function of voltage (in volts or V) showing the drain/channel current–gate voltage ($I_D$-$V_G$) curve of monolayer platinum selenide based field effect transistor (FET) according to various embodiments.

FIG. 10A is a plot of current (in nano-amperes or nA) as a function of voltage (in millivolts or mV) showing the drain/channel current–drain voltage ($I_D$–$V_D$) curves of monolayer platinum selenide based field effect transistor (FET) according to various embodiments at different gate voltages. FIG. 10B is a plot of current (in nano-amperes or nA) as a function of voltage (in volts or V) showing the drain/channel current–gate voltage ($I_D$–$V_G$) curve of monolayer platinum selenide based field effect transistor (FET) according to various embodiments.

The mobility ($\mu$) of the carriers may be calculated by:

$$\mu = \frac{L}{W \times \left(\frac{\varepsilon_0 \varepsilon_r}{d}\right)} \times \frac{dI_{ds}}{dV_G} \times \frac{1}{V_{ds}} \qquad (2)$$

where L denotes the channel length, W denotes the channel width, and d denotes the thickness of the silicon oxide ($SiO_2$) layer. The thickness of the silicon oxide layer is about 285 nm in the experiments. In addition, $V_{ds}$ denotes the source-drain bias, $I_{ds}$ denotes the channel current, and $V_b$ denotes the bottom gate voltage when the device is operating in the linear region in the $I_d$/$V_g$ curve. $\varepsilon_0$ is the vacuum dielectric constant, and $\varepsilon_r$ is the dielectric constant, which is 3.9 for silicon oxide. The calculated carrier mobility of monolayer platinum selenide ($PtSe_2$) based FET is about ~1.7 $cm^2$/V s.

Figure 10C:
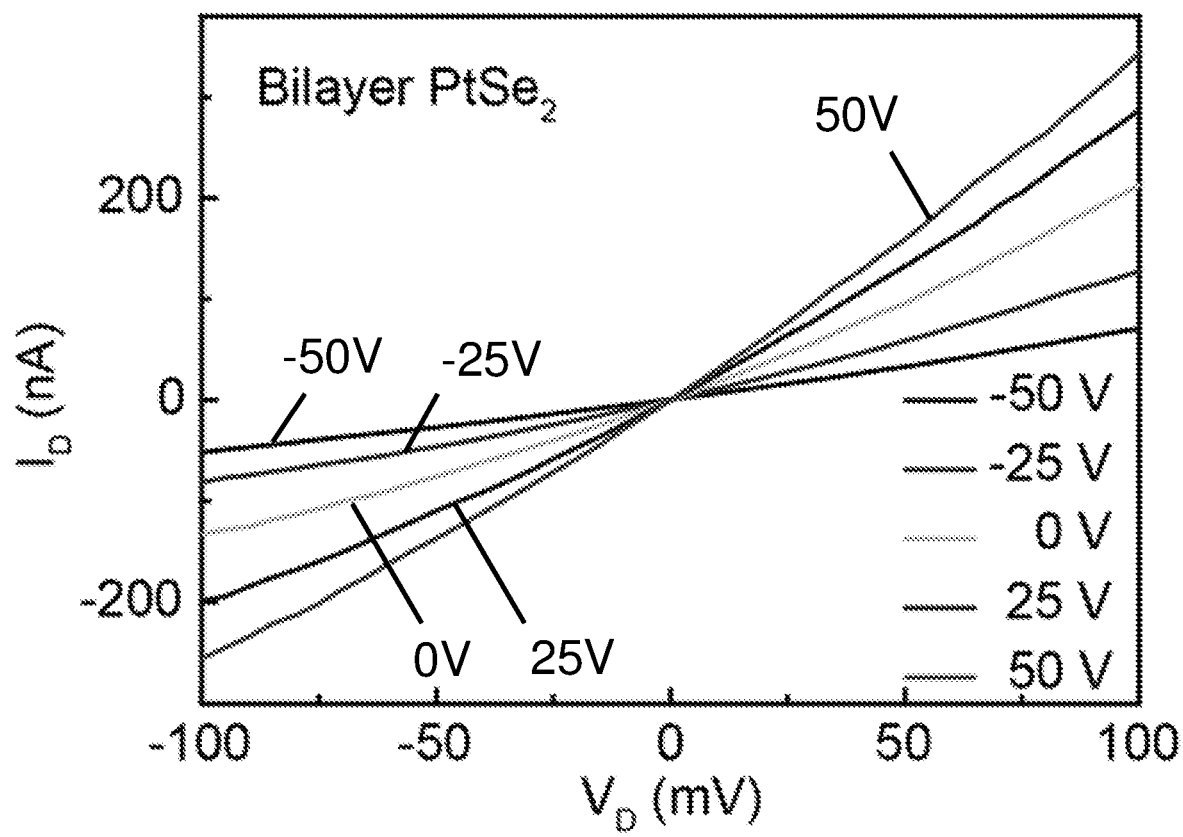
FIG. 10C is a plot of current (in nano-amperes or nA) as function of voltage (in millivolts or mV) showing the drain/channel current–drain voltage ($I_D$-$V_D$) curves of bilayer platinum selenide based field effect transistor (FE) according to various embodiments at different gate voltages.
Figure 10D:
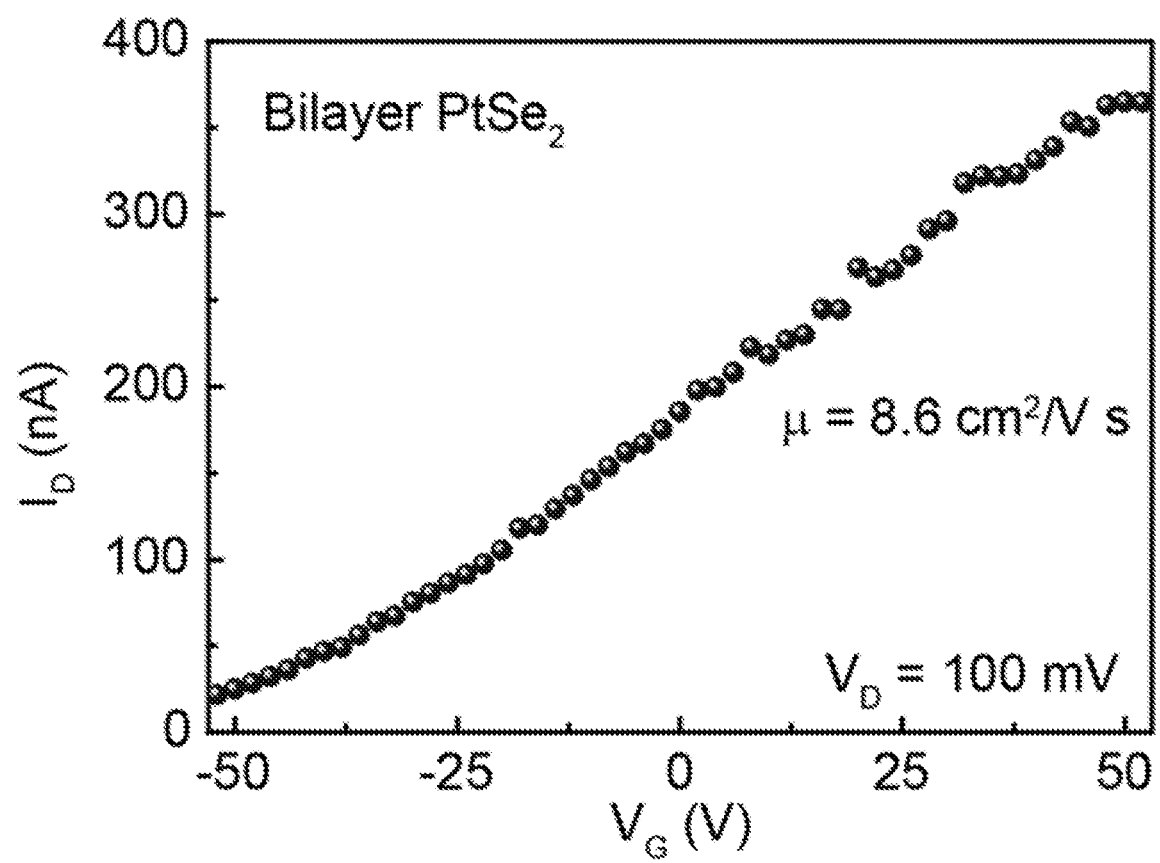
FIG. 10D is a plot of current (in nano-amperes or nA) as a function of voltage (in volts or V) showing the drain/channel current–gate voltage ($I_D$-$V_G$) curve of bilayer platinum selenide based field effect transistor (FET) according to various embodiments.

FIG. 10C is a plot of current (in nano-amperes or nA) as a function of voltage (in millivolts or mV) showing the drain/channel current–drain voltage ($I_D$–$V_D$) curves of bilayer platinum selenide based field effect transistor (FET) according to various embodiments at different gate voltages. FIG. 10D is a plot of current (in nano-amperes or nA) as a function of voltage (in volts or V) showing the drain/channel current–gate voltage ($I_D$–$V_G$) curve of bilayer platinum selenide based field effect transistor (FET) according to various embodiments. Bilayer platinum selenide shows semiconducting behavior, and the calculated carrier mobility of bilayer platinum selenide based FET is about ~8.6 $cm^2$/V s. The carrier mobility of bilayer platinum selenide based FET may be much higher than monolayer platinum selenide based FET due to the reduction of substrate screening effects.

Figure 10E:
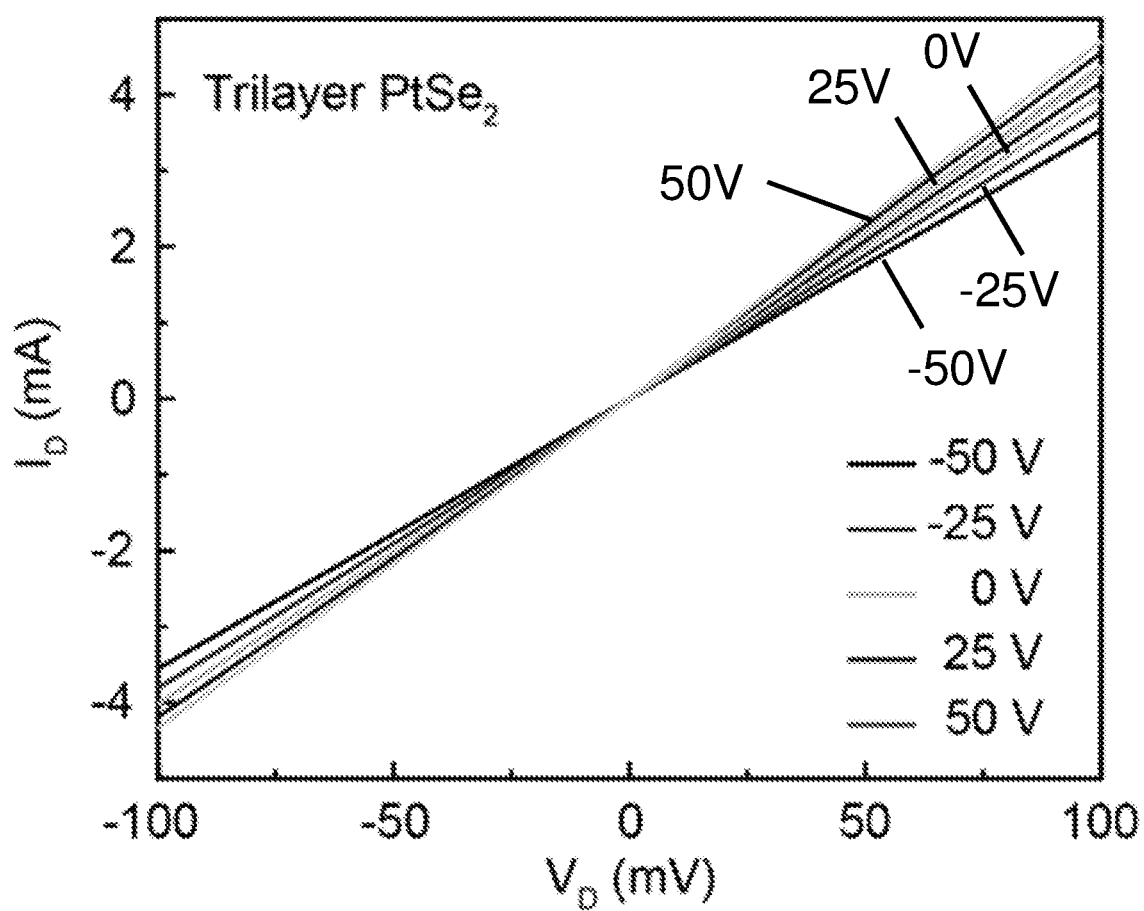
FIG. 10E is a plot of current (in nano-amperes or nA) as a function of voltage (in millivolts or mV) showing the drain/channel current–drain voltage ($I_D$-$V_D$) curves of trilayer platinum selenide based field effect transistor (FE) according to various embodiments at different gate voltages.
Figure 10F:
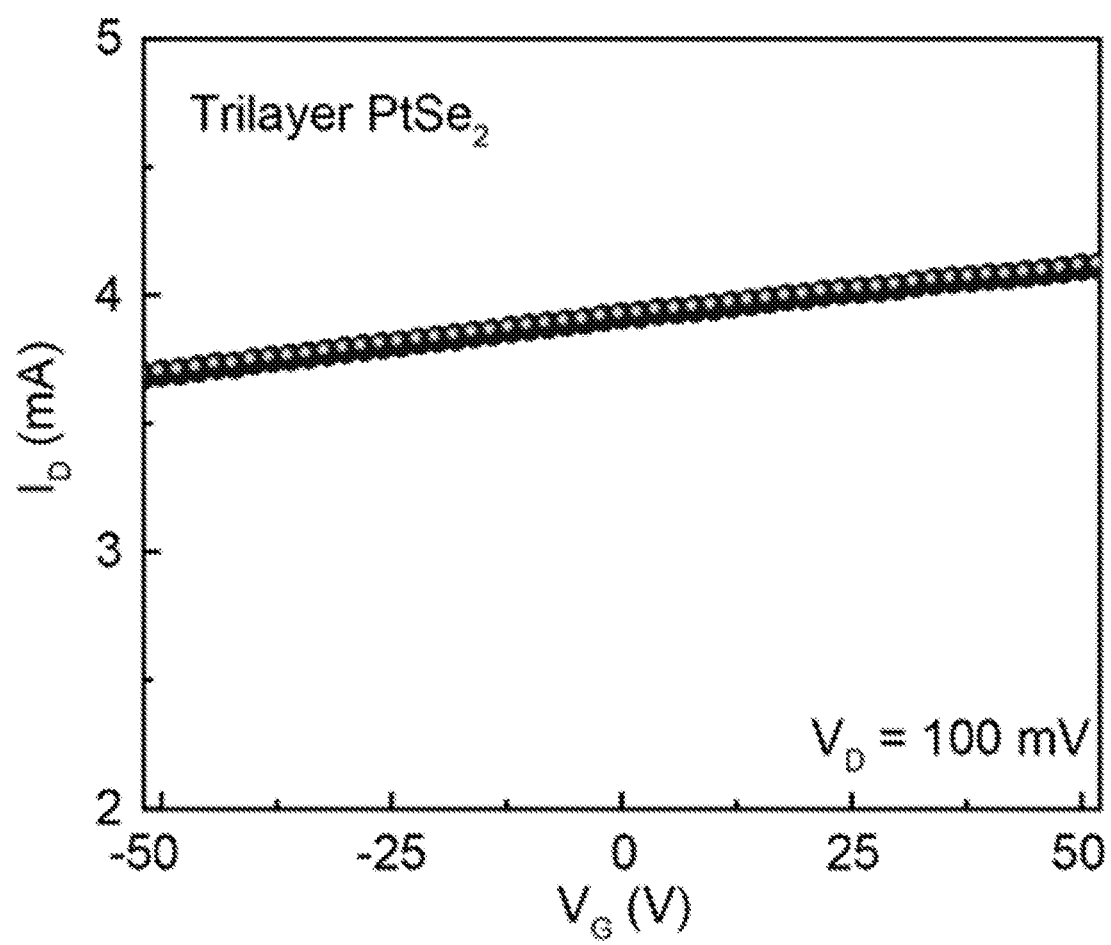
FIG. 10F is a plot of current (in nano-amperes or nA) as function of voltage (in volts or V) showing the drain/channel current–gate voltage ($I_D$-$V_G$) curve of trilayer platinum selenide based field effect transistor (FET) according to various embodiments.

FIG. 10E is a plot of current (in nano-amperes or nA) as a function of voltage (in millivolts or mV) showing the drain/channel current–drain voltage ($I_D$–$V_D$) curves of trilayer platinum selenide based field effect transistor (FET) according to various embodiments at different gate voltages. FIG. 10F is a plot of current (in nano-amperes or nA) as a function of voltage (in volts or V) showing the drain/channel current–gate voltage ($I_D$–$V_G$) curve of trilayer platinum selenide based field effect transistor (FET) according to various embodiments.

The electrical measurements indicate that trilayer platinum selenide may be metallic and may show negligible modulation by the gate voltage. Further, the metallic behavior of trilayer platinum selenide may indicate that it is unsuitable for use in photo-detection.

The metallic behavior of trilayer platinum selenide, as well as the semiconducting behavior of monolayer and bilayer platinum selenide may be consistent with theoretical predictions of epitaxy grown platinum selenide on platinum substrate. The measurements also show that monolayer and bilayer platinum selenide may exhibit n-type semiconducting behavior with an on/off ratio in the range of about 20 to about 50. The calculated carrier mobilities of monolayer and bilayer platinum selenide may be on par with previous reports on InSe, $In_2Se_3$ etc. The lower carrier mobility of monolayer platinum selenide relative to bilayer platinum selenide may be attributed to the surrounding conditions or the charge transfer from neighboring adsorbates and the substrate.

The photo-responsivity measurements may be performed in a digital deep level transient spectroscopy system (BIO-RAD) with visible, near-infrared and mid-infrared lasers. All samples used in the photo-responsivity measurements have dimensions of ~3.5 μm×10 μm.

Figure 11A:
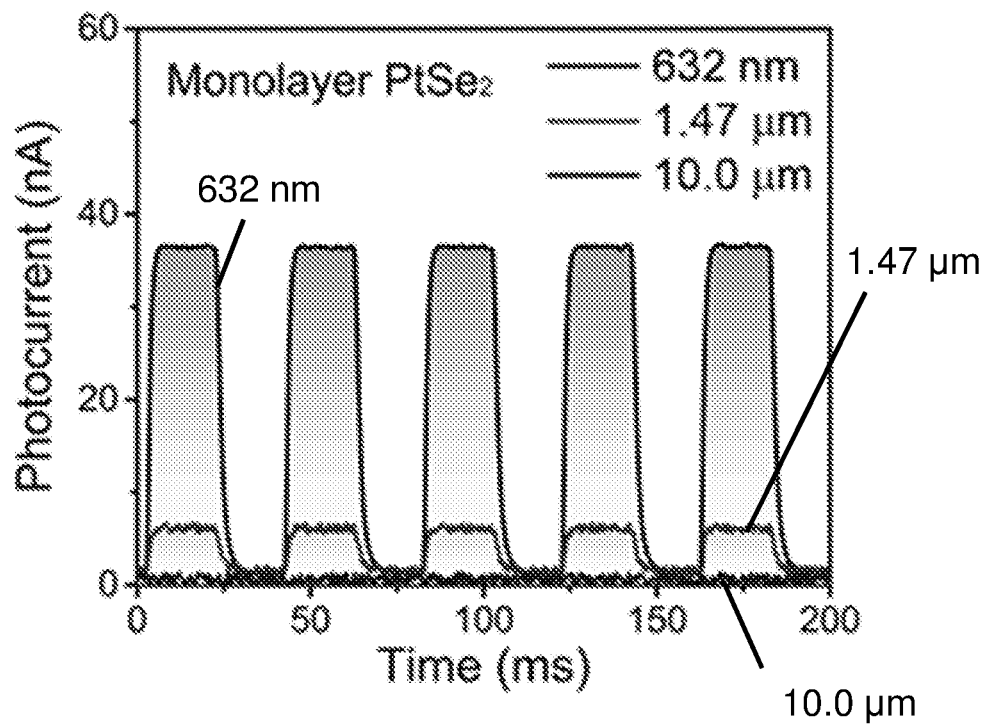
FIG. 11A is a plot of photocurrent (in nanoamperes or nA) as a function of time (in milliseconds or ms) showing the time-resolved photo-response of a monolayer platinum selenide based field effect transistor (FET) according to various embodiments with a biasing drain voltage of 0.1V and a gate voltage of 0 V under laser illumination with wavelengths of 632 nm, 1.47 µm, and 10 µm.
Figure 11B:
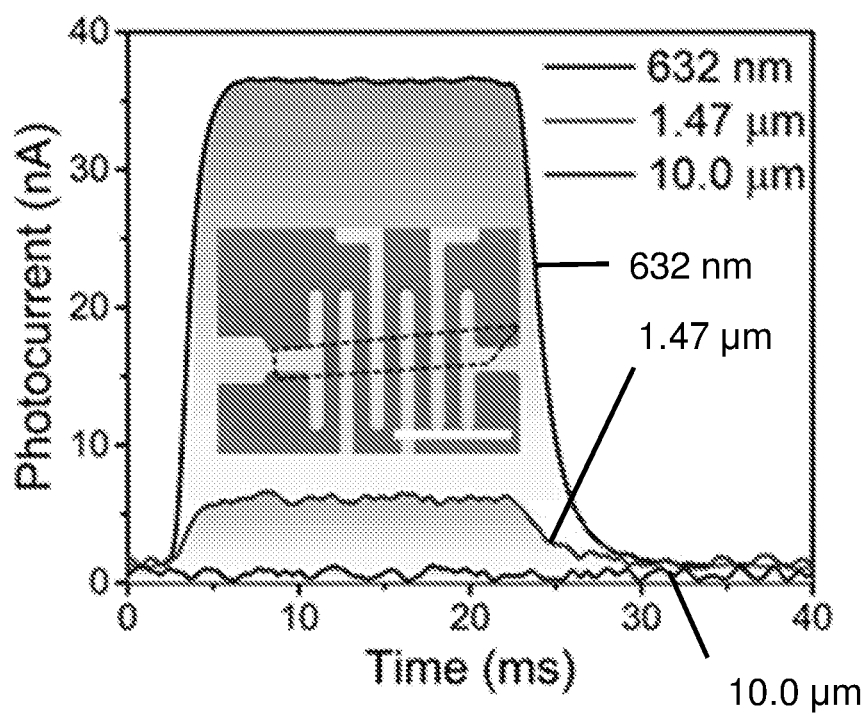
FIG. 11B is a plot of photocurrent (in nanoamperes or nA) as a function of time (in milliseconds or ms) showing one period of the time-resolved photo-response of the time-resolved response of the monolayer platinum selenide based field effect transistor (FET) according to various embodiments shown in FIG. 11A.

FIG. 11A is a plot of photocurrent (in nanoamperes or nA) as a function of time (in milliseconds or ms) showing the time-resolved photo-response of a monolayer platinum selenide based field effect transistor (FET) according to various embodiments with a biasing drain voltage of 0.1V and a gate voltage of 0 V under laser illumination with wavelengths of 632 nm, 1.47 μm, and 10 μm. FIG. 11B is a plot of photocurrent (in nanoamperes or nA) as a function of time (in milliseconds or ms) showing one period of the time-resolved photo-response of the monolayer platinum selenide based field effect transistor (FET) according to various embodiments shown in FIG. 11A. The inset of FIG. 11B shows a microscope image of the monolayer platinum selenide based field effect transistor (FET). The area highlighted with dashed lines represents the monolayer platinum selenide sample. The scale bar is 20 μm.

Figure 11C:
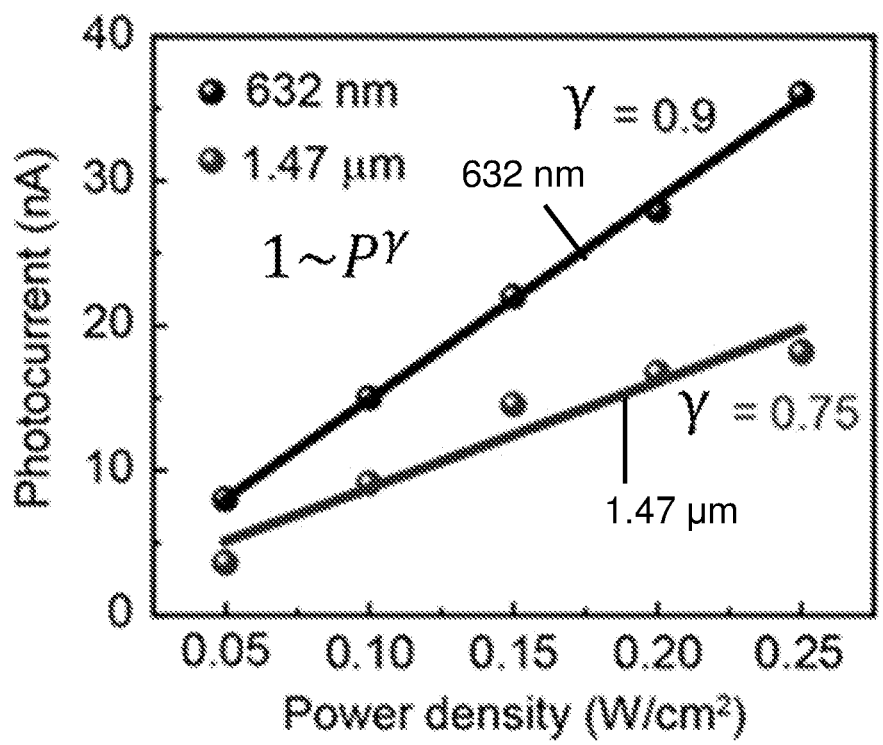
FIG. 11C is a plot of photocurrent (in nanoamperes or nA) as a function of power density (in watts per square centimeter or W/cm$^2$) showing the power dependence of the monolayer platinum selenide based field effect transistor (FET) according to various embodiments under laser illumination recorded at a drain voltage ($V_d$) of 0.1V.

FIG. 11C is a plot of photocurrent (in nanoamperes or nA) as a function of power density (in watts per square centimeter or W/$cm^2$) showing the power dependence of the monolayer platinum selenide based field effect transistor (FET) according to various embodiments under laser illumination recorded at a drain voltage ($V_d$) of 0.1V.

As discussed above, monolayer platinum selenide may be a semiconductor with an indirect bandgap of ~1.2 eV, which may be suitable for photo detection in the visible and near-infrared region.

The photocurrent ($I_{ph}$) is defined as:

$$I_{ph} = I_{illum} - I_{dark} \qquad (3)$$

where $I_{dark}$ is the dark current and $I_{illum}$ is the current measured.

As shown in FIG. 11B, the photocurrent is about 36 nA for 632 nm illumination and about 6 nA for 1.47 μm illumination. The measured photocurrents of 36 nA and 6 nA correspond to photo-responses of 1.8 A/W and 0.3 mA/W respectively. No photo-response is observed in the monolayer platinum selenide based field effect transistor (FET) under a mid-infrared laser illumination with wavelength of 10 μm. This may be expected since the bandgap is about 1.2 eV which far exceeds the photon energy of the laser.

Figure 11D:
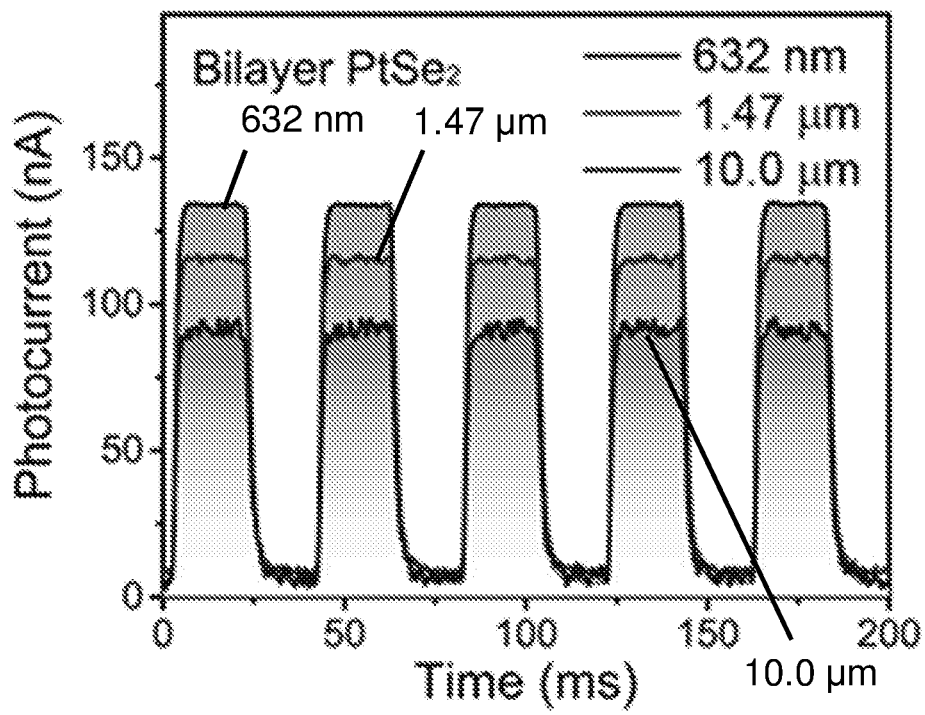
FIG. 11D is a plot of photocurrent (in nanoamperes or nA) as a function of time (in milliseconds or ms) showing the time-resolved photo-response of a bilayer platinum selenide based field effect transistor (FET) according to various embodiments with a biasing drain voltage of 0.1V and a gate voltage of 0 V under laser illumination with wavelengths of 632 nm, 1.47 µm, and 10 µm.
Figure 11E:
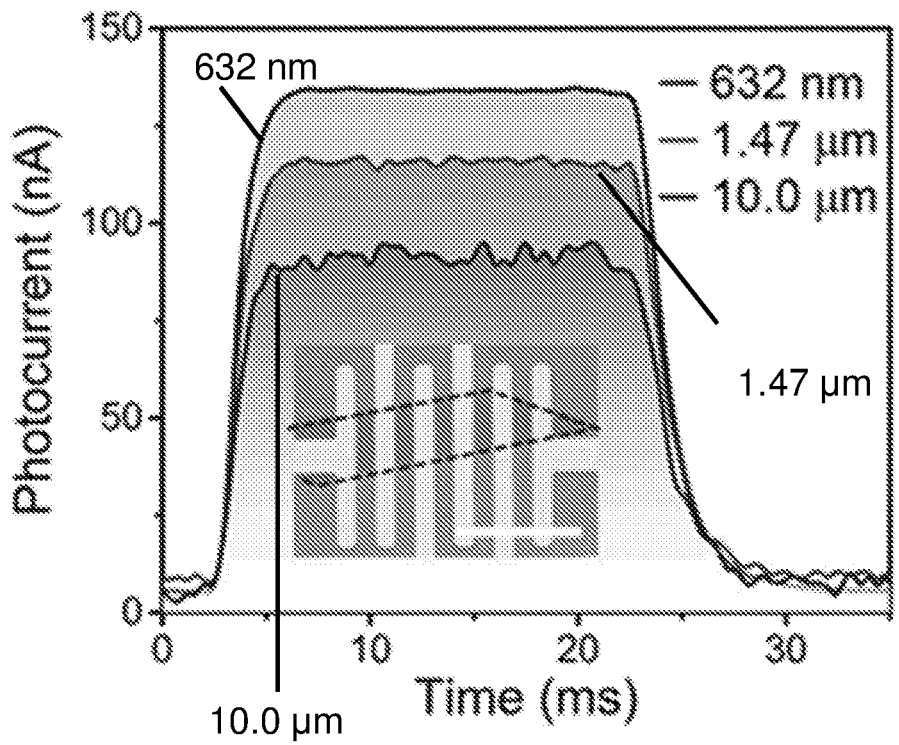
FIG. 11E is a plot of photocurrent (in nanoamperes or nA) as a function of time (in milliseconds or ms) showing one period of the time-resolved photo-response of the time-resolved response of the monolayer platinum selenide based field effect transistor (FET) according to various embodiments shown in FIG. 11D.

FIG. 11D is a plot of photocurrent (in nanoamperes or nA) as a function of time (in milliseconds or ms) showing the time-resolved photo-response of a bilayer platinum selenide based field effect transistor (FET) according to various embodiments with a biasing drain voltage of 0.1V and a gate voltage of 0 V under laser illumination with wavelengths of 632 nm, 1.47 and 10 μm. FIG. 11E is a plot of photocurrent (in nanoamperes or nA) as a function of time (in milliseconds or ms) showing one period of the time-resolved photo-response of the monolayer platinum selenide based field effect transistor (FET) according to various embodiments shown in FIG. 11D. The inset of FIG. 11E shows a microscope image of the bilayer platinum selenide based field effect transistor (FET). The area highlighted with dashed lines represents the bilayer platinum selenide sample. The scale bar is 20 μm.

Figure 11F:
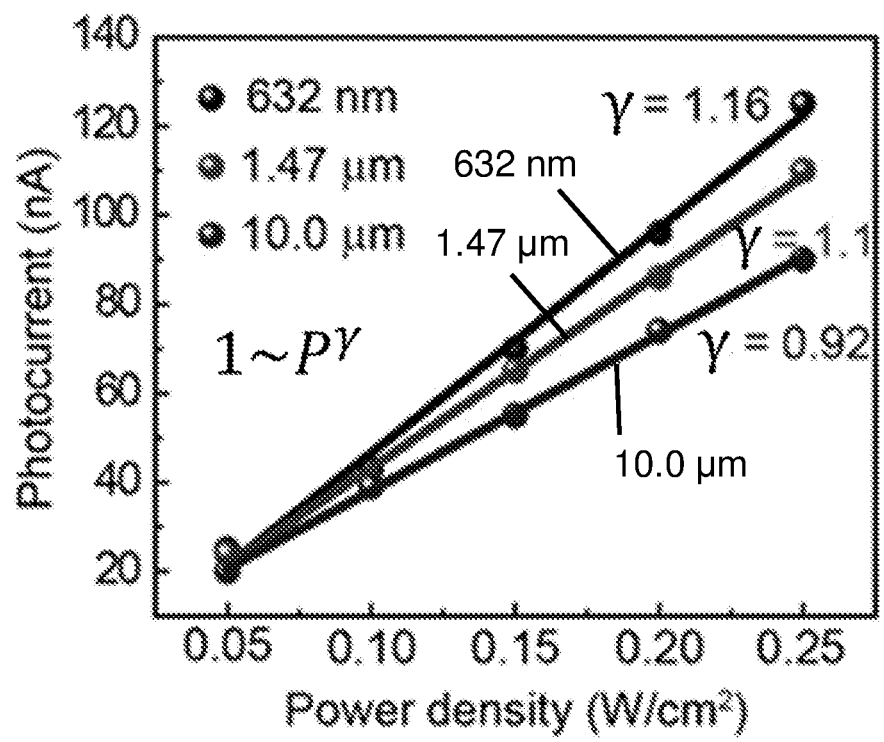
FIG. 11F is a plot of photocurrent (in nanoamperes or nA) as a function of power density (in watts per square centimeter or W/cm$^2$) showing the power dependence of the bilayer platinum selenide based field effect transistor (FET) according to various embodiments under laser illumination recorded at a drain voltage ($V_d$) of 0.1V.

FIG. 11F is a plot of photocurrent (in nanoamperes or nA) as a function of power density (in watts per square centimeter or W/cm$^2$) showing the power dependence of the bilayer platinum selenide based field effect transistor (FET) according to various embodiments under laser illumination recorded at a drain voltage ($V_d$) of 0.1V.

The power density of all laser illuminations is kept at about 0.25 W/cm$^2$ for time-resolved measurements shown in FIGS. 11A-B, D-E.

The bilayer platinum selenide based FET may exhibit a much stronger or higher photo-response compared with the monolayer platinum selenide based FET. For instance, the photo-responsivities (R) in the visible and near infrared may be about 6.25 A/W and 5.5 A/W respectively. A strong photo response may be observed in the mid-infrared (λ=10 μm) as shown in FIG. 11D. The photo responsivity in the mid infrared may be about 4.5 A/W.

FIG. 11G is a table 1100 comparing the various parameters of a bilayer platinum selenide (PtSe$_2$) based photodetector according to various embodiments with a mercury cadmium telluride (HgCdTe) based photodetector, and a commercial quantum well indium phosphide (QWIP) based photodetector. The photo-response of bilayer PtSe$_2$ may be about three orders higher than that of common graphene photodetectors and on a par with that of mercury cadmium telluride (HgCdTe) photodetectors and quantum well indium phosphide (QWIP) detectors as shown in FIG. 11G.

Furthermore, the decay time can be fitted by the following equations:

$$I_{rise} = I_0 - A exp\left(-\frac{t-t_1}{\tau_1}\right) \quad (4)$$

$$I_{decay} = I_0 + B exp\left(-\frac{t-t_2}{\tau_2}\right) \quad (5)$$

wherein τ is the time constant, and t is the time when laser is switched on or off. A and B are scaling constants. $I_0$ is the initial current.

The fitted characteristic photo-response time constant $\tau_7$ is 1.2±0.1 ms for rise time, and time constant $\tau_2$, is 1.2±0.1 ms for fall time. The time constants are better than those of other types of 2D semiconducting photodetectors such as MoS$_2$ based photodetectors and black phosphorene based photodetectors.

The rise time and fall time may also be based on the time period between the 10% and 90% of the current in the rising curve and falling curve respectively. The rising curves and falling curves of the monolayer and bilayer based field effect transistors are shown in FIG. 11B and FIG. 11E respectively. The rise time ($\tau_1$=1.1 ms) and fall time ($\tau_2$=1.2 ms) calculated are consistent with the former fitted values.

The detectivity (D) of a photodetector may be a measure of the sensitivity of the detector. Assuming that the shot noise from dark current and environment is the dominant contribution to the intrinsic noise, the detectivity D can be calculated by:

$$D = R\sqrt{A}/\sqrt{2eI_D} \quad (6)$$

wherein R is the photo-responsivity, A is the area of the detector, $I_D$ is the dark current as shown in FIGS. 11B and 11E, and e is the electronic charge. The detectivity may be calculated to be ~4×10$^9$ Jones, and may be on a par with that of commercial mid-infrared photodetectors and may be much higher than that of graphene based mid-infrared photodetectors (as graphene is gapless).

Further, as shown in FIGS. 11C and 11F, the photo-response may be expressed by a power law:

$$I_{PC} = CP^\gamma \quad (7)$$

wherein C is a constant and P is the illumination power. For monolayer PtSe$_2$ based FET, γ is 0.90 for a laser at an operating wavelength of 632 nm, and γ is 0.75 for a laser at an operating wavelength of 1.47 μm, highlighting that the recombination kinetics of photo-carriers involve both traps/defects states and photo-generated carrier interactions.

For bilayer platinum selenide FET, the values of γ are 1.16, 1.1 and 0.92 for 632 nm, 1.47 μm and 10 μm respectively. The relatively higher values for bilayer platinum selenide FET samples may be attributed to less trapping and substrate effects compared to monolayer samples. Further investigations may be required to interpret the complex carrier recombination and scattering processes of the photo-generated electron/hole pairs. Furthermore, the increase of the photocurrent with the incident laser power, as shown in FIGS. 11C, 11F may also clearly indicate the increase of the number of photo-generated carriers with the increase of the incident laser power.

It is also noted that the response speeds of the bilayer platinum selenide FET may be quite fast, e.g. in the range of milliseconds, as compared to the previously reported results of graphene nanostructured photodetectors and 2D semiconducting photodetectors. However, the mid-infrared photo-detection performance may be further improved by dielectric engineering and surface engineering strategies. For example, the mobility of the platinum selenide FET may be enhanced in the high-dielectric environment due to the reduction of Coulomb interactions among the carriers in the channel. On the other hand, the slow response speed may also be attributed to the trapping states, which may be modified by surface engineering methods, such as chemical treatment and/or trapping molecular/film decorations.

Various embodiments may show great potential in other mid-infrared photonic applications or devices such as mid-infrared modulators, light harvesters, and so on. Besides PtSe$_2$, other noble metal dichalcogenides such as PtS$_2$, PdS$_2$, PdSe$_2$ etc. may be also promising for mid-infrared photonic/optoelectronic devices.

Figure 12A:
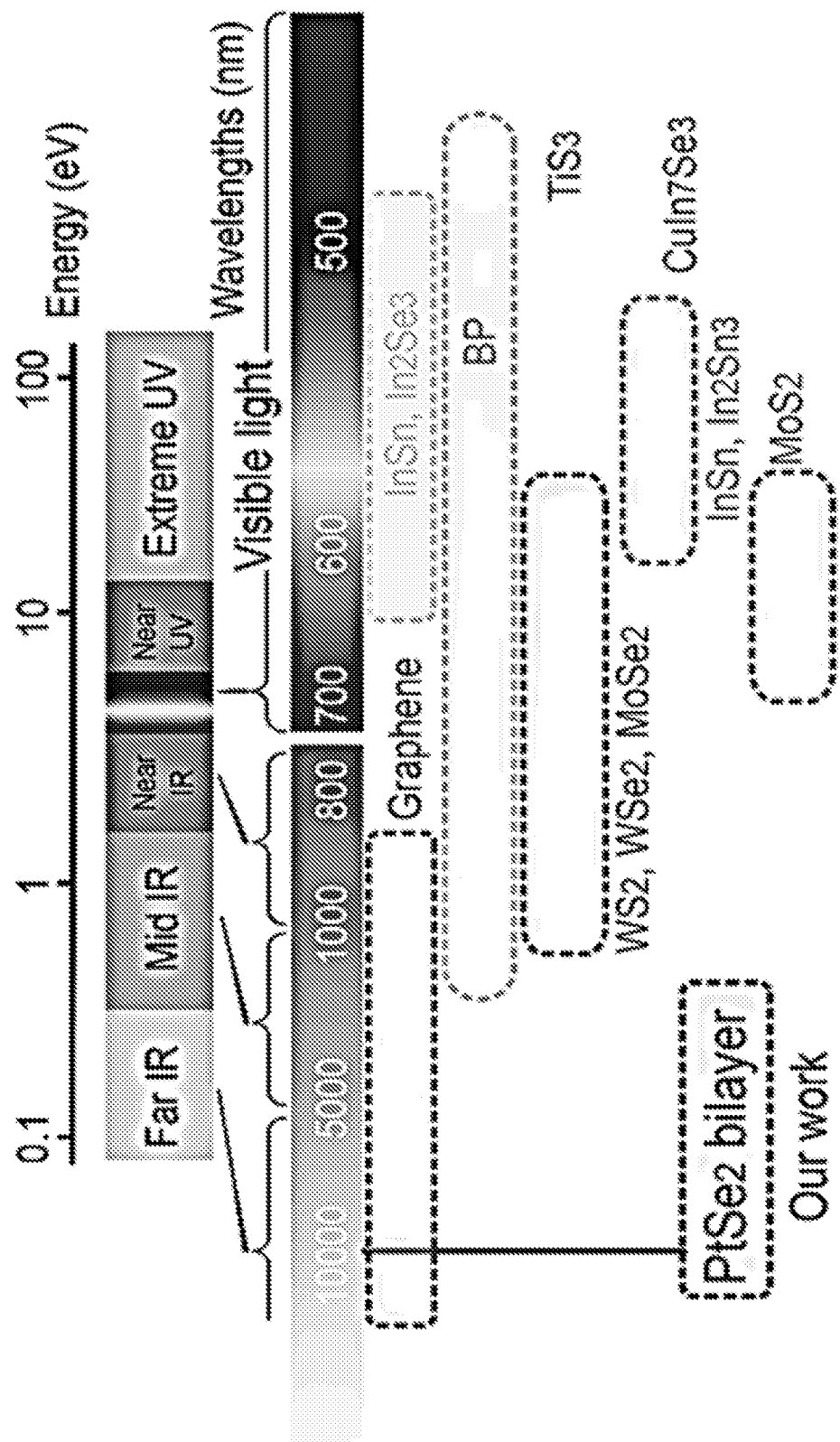
FIG. 12A is a schematic showing the different photodetectors that operate at different wavelengths, including bilayer platinum selenide based photodetectors according to various embodiments.

FIG. 12A is a schematic showing the different photodetectors that operate at different wavelengths, including bilayer platinum selenide based photodetectors according to various embodiments. The photodetectors may be based on 2D materials such as graphene, MoS$_2$, black phosphorene, WS$_2$, WSe$_2$, MoSe$_2$, SnSe$_2$, SnS$_2$, InSe, In$_2$Se$_3$, TiS$_3$ and CuIn$_7$Se$_{11}$. It can be seen that the mid-infrared range is rarely explored besides graphene. Mid-infrared detection using 2D materials may be challenging due to the lack of suitable candidates besides graphene sheets and graphene nanostructures.

Various embodiments may relate to use of atomic layered PtSe$_2$ as a high performance mid-infrared photodetector that may be operated at room temperature. The high and broadband photo-response of bilayer platinum selenide based FET may be attributed to the decrease in bandgap due to defects.

Figure 12B:
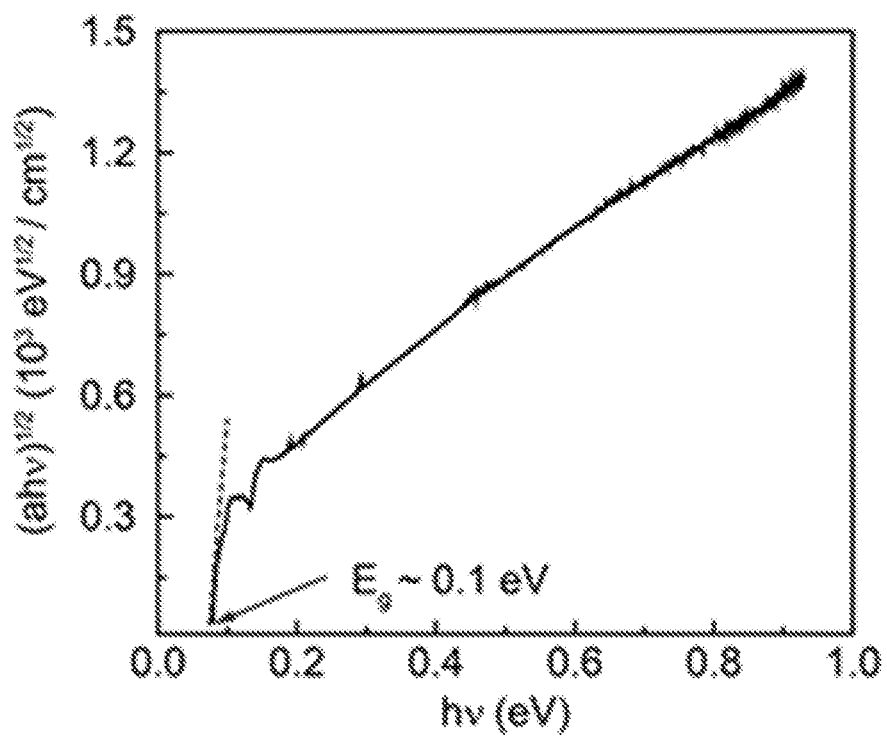
FIG. 12B is a Tauc plot of the exfoliated bilayer platinum selenide samples according to various embodiments.

Experiments have been carried out to study the optical properties and bandgap of the fabricated sample. Exfoliated bilayer platinum selenide flakes (Sample #1) may be transferred to a calcium fluoride (CaF$_2$) substrate and the absorption spectrum of the PtSe$_2$ flakes may be obtained. FIG. 12B is a Tauc plot of the exfoliated bilayer platinum selenide samples according to various embodiments. α is the absorption coefficient of the material, h is the Planck constant, and v is the frequency. FIG. 12B shows that defect engineered platinum selenide may have a cut-off wavelength of ~0.1 eV.

Figure 12C:
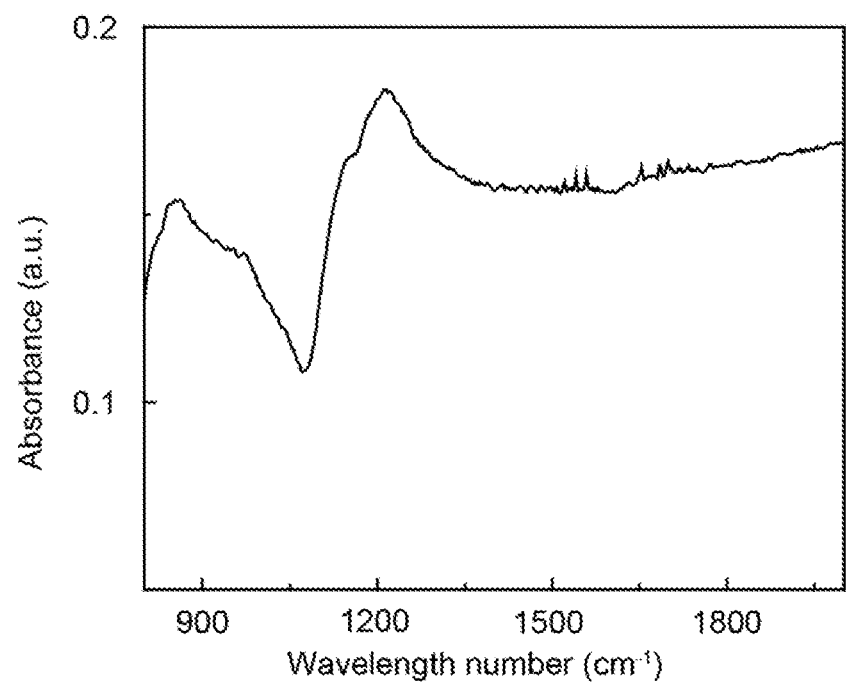
FIG. 12C is a plot of absorbance (in arbitrary units or a.u.) as a function of wavelength number (in per centimeter or cm$^{-1}$) showing the absorption spectrum of bilayer platinum selenide according to various embodiments on a calcium fluoride (CaF$_2$) substrate.

FIG. 12C is a plot of absorbance (in arbitrary units or a.u.) as a function of wavelength number (in per centimeter or $cm^{-1}$) showing the absorption spectrum of bilayer platinum selenide according to various embodiments on a calcium fluoride ($CaF_2$) substrate. The absorption peak near 1000 $cm^{-1}$ may correspond to the optical band gap of bilayer platinum selenide (~0.09 eV). 0.09 eV may correspond to the cut-off absorption wavelength near 12.4 μm. A sharp peak near 2500 $cm^{-1}$ (not shown in FIG. 12C) may be attributed to ambient effects in the measurement system.

Figure 12D:
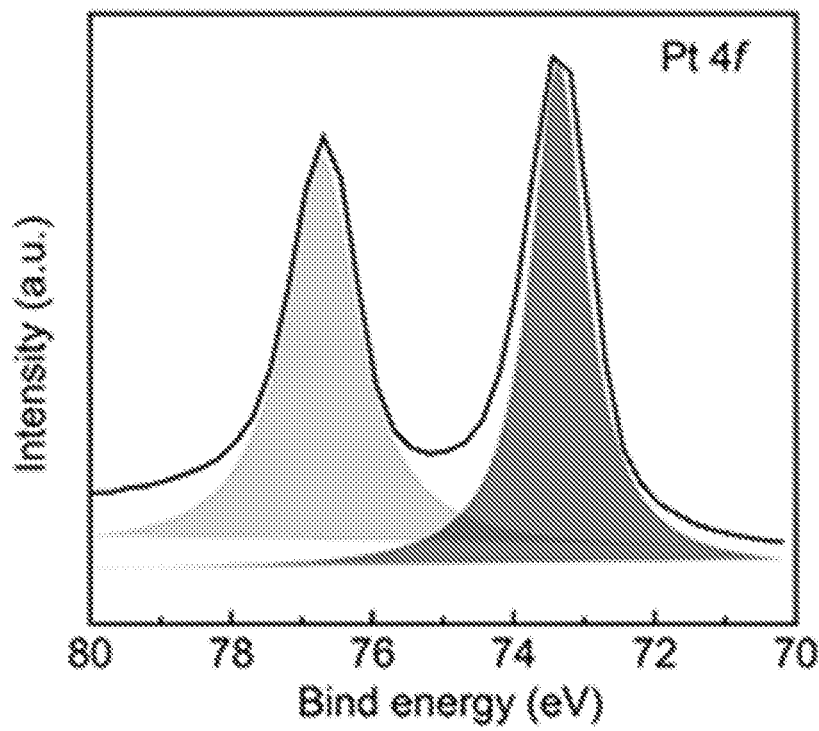
FIG. 12D is a plot of intensity (in arbitrary units or a.u.) as a function of binding energy (in electron volts or eV) showing X-ray photoelectron spectroscopy (XPS) spectrum of platinum (Pt) 4f core level peak in platinum selenide with selenium vacancies (sample #1) according to various embodiments.
Figure 12E:
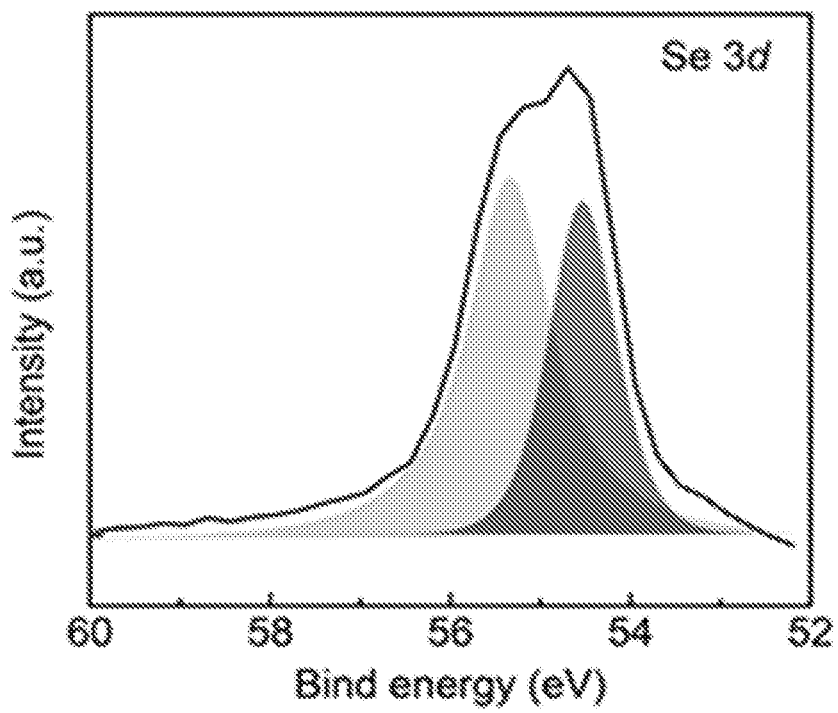
FIG. 12E is a plot of intensity (in arbitrary units or a.u.) as a function of binding energy (in electron volts or eV) showing X-ray photoelectron spectroscopy (XPS) spectrum of selenium (Se) 3d core level peak in platinum selenide with selenium vacancies (sample #1) according to various embodiments.

The quality and stoichiometric ratio between Pt to Se may be further monitored by X-ray photoelectron spectroscopy (XPS). FIG. 12D is a plot of intensity (in arbitrary units or a.u.) as a function of binding energy (in electron volts or eV) showing X-ray photoelectron spectroscopy (XPS) spectrum of platinum (Pt) 4f core level peak in platinum selenide with selenium vacancies (sample #1) according to various embodiments. FIG. 12E is a plot of intensity (in arbitrary units or a.u.) as a function of binding energy (in electron volts or eV) showing X-ray photoelectron spectroscopy (XPS) spectrum of selenium (Se) 3d core level peak in platinum selenide with selenium vacancies (sample #1) according to various embodiments.

The two dominant peaks in the Se 3d spectrum (55.40 eV and 54.50 eV) may exhibit the dominance of $Se^{2-}$ peaks and full crystallization of $PtSe_2$, which are slightly higher than the bonding energies of $Se^{2-}$ atoms and may be explained by the change in the chemical state of Se atoms in the presence of Se vacancies ($V_{Se}$). The atomic ratio may be calculated by semi-quantitative analysis through measuring the peak areas of Se and Pt core lines (I), and applying the appropriate atomic sensitivity factors of both elements (S) which are known as the relative sensitivity factors (RSF):

$$C_x = I_x S_x / \Sigma I_i S_i \qquad (8)$$

where $C_x$ is the atomic fraction of element x in the sample. From the calculations, an atomic ratio of Se:Pt of 64:36 may be obtained, which agrees well with the HRTEM images as shown in FIG. 8G.

In order to examine the role of defects in the electronic structure of platinum selenide, another sample with lower defect concentration may be fabricated (Sample #2) by decreasing the deposition temperature. The atomic ratio of Se:Pt in sample 2 may be estimated to be ~66.5/33.5. The defect concentration may be verified by XPS spectrum.

Figure 13A:
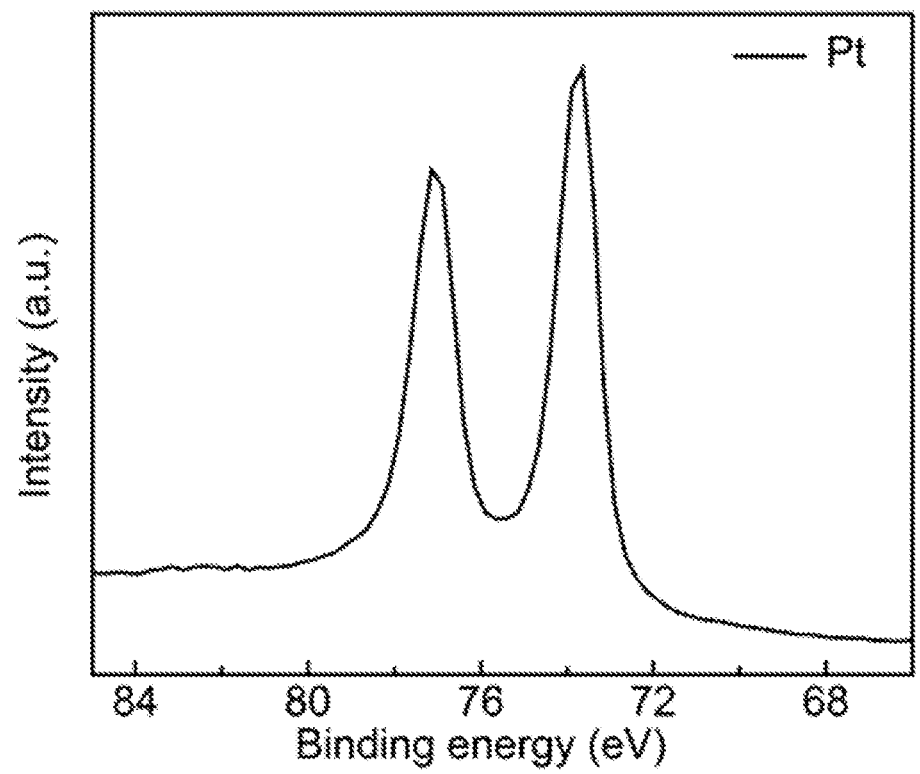
FIG. 13A is a plot of intensity (in arbitrary units or a.u.) as a function of binding energy (in electron volts or eV) showing X-ray photoelectron spectroscopy (XPS) spectrum of platinum (Pt) 4f core level peak in platinum selenide with selenium vacancies (sample #2) according to various embodiments.
Figure 13B:
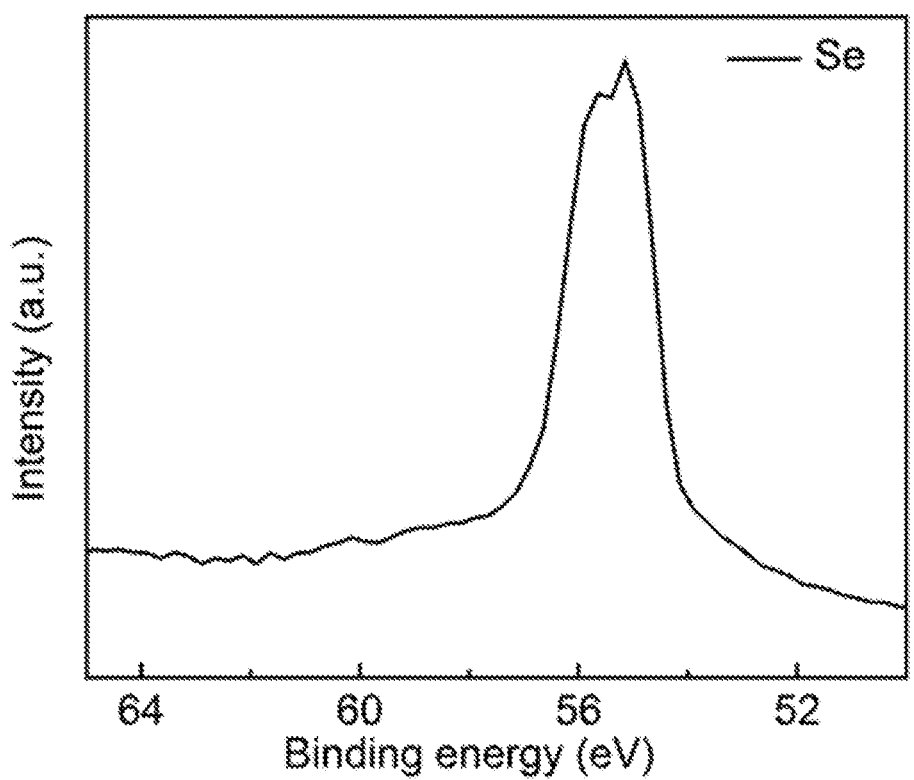
FIG. 13B is a plot of intensity (in arbitrary units or a.u.) as a function of binding energy (in electron volts or eV) showing X-ray photoelectron spectroscopy (XPS) spectrum of selenium (Se) 3d core level peak in platinum selenide with selenium vacancies (sample #2) according to various embodiments.

FIG. 13A is a plot of intensity (in arbitrary units or a.u.) as a function of binding energy (in electron volts or eV) showing X-ray photoelectron spectroscopy (XPS) spectrum of platinum (Pt) 4f core level peak in platinum selenide with selenium vacancies (sample #2) according to various embodiments. FIG. 13B is a plot of intensity (in arbitrary units or a.u.) as a function of binding energy (in electron volts or eV) showing X-ray photoelectron spectroscopy (XPS) spectrum of selenium (Se) 3d core level peak in platinum selenide with selenium vacancies (sample #2) according to various embodiments.

From the absorption spectrum, it is clearly shown that the light absorption cut-off of sample #2 is ~8 corresponding to a bandgap of ~0.155 eV. The above observations may demonstrate the importance of defect states in bilayer $PtSe_2$. Unlike most TMDCs where the bandgap is enlarged by the defect induced recombination/trapping centers, the bandgap of various embodiments may become narrower with the introduction of Se vacancies.

Figure 13C:
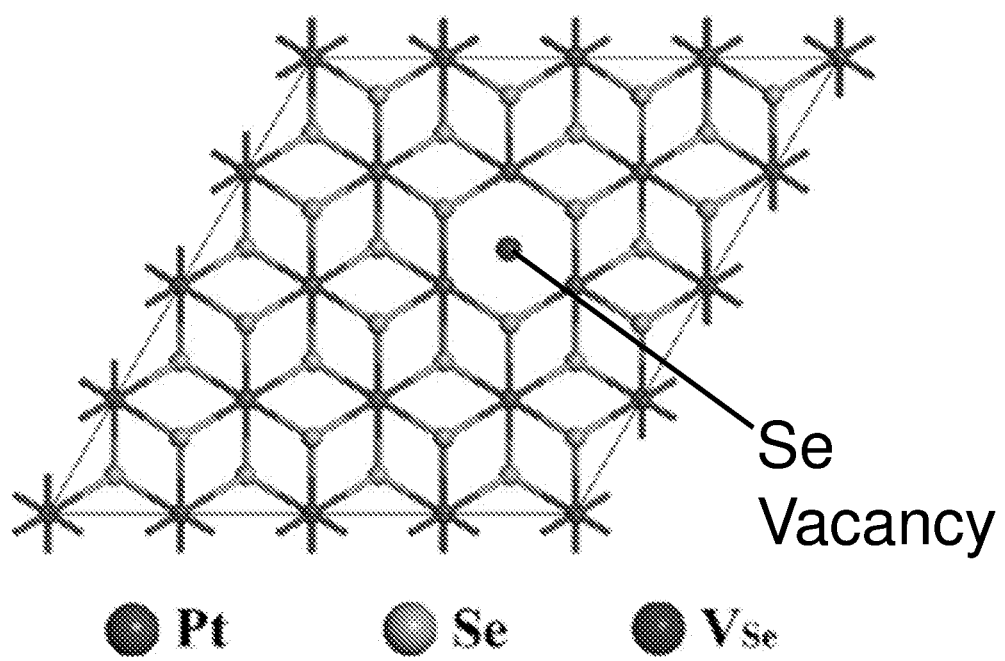
FIG. 13C illustrates a 4×4×1 supercell crystal structure of monolayer platinum selenide with a selenium (Se) vacancy according to various embodiments.

As a result, it may be important to investigate the defect states in narrow bandgap $PtSe_2$ atomic layers since it may further lead to operations involving longer wavelength operations. FIG. 13C illustrates a 4×4×1 supercell crystal structure of monolayer platinum selenide with a selenium (Se) vacancy according to various embodiments.

During the synthesis procedure, high temperatures exceeding the melting temperature of Pt may be required to break the Pt—Se bonds, which may cause formation of Se vacancies. After careful optimization of the growth conditions, a technique to control the defect concentration may be developed. The quality of a noble metal chalcogenide such as platinum selenide may be controlled by the evaporation temperature ($T_1$) and deposition temperature ($T_2$).

Alternatively, reduced selenium relative to platinum may be used as starting materials to increase the concentration of selenium vacancies. Single crystals of $PtSe_{1.8}$ may be prepared by a chemical vapor transport method as described herein, but with a starting ratio of Pt:Se:P:S of 1:1.8:1:3. Similarly, single crystals of $PtSe_{1.6}$ may be prepared with a starting ratio of Pt:Se:P:S of 1:1.6:1:3, and single crystals of $PtSe_{1.4}$ may be prepared with a starting ratio of Pt:Se:P:S of 1:1.4:1:3. The other reaction parameters (e.g. temperature, reaction time, pressure etc.) may be the same or similar to the parameters used to form $PtSe_2$, and as illustrated in FIGS. 4A, 6A.

In general, the stoichiometry of $PtSe_x$ may be controlled by varying the Se molar ratio. The value of x may be the same as the molar equivalents of Se used. For instance, if 1.6 equivalents of Se is used, x is 1.6 (i.e. $PtSe_{1.6}$); and if 1.8 equivalents of Se is used, x is 1.8 (i.e. $PtSe_{1.8}$). The smallest value of x may be 1.4.

The fabrication of other noble metal chalcogenide crystals may also be possible using similar methods.

The bandgap evolution of bilayer $PtSe_2$ with different concentrations of Se vacancies may be investigated using first-principles calculations.

Figure 13D:
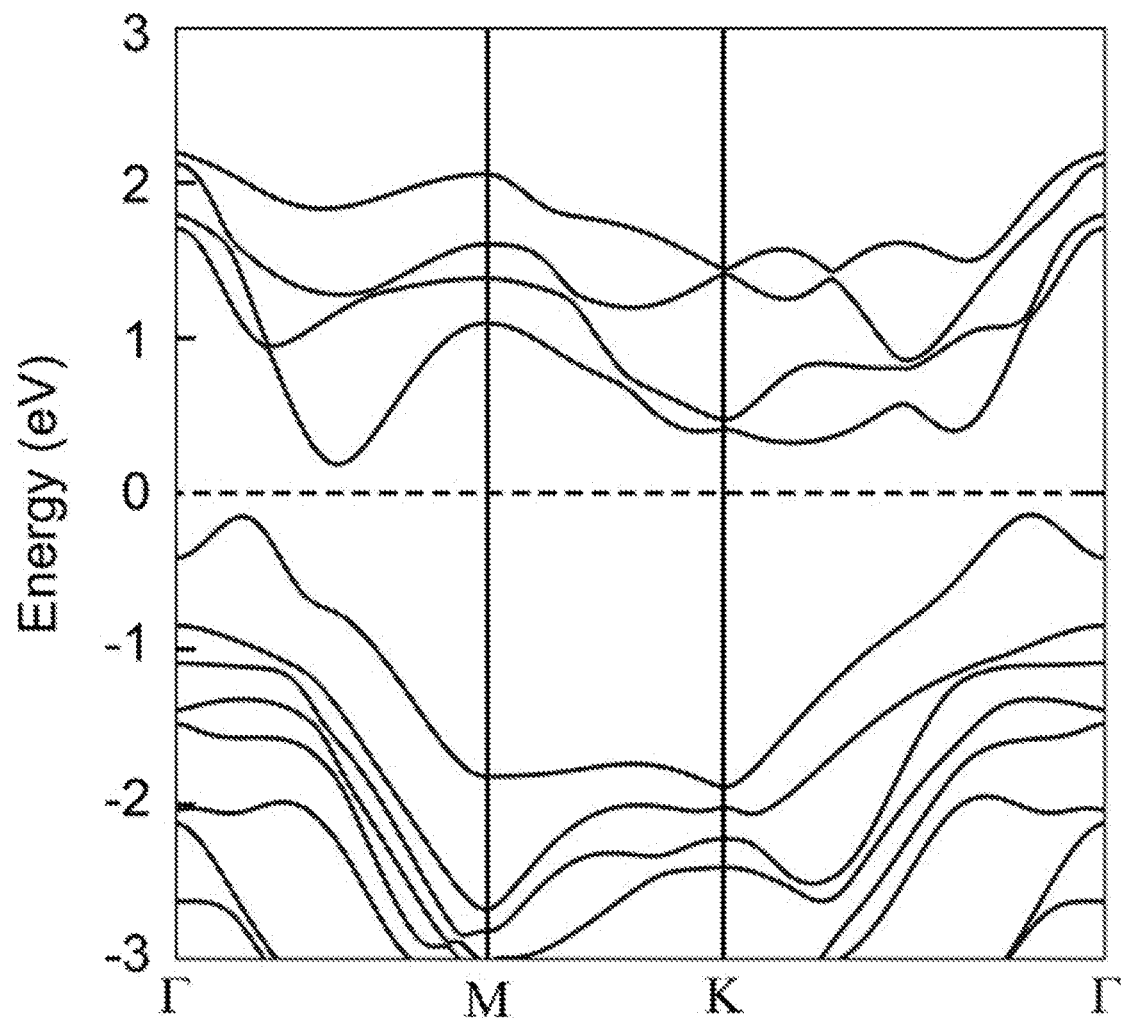
FIG. 13D is a plot of energy (in electron volts or eV) as a function of points showing the density of states (DOS) of a platinum selenide bilayer having a first concentration of selenium vacancies according to various embodiments.
Figure 13E:
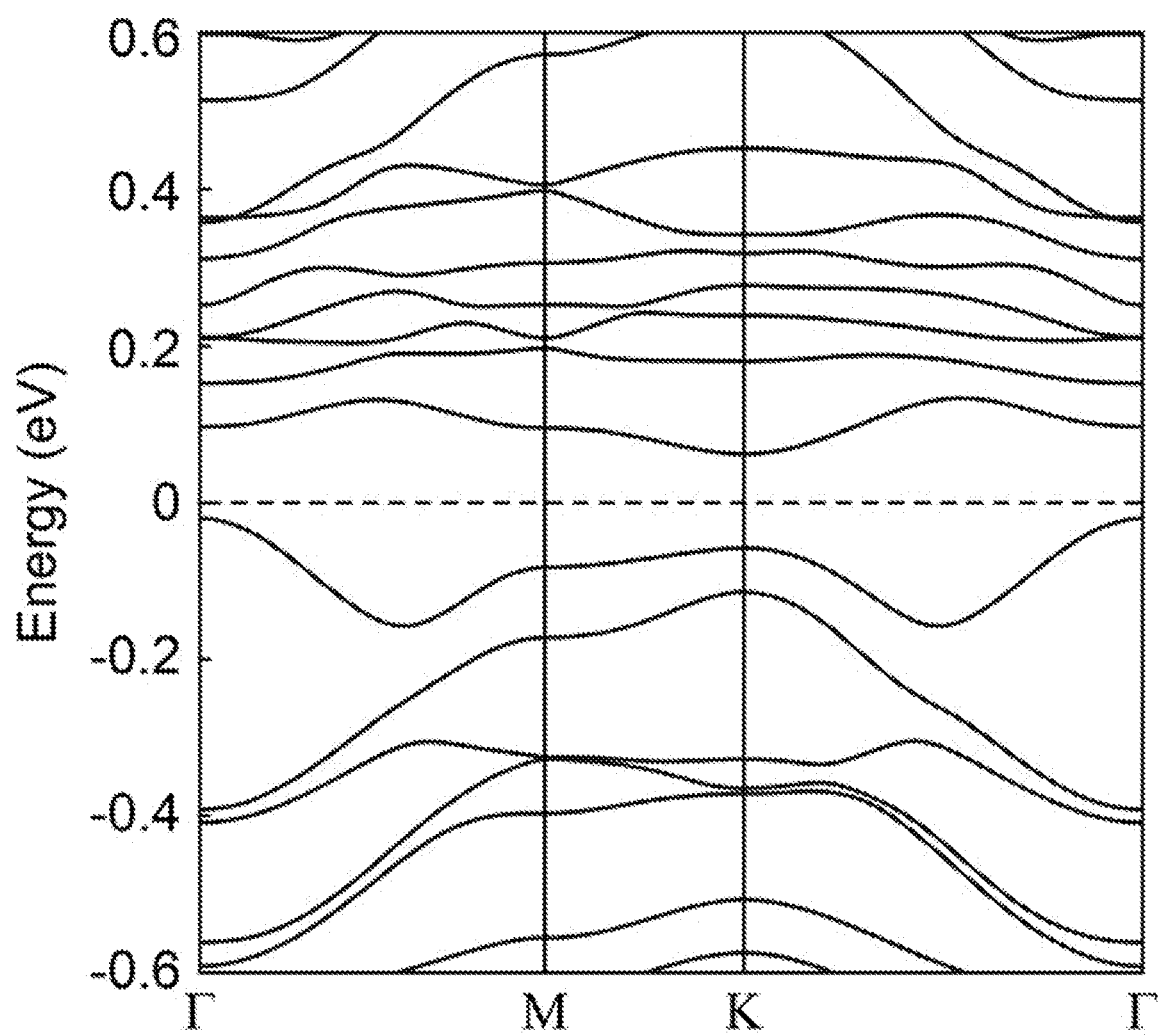
FIG. 13E is a plot of energy (in electron volts or eV) as a function of points showing the density of states (DOS) of the platinum selenide bilayer having a second concentration of selenium vacancies different from the first concentration according to various embodiments.

FIG. 13D is a plot of energy (in electron volts or eV) as a function of points showing the density of states (DOS) of a platinum selenide bilayer having a first concentration of selenium vacancies according to various embodiments. FIG. 13E is a plot of energy (in electron volts or eV) as a function of points showing the density of states (DOS) of the platinum selenide bilayer having a second concentration of selenium vacancies different from the first concentration according to various embodiments.

The valence band maximum in bilayer platinum selenide may be contributed mainly by 5d orbitals of Pt atoms that contain rich d-electrons. As a result, the interaction of the d band of Pt atom and the $p_z$ band of Se atom thermodynamically favors $sp^3d^2$ hybridization (1T phase), in which less d orbitals are involved and the bond between Pt and Se are weaker than these of group-5 or group-6 TMDCs (such as $MoS_2$, $WS_2$ with $spd^4$ hybridization in 2H phase).

From the density of states (DOS) of bilayer platinum selenide with defects, the mid-gap states due to Se vacancies may be in the vicinity of the Fermi level and may thus decrease the bandgap of bilayer platinum selenide.

The bandgap of intrinsic bilayer platinum selenide may be ~0.323 eV. However, the bandgap may decrease to 0.082 eV by introducing 6% Se vacancies, which is consistent with the first-principles calculations.

Figure 14A:
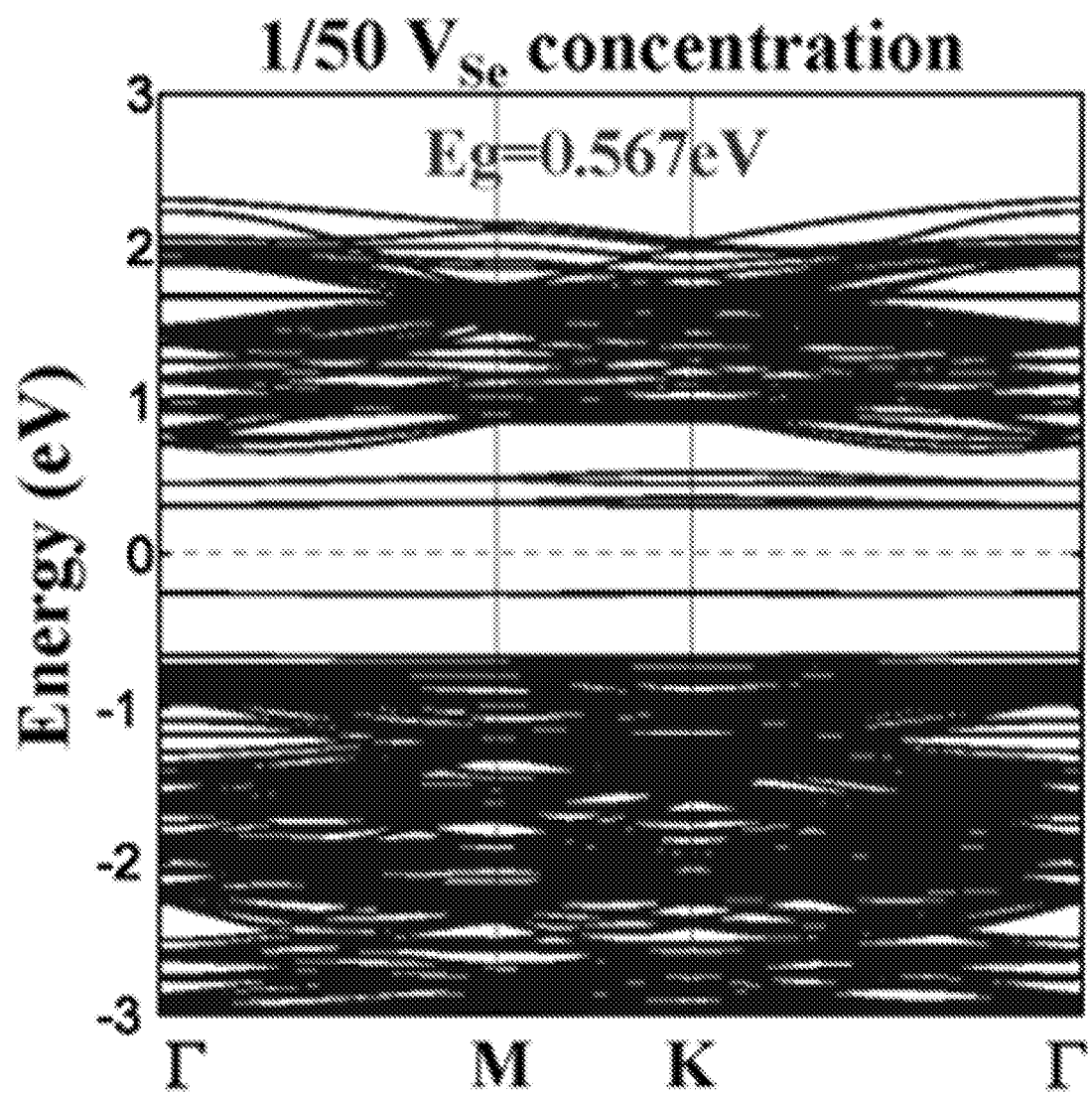
FIG. 14A is a plot of energy (in electron volts or eV) as a function of points showing the density of states (DOS) of a platinum selenide monolayer having a first concentration of selenium vacancies (1/50 selenium vacancies ($V_{Se}$) concentration) according to various embodiments.
Figure 14B:
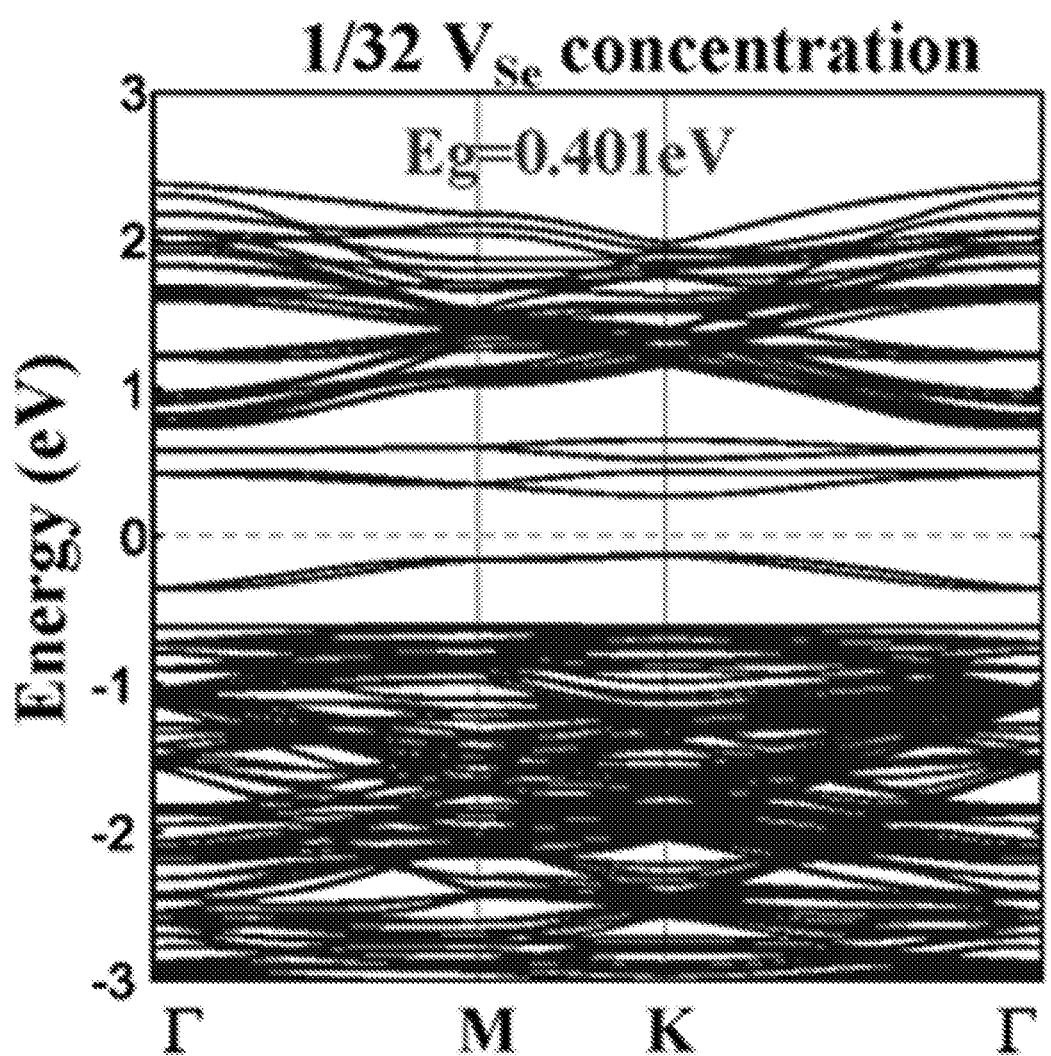
FIG. 14B is a plot of energy (in electron volts or eV) as a function of points showing the density of states (DOS) of a platinum selenide monolayer having a second concentration of selenium vacancies (1/32 selenium vacancies ($V_{Se}$) concentration) according to various embodiments.
Figure 14C:
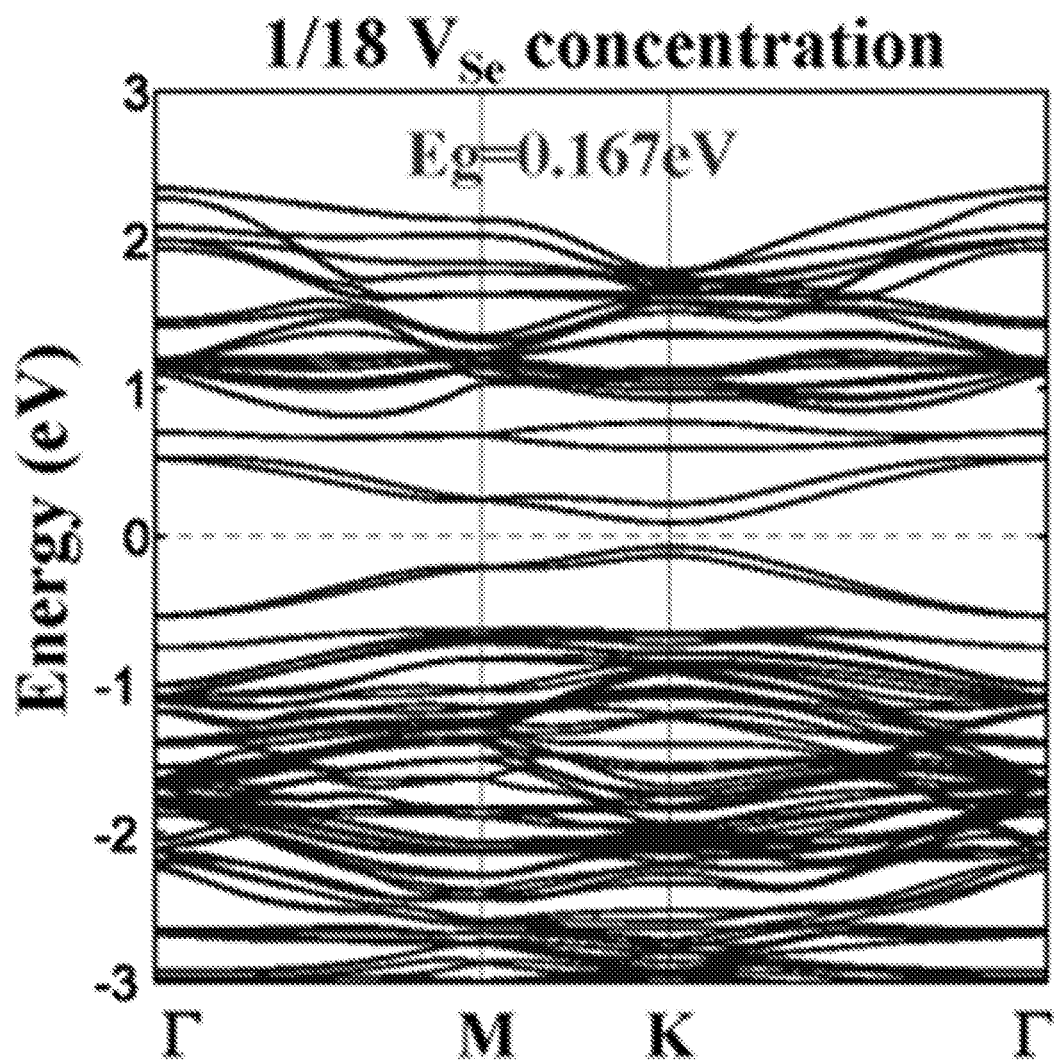
FIG. 14C is a plot of energy (in electron volts or eV) as a function of points showing the density of states (DOS) of a platinum selenide monolayer having a third concentration of selenium vacancies (1/18 selenium vacancies ($V_{Se}$) concentration) according to various embodiments.
Figure 14D:
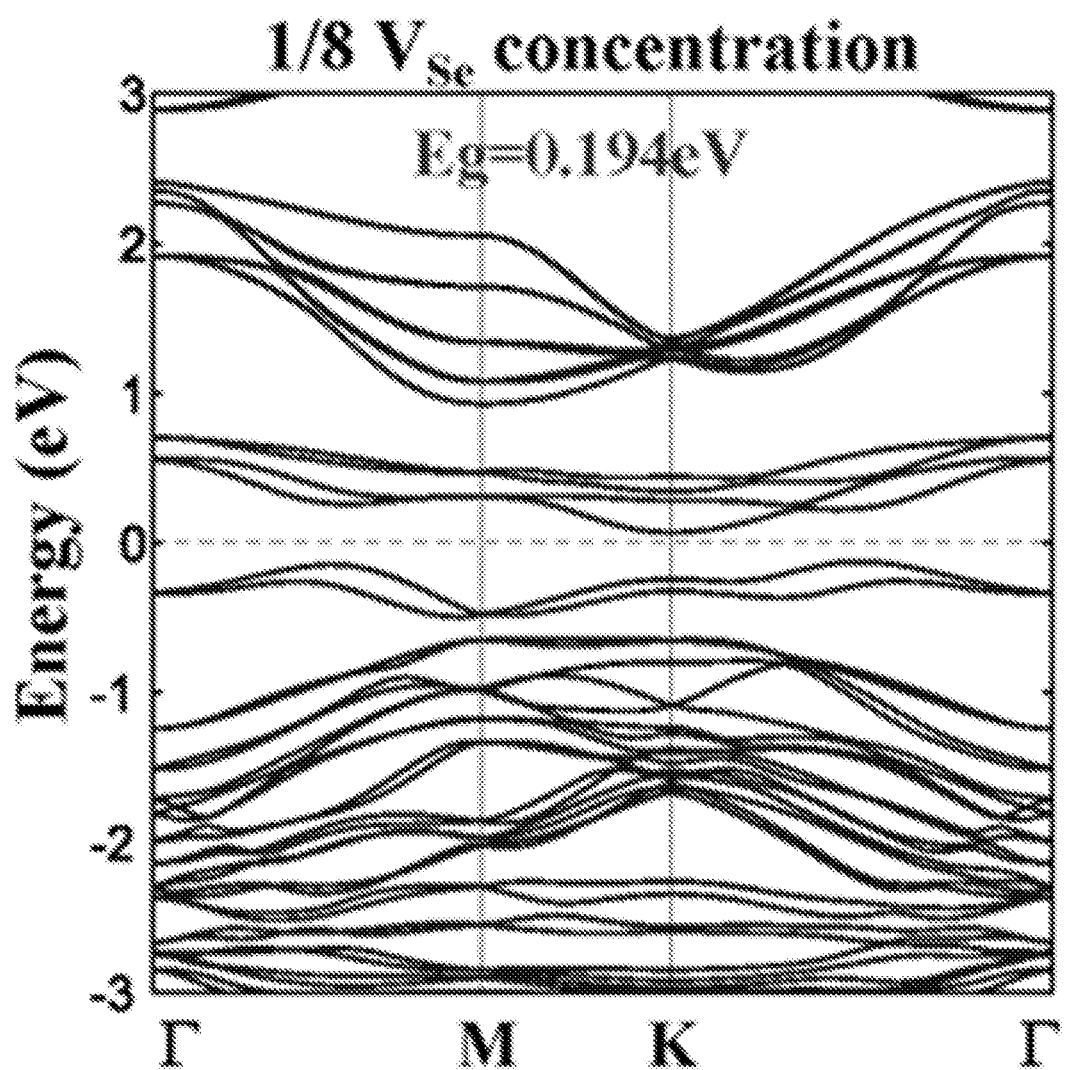
FIG. 14D is a plot of energy (in electron volts or eV) as a function of points showing the density of states (DOS) of a platinum selenide monolayer having a fourth concentration of selenium vacancies (1/8 selenium vacancies ($V_{Se}$) concentration) according to various embodiments.
Figure 14E:
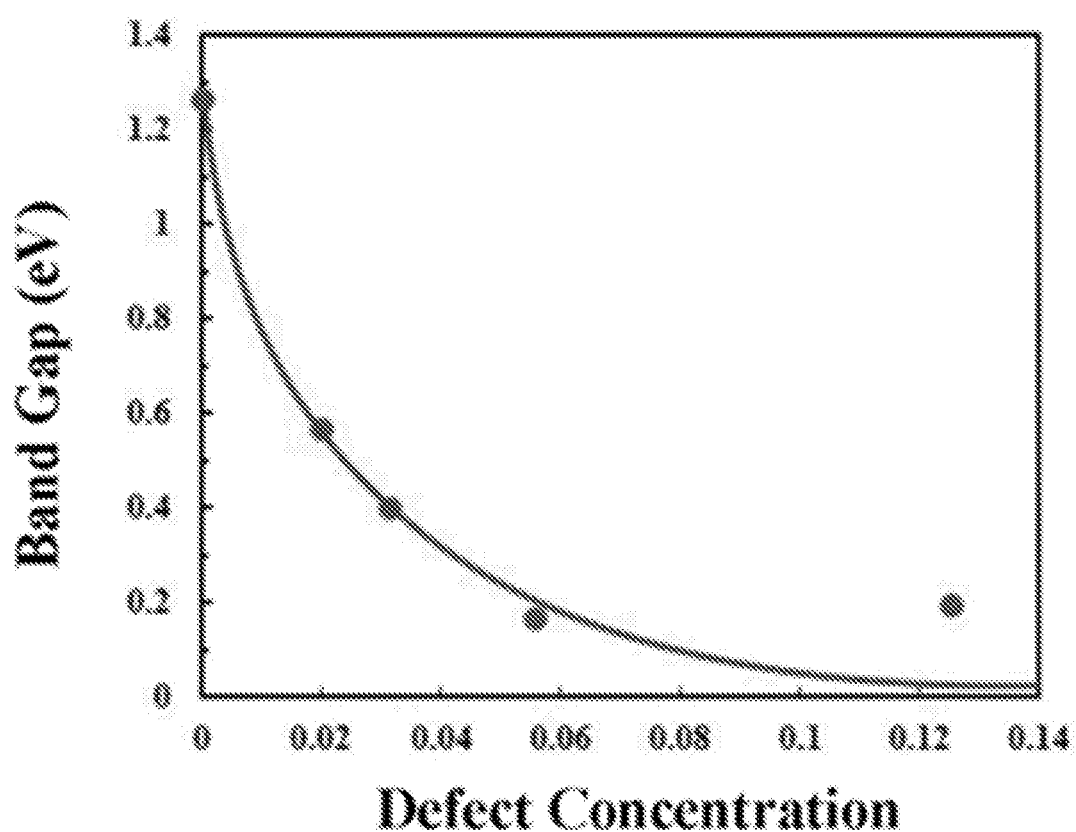
FIG. 14E is a function of bandgap (in electron-volts or eV) as a function of defect concentration illustrating the bandgap evolution of platinum selenide monolayer with defect concentration according to various embodiments.

FIG. 14A is a plot of energy (in electron volts or eV) as a function of points showing the density of states (DOS) of a platinum selenide monolayer having a first concentration of selenium vacancies (1/50 selenium vacancies ($V_{Se}$) concentration) according to various embodiments. FIG. 14B is a plot of energy (in electron volts or eV) as a function of points showing the density of states (DOS) of a platinum selenide monolayer having a second concentration of selenium vacancies (1/32 selenium vacancies ($V_{Se}$) concentration) according to various embodiments. FIG. 14C is a plot of energy (in electron volts or eV) as a function of points showing the density of states (DOS) of a platinum selenide monolayer having a third concentration of selenium vacancies (1/18 selenium vacancies ($V_{Se}$) concentration) according to various embodiments. FIG. 14D is a plot of energy (in electron volts or eV) as a function of points showing the density of states (DOS) of a platinum selenide monolayer having a fourth concentration of selenium vacancies (1/8 selenium vacancies ($V_{Se}$) concentration) according to various embodiments. FIG. 14E is a function of bandgap (in electron-volts or eV) as a function of defect concentration illustrating the bandgap evolution of platinum selenide monolayer with defect concentration according to various embodiments. The dots are based on calculations, and the line is drawn to fit the dots.

Figure 15:
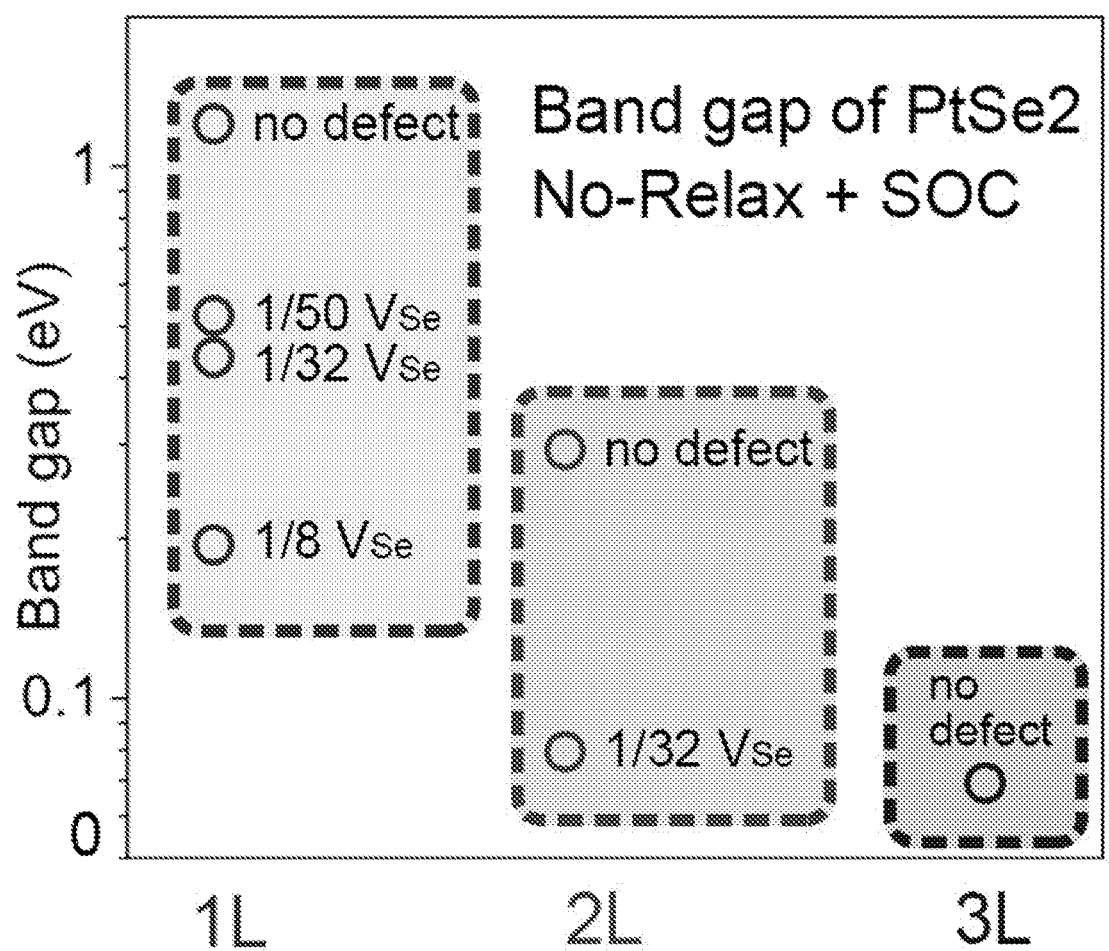
FIG. 15 is a plot of band gap (in electron volts or eV) as a function of the number of layers, i.e. one layer (1L), two layers (2L), and three layers (3L), showing the dependence of the bandgap of platinum selenide according to various embodiments on selenium vacancy concentrations using first-principle calculations.

FIG. 15 is a plot of band gap (in electron volts or eV) as a function of the number of layers, i.e. one layer (1L), two layers (2L), and three layers (3L), showing the dependence of the bandgap of platinum selenide according to various embodiments on selenium vacancy concentrations using first-principle calculations.

The results show that the bandgap decreases with increasing Se vacancies while remaining indirect in nature for all concentrations simulated. These features indicate the importance of Se vacancies on the bandgap of atomic-layered platinum selenide, i.e. bilayer platinum selenide as demonstrated in the simulation results in FIG. 14A and FIG. 14B, and suggest that defect engineering may be an effective strategy to control the bandgap of atomic-layered platinum selenide.

Various embodiments may relate to a two-dimensional platinum selenide crystal or film, which may be metallic or semiconducting. The crystal or film may include large area atomic layers or crystalline sheets. Trilayer and thicker platinum selenide may be semi-metallic, while bilayer and monolayer platinum selenide may be n-type semiconductors with indirect bandgaps (~0.1 eV for bilayer platinum selenide) and relatively high carrier mobility.

Figure 16A:
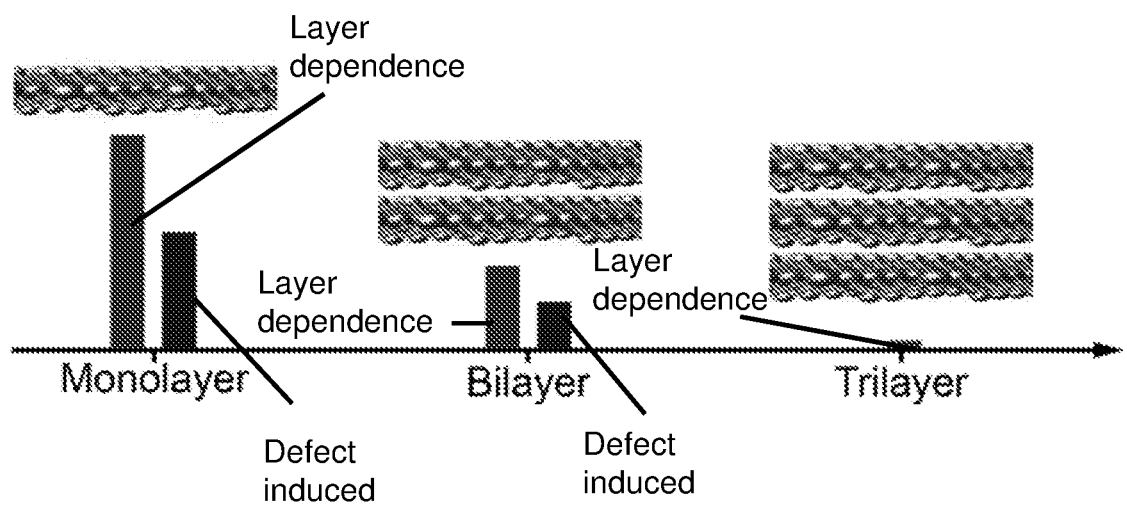
FIG. 16A illustrates the variation of bandgap with the number of layers and the concentrations of defects in platinum selenide according to various embodiments.

It has also been shown experimentally that the bandgap may be engineered through defect engineering (e.g. by varying Se vacancies) to cover the mid-IR band, which may be important for mid-infrared photonic and optoelectronic applications. The photo-detection properties of monolayer and bilayer platinum selenide based FET devices have been obtained. FIG. 16A illustrates the variation of bandgap with the number of layers and the concentrations of defects in platinum selenide according to various embodiments.

Figure 16B:
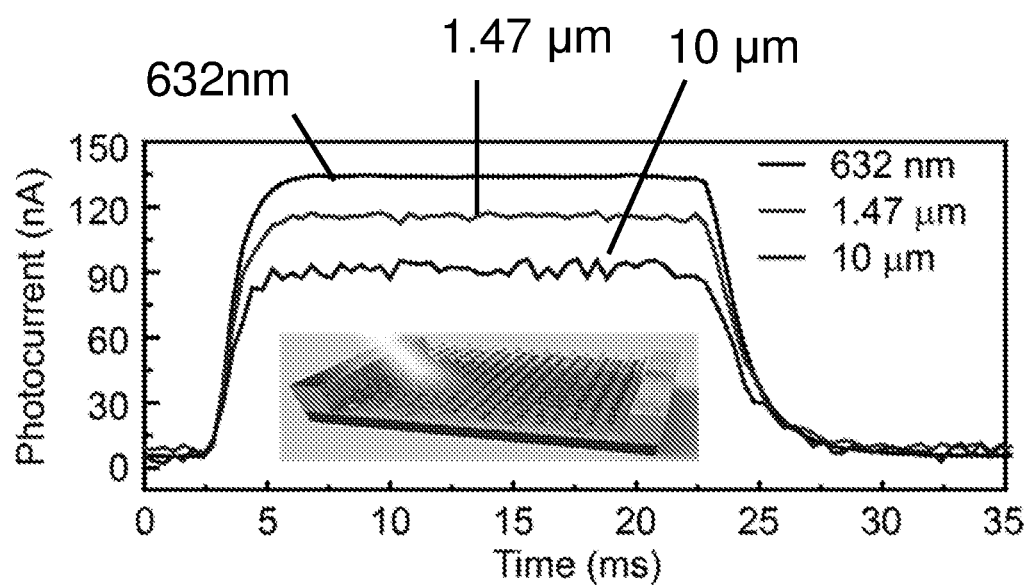
FIG. 16B is a plot of photocurrent (in nanoamperes or nA) as a function of time (in milliseconds or ms) showing the time-resolved photo-response of a bilayer platinum selenide (PtSe$_2$) based field effect transistor (FET) according to various embodiments under laser illumination with wavelengths of 632 nm, 1.47 µm, and 10 µm.

It has been found that monolayer platinum selenide based devices may be suitable for visible and near infrared photodetectors, and bilayer platinum selenide based FET devices may be suitable for broadband mid-infrared photodetectors, with broadband response ranging from visible to mid-infrared, along with high responsivity and fast response speed. These results show that platinum selenide and other noble metal chalcogenides or narrow bandgap transition metal chalocogenides (TMCs) may be suitable for optoelectronic applications, e.g. in the mid-infrared regime. FIG. 16B is a plot of photocurrent (in nanoamperes or nA) as a function of time (in milliseconds or ms) showing the time-resolved photo-response of a bilayer platinum selenide ($PtSe_2$) based field effect transistor (FET) according to various embodiments under laser illumination with wavelengths of 632 nm, 1.47 μm, and 10 μm. The inset shows a schematic of a platinum selenide ($PtSe_2$) based field effect transistor (FET).

Various embodiments may be alternatives to other 2D materials for photonic and optoelectronic applications.

Computational Details

Electronic structures are calculated within the density functional theory (DFT) framework with the projector augmented wave (PAW) basis using the VASP (Vienna Ab Initio Simulation Package) codes. The Perdew-Burke-Ernzerhof-type generalized gradient approximation (GGA) is used to describe the exchange-correlation energy. The spin-orbit coupling (SOC) is included take into account the relativistic effects. To model different atomic layers structure of $PtSe_2$, a slab model with a vacuum gap of 15 Å between periodically repeated slabs is employed to avoid interaction between the slabs. A plane wave cutoff energy of 500 eV is used. The Brillouin zone sampling is done by using 12×12×12 and 12×12×1 Gamma-centered k-meshes for bulk and slab model respectively. The defect calculations are performed using the supercell geometry of the corresponding unit cell. The total energies in the calculations are converged to $1 \times 10^{-6}$ eV and the atomic positions are relaxed until the residual forces on each atom are less than $1 \times 10^{-3}$ eV/Å.

Raman Spectroscopy

The layer-dependent properties may also be characterized by Raman spectroscopy similar to other two-dimensional materials. The synthesized bulk $PtSe_2$ and atomic layers show two main Raman peaks near 200 $cm^{-1}$ and 300 $cm^{-1}$, which may be defined as $E_g$ mode vibration and $A_{1g}$ mode vibration respectively. The soft mode near 320 $cm^{-1}$ may be caused by the substrate. The $E_g$ vibration mode and $A_{1g}$ vibration mode change drastically with the decrease in the number of the layers of $PtSe_2$. The variation of the peak intensity ratio may be employed as a signature to distinguish the number of $PtSe_2$ layers. However, from the fingerprint of the Raman spectrum in FIG. 9A, it is observed that intensity may not be very sensitive to variation in the number of layers.

Ultralow-frequency (ULF) Raman spectroscopy has been widely used for the characterization of two-dimensional materials, which is extremely sensitive to the number of layer and the layer configurations. As clearly shown in FIG. 9B, the ultralow-frequency mode around 10-40 $cm^{-1}$ was observed for monolayer, bilayer and trilayer $PtSe_2$ flakes. The ULF modes strongly depended on the layer number (N) and is absent in monolayer because they were originated from the interlayer shearing. With decreasing N, the shear modes frequency may decrease rapidly due to the reduced effective interlayer spring constant. The shear mode frequency ($\omega_s$) could be quantitatively analyzed as:

$$\omega_s = \omega_0 \cos\left(\frac{\pi}{2N}\right) \quad (9)$$

where $\omega_0$ is the bulk shear mode frequency. By fitting the ULF Raman spectroscopy, $\omega_0 = 32$ $cm^{-1}$ may be obtained for bulk $PtSe_2$.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A chalcogenide film comprising:
   a noble metal chalcogenide material consisting of a noble metal and a chalcogen such that a formula of the noble metal chalcogenide material is $MC_x$;
   wherein M represents the noble metal;
   wherein C represents the chalcogen;
   wherein x is any one positive value equal to or more than 1.4 and less than 2; and
   wherein the chalcogenide film is configured to generate electrons and holes upon light incident on the chalcogenide film.

2. The film according to claim 1, wherein the chalcogenide film is a monolayer of the noble metal chalcogenide material.

3. The film according to claim 1, wherein the chalcogenide film is a bilayer of the noble metal chalcogenide material.

4. The film according to claim 1, wherein the light comprises visible light.

5. The film according to claim 1, wherein the light comprises infrared light.

6. The film according to claim 5, wherein the infrared light is mid-infrared light.

7. The film according to claim 1, wherein the noble metal chalcogenide material is any one material selected from a group consisting of platinum selenide, platinum sulfide, palladium selenide and palladium sulfide.

8. The film according to claim 7,
   wherein the noble metal chalcogenide material is platinum selenide; and
   wherein the noble metal chalcogenide material is any one selected from a group consisting of $PtSe_{1.8}$, $PtSe_{1.6}$, and $PtSe_{1.4}$.

9. A device comprising a chalcogenide film, the chalcogenide film comprising:
   a noble metal chalcogenide material consisting of a noble metal and a chalcogen such that a formula of the noble metal chalcogenide material is $MC_x$;
   wherein M represents the noble metal;
   wherein C represents the chalcogen;
   wherein x is any one positive value equal to or more than 1.4 and less than 2; and
   wherein the chalcogenide film is configured to generate electrons and holes upon light incident on the chalcogenide film.

10. The device according to claim 9, wherein the device is a photodetector or a solar cell.

11. A method of forming a chalcogenide film, the method comprising:
    forming a noble metal chalcogenide material consisting of a noble metal and a chalcogen such that a formula of the noble metal chalcogenide material is $MC_x$;
    wherein M represents the noble metal;
    wherein C represents the chalcogen;
    wherein x is any one positive value equal to or more than 1.4 and less than 2; and
    wherein the chalcogenide film is configured to generate electrons and holes upon light incident on the chalcogenide film.

12. The method according to claim 11,
    wherein forming the noble metal chalcogenide material comprises a chemical vapour transfer process to form one or more single crystals; and
    wherein forming the noble metal chalcogenide material further comprises mechanically exfoliating one or more crystalline flakes from the one or more single crystals to form the chalcogenide film.

13. The method according to claim 11, wherein forming the noble metal chalcogenide material comprises heating a noble metal and a chalcogen in the presence of catalysts.

14. The method according to claim 13, wherein the catalysts comprise one or more selected from a group consisting of sulfur, phosphorous, bromine and iodine.

15. The method according to claim 14,
    wherein the noble metal is platinum; and
    wherein the chalcogen is selenium.

16. The method according to claim 15, wherein a molar ratio of platinum:selenium:phosphorous:sulfur of 1:1.8:1:3 is used to form $PtSe_{1.8}$.

17. The method according to claim 15, wherein a molar ratio of platinum:selenium:phosphorous:sulfur of 1:1.6:1:3 is used to form $PtSe_{1.6}$.

18. The method according to claim 15, wherein a molar ratio of platinum:selenium:phosphorous:sulfur of 1:1.4:1:3 is used to form $PtSe_{1.4}$.

19. The method according to claim 13, wherein the heating is carried out in the presence of a transport gas.

20. The method according to claim 19, wherein the transport gas is iodine or argon.

21. A chalcogenide film formed by a method comprising:
    forming a noble metal chalcogenide material consisting of a noble metal and a chalcogen such that a formula of the noble metal chalcogenide material is $MC_x$;
    wherein M represents the noble metal;
    wherein C represents the chalcogen;
    wherein x is any one positive value equal to or more than 1.4 and less than 2; and
    wherein the chalcogenide film is configured to generate electrons and holes upon light incident on the chalcogenide film.

* * * * *